United States Patent
Koyama et al.

(10) Patent No.: US 7,683,913 B2
(45) Date of Patent: Mar. 23, 2010

(54) DISPLAY DEVICE AND DRIVING METHOD THEREOF

(75) Inventors: Jun Koyama, Kanagawa (JP); Hiroki Dembo, Kanagawa (JP); Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 799 days.

(21) Appl. No.: 11/504,946

(22) Filed: Aug. 16, 2006

(65) Prior Publication Data

US 2007/0040822 A1    Feb. 22, 2007

(30) Foreign Application Priority Data

Aug. 22, 2005    (JP)    ............... 2005-240506

(51) Int. Cl.
| | |
|---|---|
| *G09G 1/28* | (2006.01) |
| *G00G 5/02* | (2006.01) |
| *H04N 7/01* | (2006.01) |
| *H04N 5/46* | (2006.01) |
| *H04N 5/74* | (2006.01) |
| *G06K 9/00* | (2006.01) |
| *G03F 3/08* | (2006.01) |

(52) U.S. Cl. .............. 345/589; 345/603; 345/604; 345/22; 345/87; 348/441; 348/557; 348/612; 348/751; 358/518; 382/167; 382/162

(58) Field of Classification Search ........ 345/581, 345/589, 600–601, 603–604, 22; 348/71, 348/450, 441, 444, 557, 582, 612, 630, 712–713, 348/751, 760; 358/518–520, 523–524; 382/162–167
See application file for complete search history.

(56) References Cited

U.S. PATENT DOCUMENTS 5,140,408 A    8/1992   Kaite et al. ............. 358/21

(Continued)

FOREIGN PATENT DOCUMENTS

CN    1137208 A    12/1996

(Continued)

OTHER PUBLICATIONS

Office Action re Chinese application No. CN 2006100121301.5, dated Aug. 7, 2009 (with English translation).

(Continued)

*Primary Examiner*—Wesner Sajous
(74) *Attorney, Agent, or Firm*—Cook Alex Ltd.

(57) ABSTRACT

It is an object to provide a semiconductor device in which a correct video signal is inputted into a display regardless of whether a luminance signal and a color-difference signal, or a three-primary color signal of R, G, and B is inputted as a video signal and which is also applied to the case of a digital video signal, and a driving method thereof. The display device includes a display panel, and a video format conversion circuit.

12 Claims, 61 Drawing Sheets

U.S. PATENT DOCUMENTS

| | | | |
|---|---|---|---|
| 5,657,387 A * | 8/1997 | Mogi et al. | 380/201 |
| 5,671,022 A | 9/1997 | Ishida | 348/659 |
| 5,680,177 A | 10/1997 | Abe | |
| 6,246,432 B1 * | 6/2001 | Takami et al. | 348/65 |
| 6,515,710 B1 | 2/2003 | Koshimuta | 348/557 |
| 6,879,110 B2 | 4/2005 | Koyama | 315/169.1 |
| 7,286,105 B2 | 10/2007 | Akimoto et al. | |
| 2001/0022565 A1 | 9/2001 | Kimura | 345/82 |
| 2002/0047568 A1 | 4/2002 | Koyama | 315/169.3 |
| 2003/0193615 A1 * | 10/2003 | Unemura | 348/465 |
| 2003/0197667 A1 | 10/2003 | Numao | |
| 2004/0012550 A1 | 1/2004 | Koyama | 345/76 |
| 2004/0021627 A1 * | 2/2004 | Maki | 345/89 |
| 2004/0100427 A1 * | 5/2004 | Miyazawa | 345/76 |
| 2004/0233339 A1 * | 11/2004 | Elliott | 348/743 |
| 2005/0185839 A1 * | 8/2005 | Matsubara | 382/167 |
| 2005/0220337 A1 * | 10/2005 | Arazaki | 382/162 |
| 2006/0010404 A1 * | 1/2006 | Mamba et al. | 715/864 |
| 2006/0092485 A1 * | 5/2006 | Tamaru | 358/518 |
| 2008/0205514 A1 * | 8/2008 | Nishio et al. | 375/240.01 |
| 2009/0051781 A1 * | 2/2009 | Takemura et al. | 348/222.1 |

FOREIGN PATENT DOCUMENTS

| | | |
|---|---|---|
| CN | 1514426 A | 7/2004 |
| EP | 0 732 847 A2 | 9/1996 |
| EP | 1 103 946 A2 | 5/2001 |
| JP | 05-197353 | 8/1993 |
| JP | 07-255063 | 10/1995 |
| JP | 08-069690 | 3/1996 |
| JP | 2000-278555 | 10/2000 |
| JP | 3110257 | 11/2000 |
| JP | 2001-324958 | 11/2001 |
| JP | 2001-343933 | 12/2001 |
| JP | 2002-108264 | 4/2002 |
| JP | 2002-108285 | 4/2002 |
| JP | 2004-4501 | 1/2004 |

OTHER PUBLICATIONS

Office Action re Chinese application No. CN 200610121301.5, dated August 7, 2009 (with English translation).

* cited by examiner

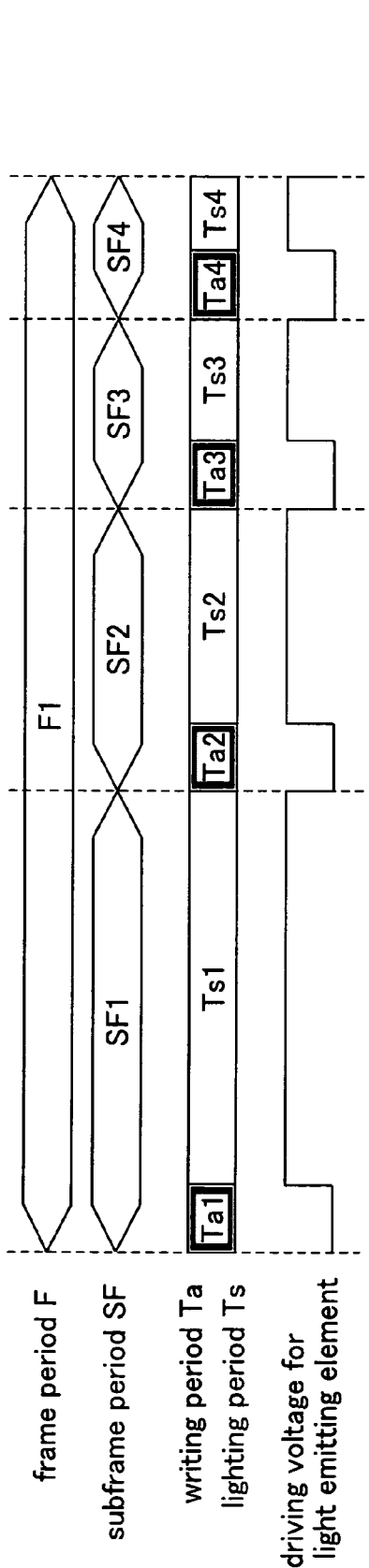
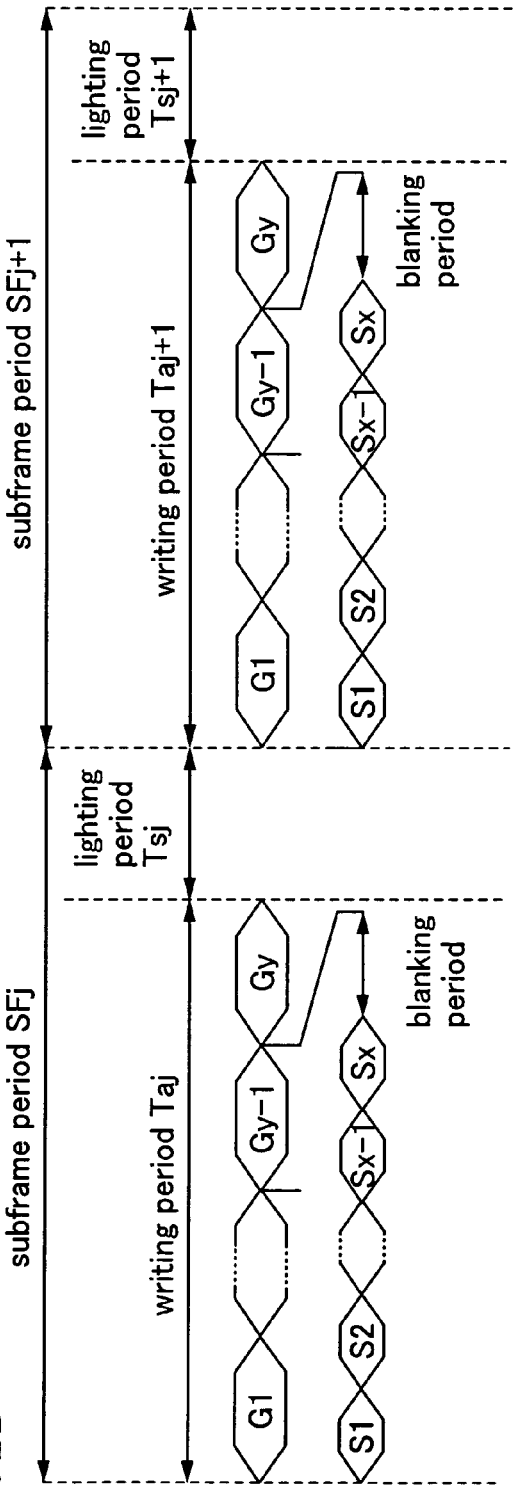
FIG. 12A
FIG. 12B

FIG. 13

| P \ Q | SF1<br>1 | SF2<br>2 | SF3<br>4 | SF4<br>8 |
|---|---|---|---|---|
| 0  | × | × | × | × |
| 1  | ○ | × | × | × |
| 2  | × | ○ | × | × |
| 3  | ○ | ○ | × | × |
| 4  | × | × | ○ | × |
| 5  | ○ | × | ○ | × |
| 6  | × | ○ | ○ | × |
| 7  | ○ | ○ | ○ | × |
| 8  | × | × | × | ○ |
| 9  | ○ | × | × | ○ |
| 10 | × | ○ | × | ○ |
| 11 | ○ | ○ | × | ○ |
| 12 | × | × | ○ | ○ |
| 13 | ○ | × | ○ | ○ |
| 14 | × | ○ | ○ | ○ |
| 15 | ○ | ○ | ○ | ○ |

P : the number of gray scals

Q : lighting period

○ : lighting

× : non- lighting

FIG. 14A

| P \ Q | SF1<br>1 | SF2<br>2 | SF3<br>4 | SF4<br>4 | SF5<br>4 |
|---|---|---|---|---|---|
| 0 | × | × | × | × | × |
| 1 | ○ | × | × | × | × |
| 2 | × | ○ | × | × | × |
| 3 | ○ | ○ | × | × | × |
| 4 | × | × | ○ | × | × |
| 5 | ○ | × | ○ | × | × |
| 6 | × | ○ | ○ | × | × |
| 7 | ○ | ○ | ○ | × | × |
| 8 | × | × | ○ | ○ | × |
| 9 | ○ | × | ○ | ○ | × |
| 10 | × | ○ | ○ | ○ | × |
| 11 | ○ | ○ | ○ | ○ | × |
| 12 | × | × | ○ | ○ | ○ |
| 13 | ○ | × | ○ | ○ | ○ |
| 14 | × | ○ | ○ | ○ | ○ |
| 15 | ○ | ○ | ○ | ○ | ○ |

FIG. 14B

| P \ Q | SF1<br>4 | SF2<br>2 | SF3<br>1 | SF4<br>4 | SF5<br>4 |
|---|---|---|---|---|---|
| 0 | × | × | × | × | × |
| 1 | × | × | ○ | × | × |
| 2 | × | ○ | × | × | × |
| 3 | × | ○ | ○ | × | × |
| 4 | × | × | × | ○ | × |
| 5 | × | × | ○ | ○ | × |
| 6 | × | ○ | × | ○ | × |
| 7 | × | ○ | ○ | ○ | × |
| 8 | ○ | × | × | ○ | × |
| 9 | ○ | × | ○ | ○ | × |
| 10 | ○ | ○ | × | ○ | × |
| 11 | ○ | ○ | ○ | ○ | × |
| 12 | ○ | × | × | ○ | ○ |
| 13 | ○ | × | ○ | ○ | ○ |
| 14 | ○ | ○ | × | ○ | ○ |
| 15 | ○ | ○ | ○ | ○ | ○ |

P : the number of gray scals  
Q : lighting period  
○ : lighting  
× : non-lighting

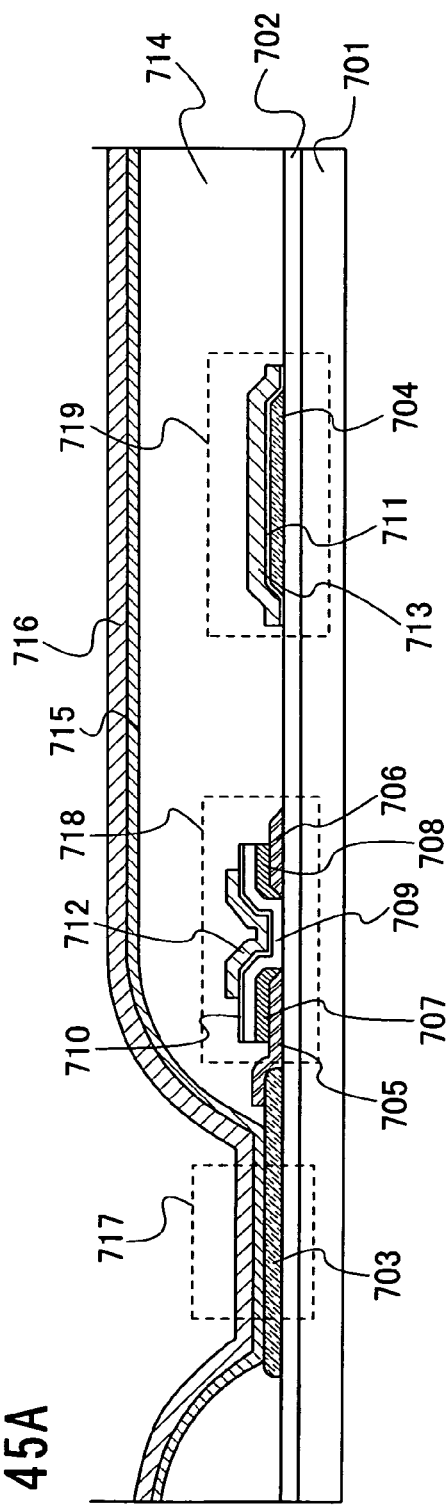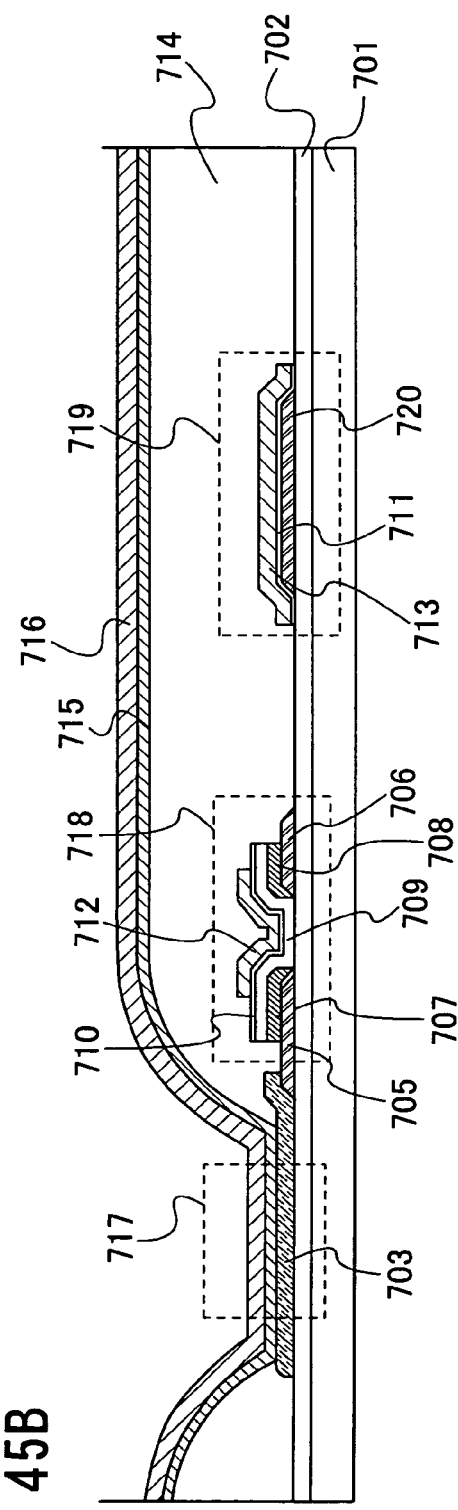

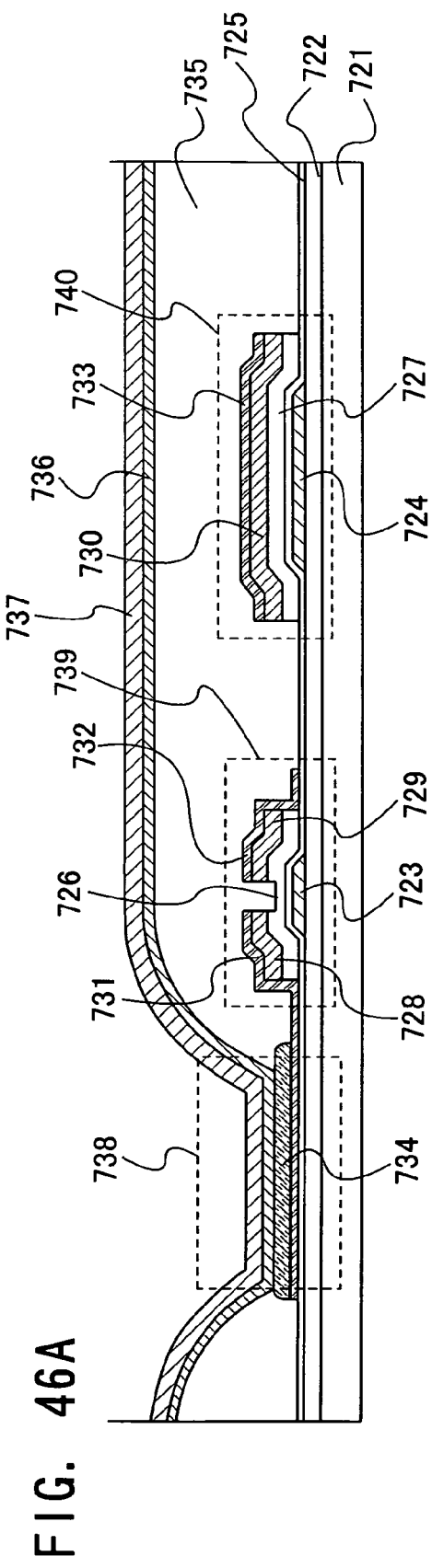
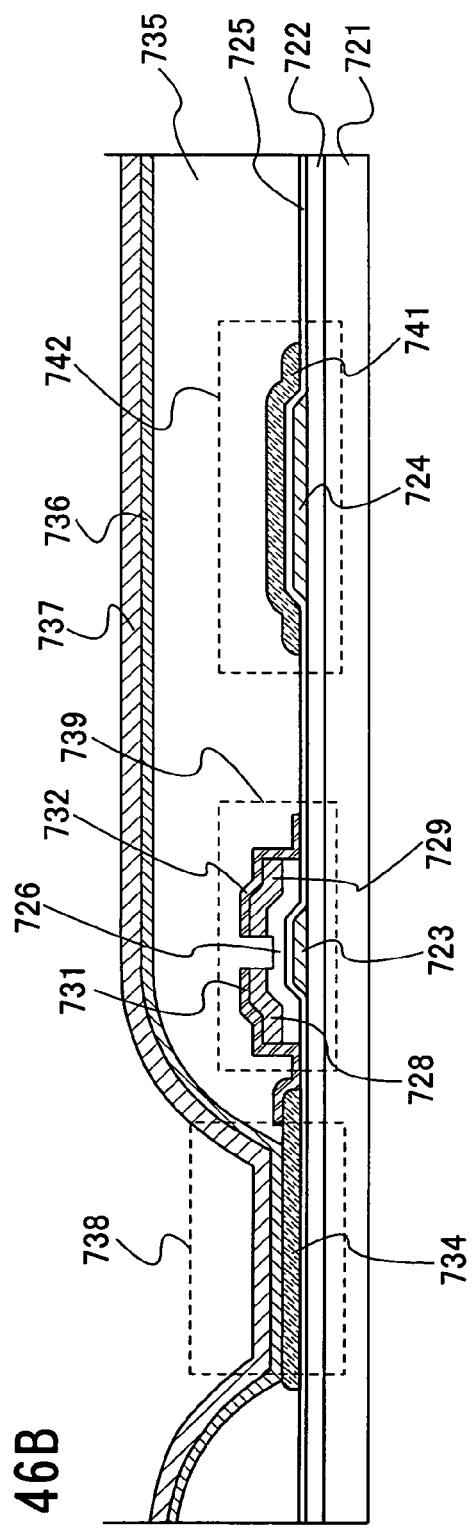
FIG. 46A
FIG. 46B

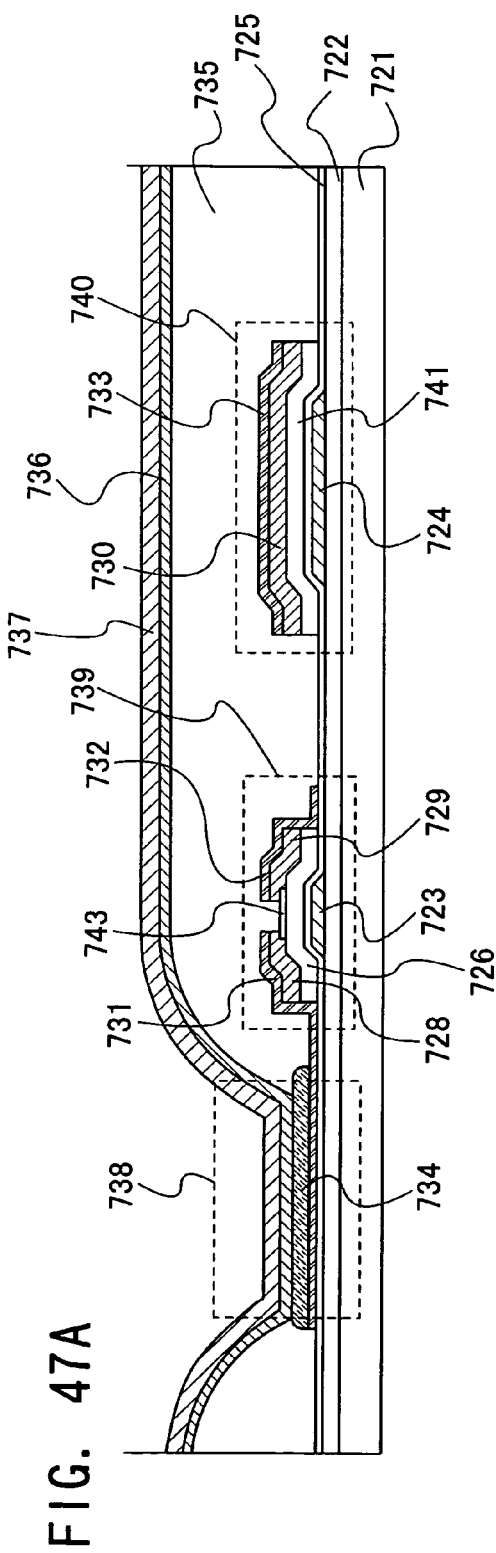
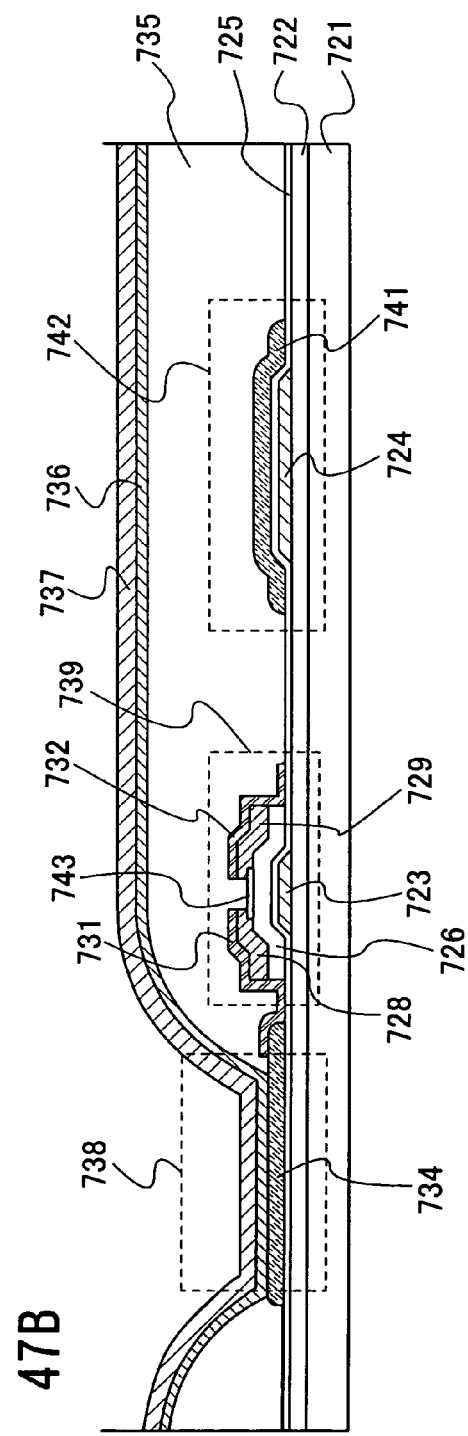
FIG. 47A
FIG. 47B

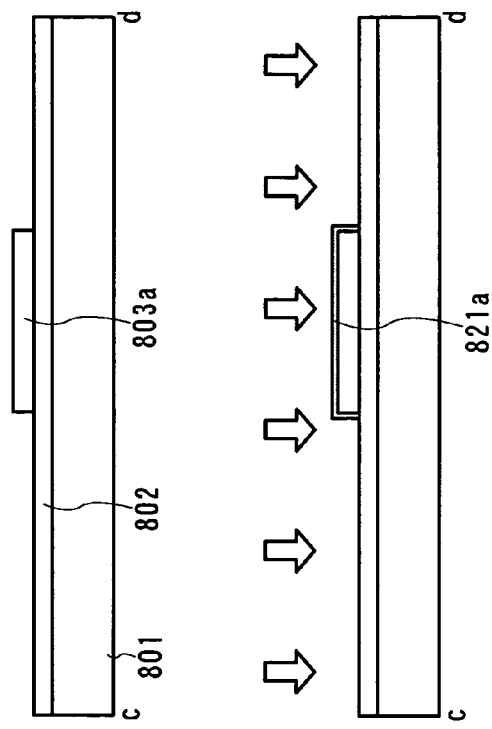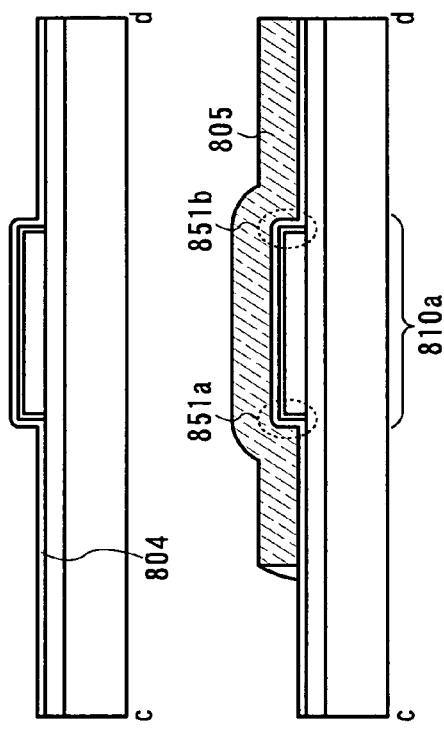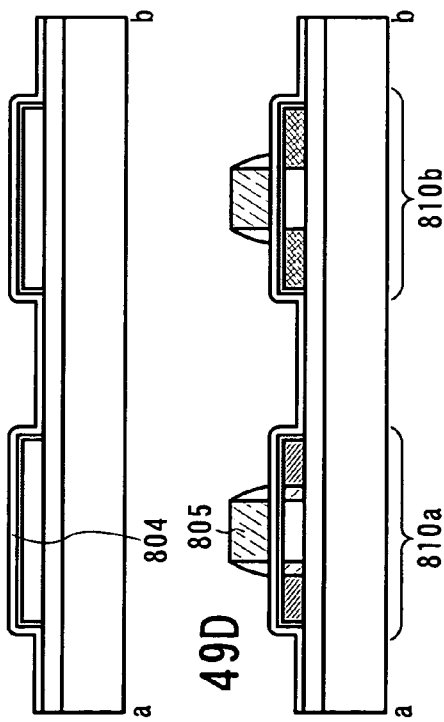

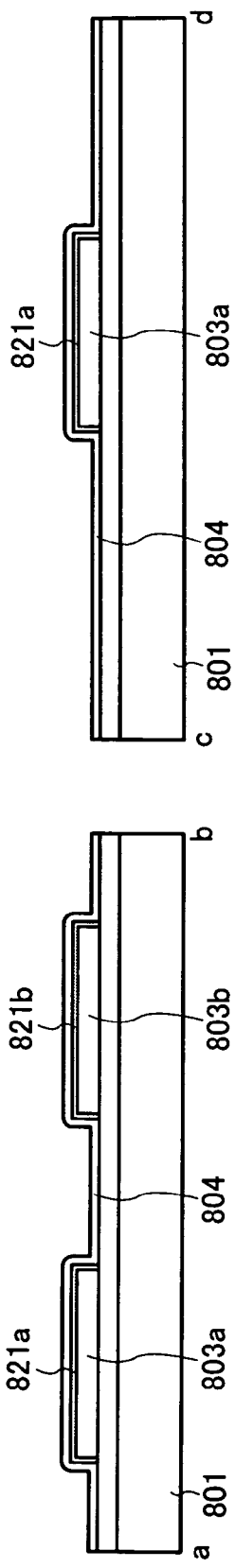
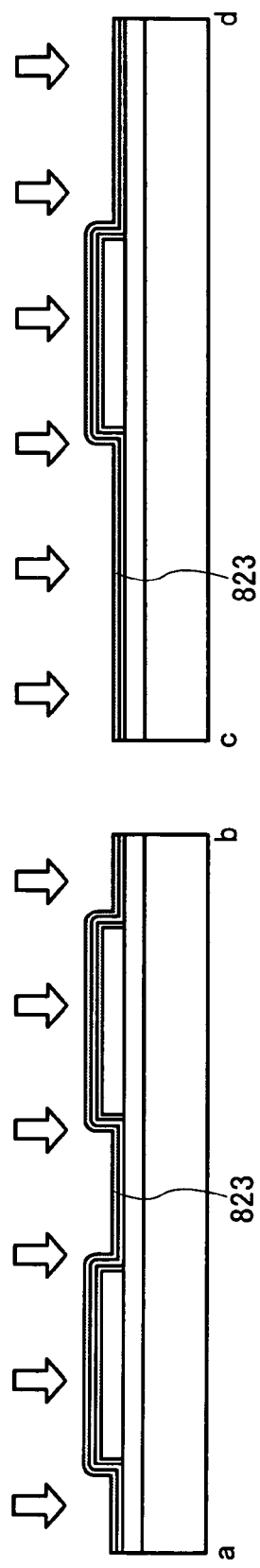
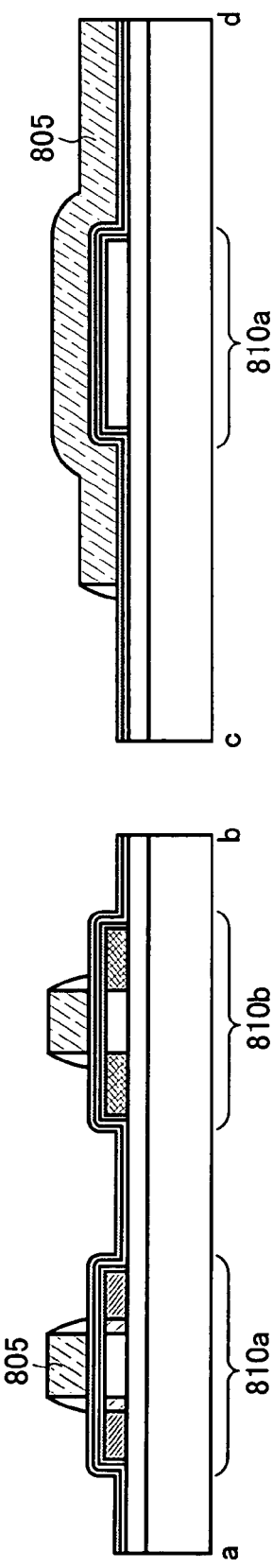

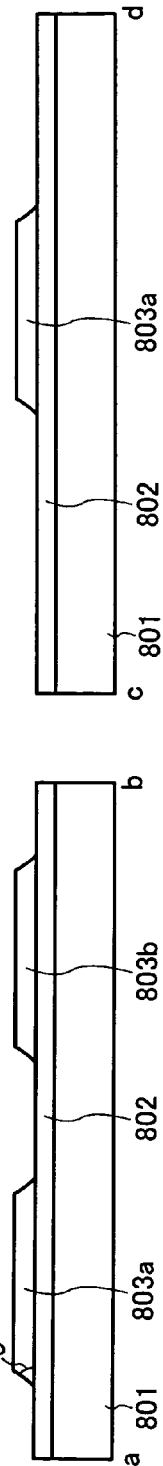
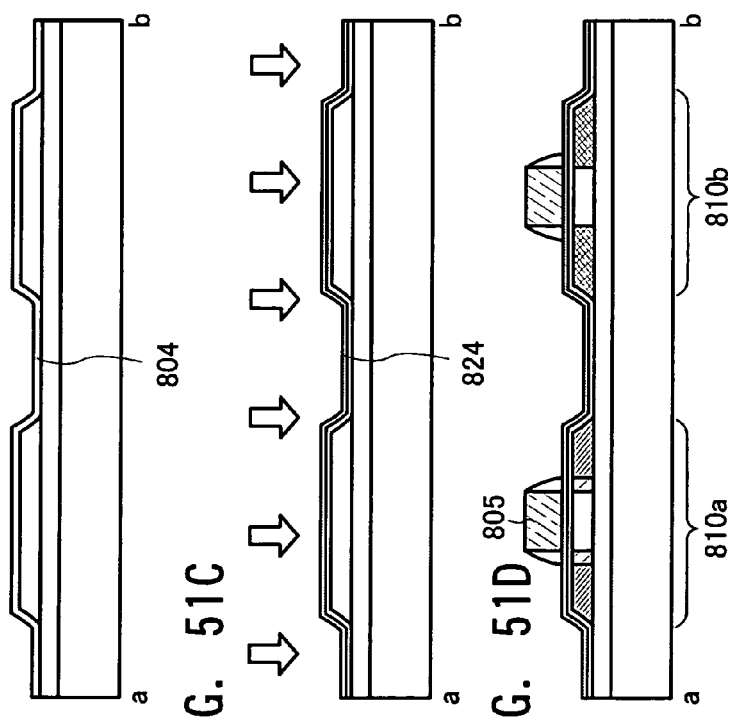
FIG. 51A, FIG. 51B, FIG. 51C, FIG. 51D

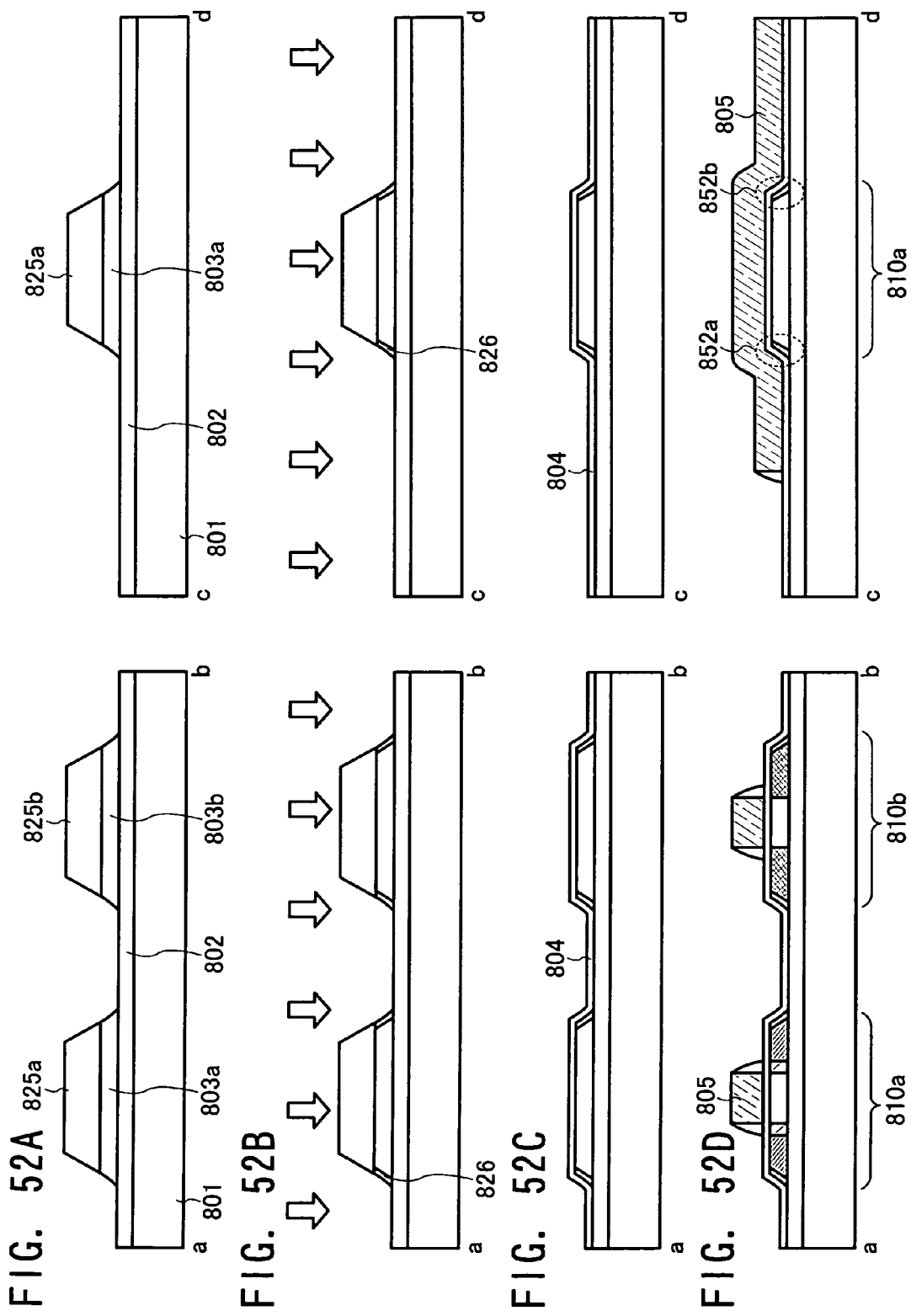

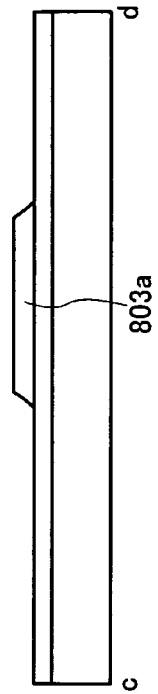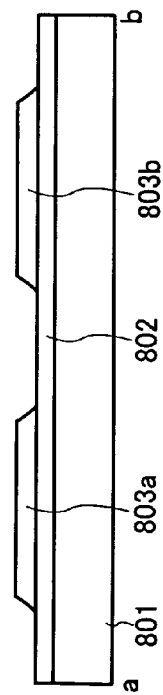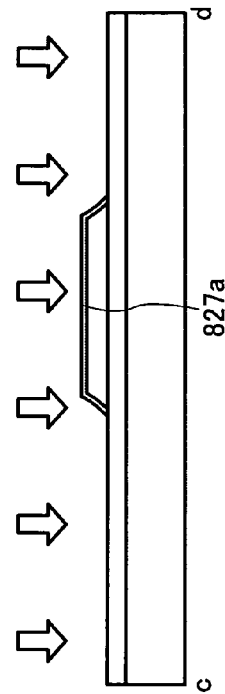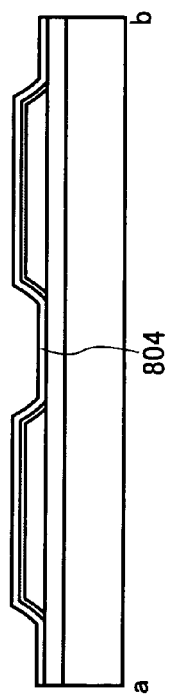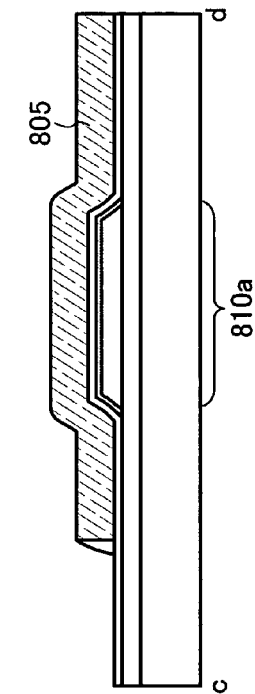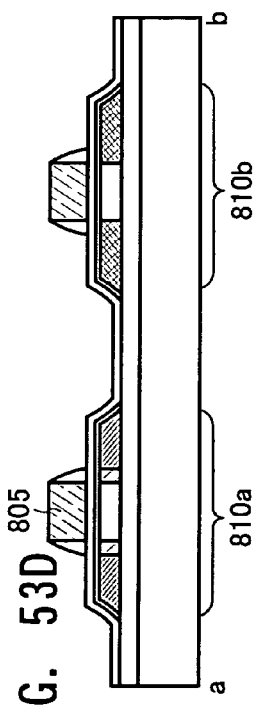

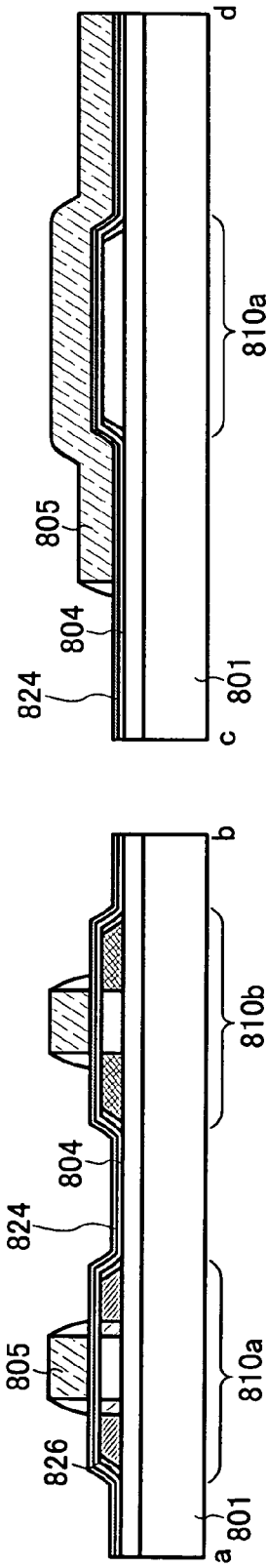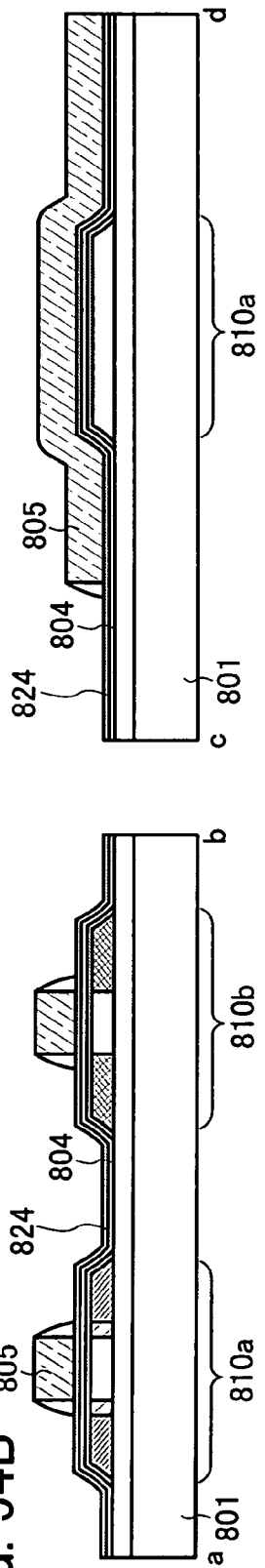

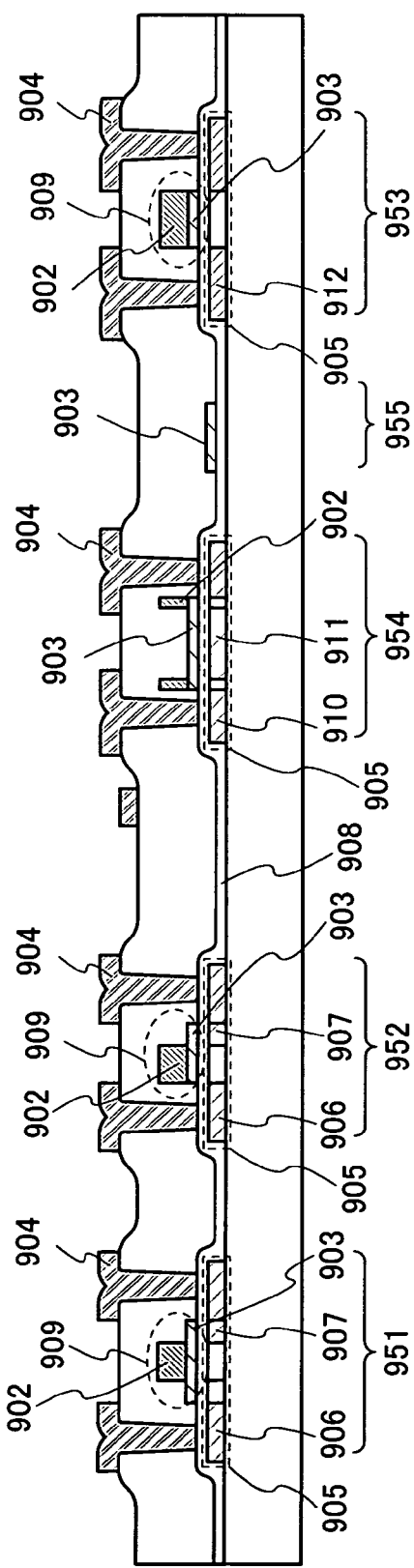

DISPLAY DEVICE AND DRIVING METHOD THEREOF

BACKGROUND OF THE INVENTION

1. Field of the Invention

The present invention relates to a display device of performing color display, and particularly relates to a display device provided with a color space conversion function.

2. Description of the Related Art

A video signal in synchronization with a scanning signal is required to display an image on a liquid crystal or electroluminescence display panel. The video signal has luminance information and color information. As for the video signal, there is a case where a video signal which is not encoded is employed as well as an encoded signal. Such a video signal is composed of a luminance signal and a color-difference signal. In a case where image data which is not encoded is inputted as a video signal, the image data is converted into a three-primary color signal of red (R), green (G), and blue (B). In a case where encoded image data is inputted as a video signal, the encoded image data is compounded with a compounding unit, and then converted into a three-primary color signal of red (R), green (G), and blue (B) (e.g., Reference 1: Japanese Patent Laid-Open No. Hei 5-197353).

In addition, it is considered to perform display on a liquid crystal display device (LCD) by using an image signal for CRT. In that case, a video signal, which is composed of a luminance signal and a color-difference signal and is corrected with a gamma coefficient for CRT, is inputted, and converted into a three-primary color signal of R, G, and B, and then inverse gamma conversion is performed. Moreover, in response to color temperature of external light obtained with a sensor, color balance adjustment which is the most favorable to a liquid crystal panel is performed to the video signal after inverse gamma conversion is performed, and the video signal is outputted to the liquid crystal panel through an analog driver circuit (e.g., Reference 2: Japanese Patent Laid-Open No. Hei 7-255063).

SUMMARY OF THE INVENTION

In a conventional art, presumed is that a luminance signal and a color-difference signal are inputted as a video signal inputted into a display device. However, the video signal is not limited to the luminance signal and the color-difference signal, and there is a case of a three-primary color signal of red (R), green (G), and blue (B) (RGB signal). In that case, an image cannot be displayed unless a signal processing circuit of the display device corresponds to a format of the video signal. In addition, since presumed is that display is performed using an analog gray scale method, an analog signal is affected by noise.

In view of the above-mentioned problems, the present invention has an object to provide a display device capable of displaying an image, regardless of whether a luminance signal and a color-difference signal are inputted or an RGB signal is inputted as a video signal.

The present invention is a display device capable of performing image display by converting a format in response to the kind of video signals, that is, a display device capable of performing image display by switching between an RGB signal and a luminance color-difference signal. In addition, the present invention is a display device of performing image by a digital gray scale method using a digital luminance color-difference signal.

One of the present invention is a display device including a display panel which includes a pixel with a plurality of sub-pixels having different emission colors, a video format conversion circuit into which a luminance color-difference signal including luminance information and color-difference information is inputted and in which the luminance color-difference signal is converted into an RGB signal in response to an emission color of the sub-pixel, and a controller into which the RGB signal is inputted and from which the RGB signal is outputted to the display panel in accordance with drive timing.

One of the present invention is a display device including a display panel which includes a pixel with a plurality of sub-pixels having different emission colors, a video format conversion circuit into which a luminance color-difference signal including luminance information and color-difference information is inputted and in which the luminance color-difference signal is converted into a digital RGB signal in response to an emission color of the sub-pixel, a D/A conversion circuit for converting the digital RGB signal into an analog RGB signal, and a controller into which the analog RGB signal is inputted and from which the analog RGB signal is outputted in accordance with drive timing.

In accordance with the present invention, since a video format conversion circuit is provided, an RGB signal and a luminance color-difference signal can be switched to display an image. Thus, contrast is improved, and better image quality can be provided. In addition, a video signal processing system can be fully digitized, which leads to a circuit structure with resistant to noise. Further, since a display device can be downsized, power consumption can be lowered.

BRIEF DESCRIPTION OF DRAWINGS

In the accompanying drawings:

FIGS. 12A and 12B are diagrams showing a timing chart which shows a driving method of a time gray scale system of the present invention;

FIG. 13 is a diagram showing a driving method of a display device of the present invention;

FIGS. 14A and 14B are diagrams showing a driving method of a display device of the present invention;

FIGS. 45A and 45B are diagrams showing a structure of a transistor used for a display device of the present invention;

FIGS. 46A and 46B are diagrams showing a structure of a transistor used for a display device of the present invention;

FIGS. 47A and 47B are diagrams showing a structure of a transistor used for a display device of the present invention;

FIGS. 49A to 49D are diagrams describing a manufacturing method of a transistor used for a display device of the present invention;

FIGS. 50A to 50C are diagrams describing a manufacturing method of a transistor used for a display device of the present invention;

FIGS. 51A to 51D are diagrams describing a manufacturing method of a transistor used for a display device of the present invention;

FIGS. 52A to 52D are diagrams describing a manufacturing method of a transistor used for a display device of the present invention;

FIGS. 53A to 53D are diagrams describing a manufacturing method of a transistor used for a display device of the present invention;

FIGS. 54A and 54B are diagrams describing a manufacturing method of a transistor used for a display device of the present invention;

FIG. 56 is a diagram showing a cross-sectional structure of a transistor used for a display device of the present invention;

DETAILED DESCRIPTION OF THE INVENTION

Embodiment Mode

Hereinafter, the present invention will be fully described by way of embodiment modes with reference to the accompanying drawings. It is to be understood that various changes and modifications will be apparent to those skilled in the art. Therefore, unless otherwise such changes and modifications depart from the scope of the present invention, they should be construed as being included therein.

Embodiment Mode 1

This embodiment mode describes a display device capable of performing display by using a luminance color-difference signal as an input signal.

For a video format, there are an RGB system including each color signal of red (R), green (G), and blue (B) in response to three primary colors of light as a component, and a luminance color-difference system using a luminance signal and a color-difference signal. In a case of the RGB system, image quality is excellent since similar processing is performed to all color components. However, a large amount of signal is required proportionately. Accordingly, transmission of a signal and burden on signal processing are increased.

On the other hand, in a case of the luminance color-difference system, for example, by reducing the amount of information of color-difference to half, processing can be carried out with two thirds of that of the RGB system. In this case, image quality deteriorates substantially; however, there is no problem practically. This is based on that human sense of sight is sensitive to a luminance variation but insensitive to the color-difference, that is, color variation.

In this manner, by performing display with the use of a luminance color-difference signal, the amount of signal can be decreased so that the amount of signal traffic is reduced and processing and transmission of a signal can be performed easily.

Figure 1:
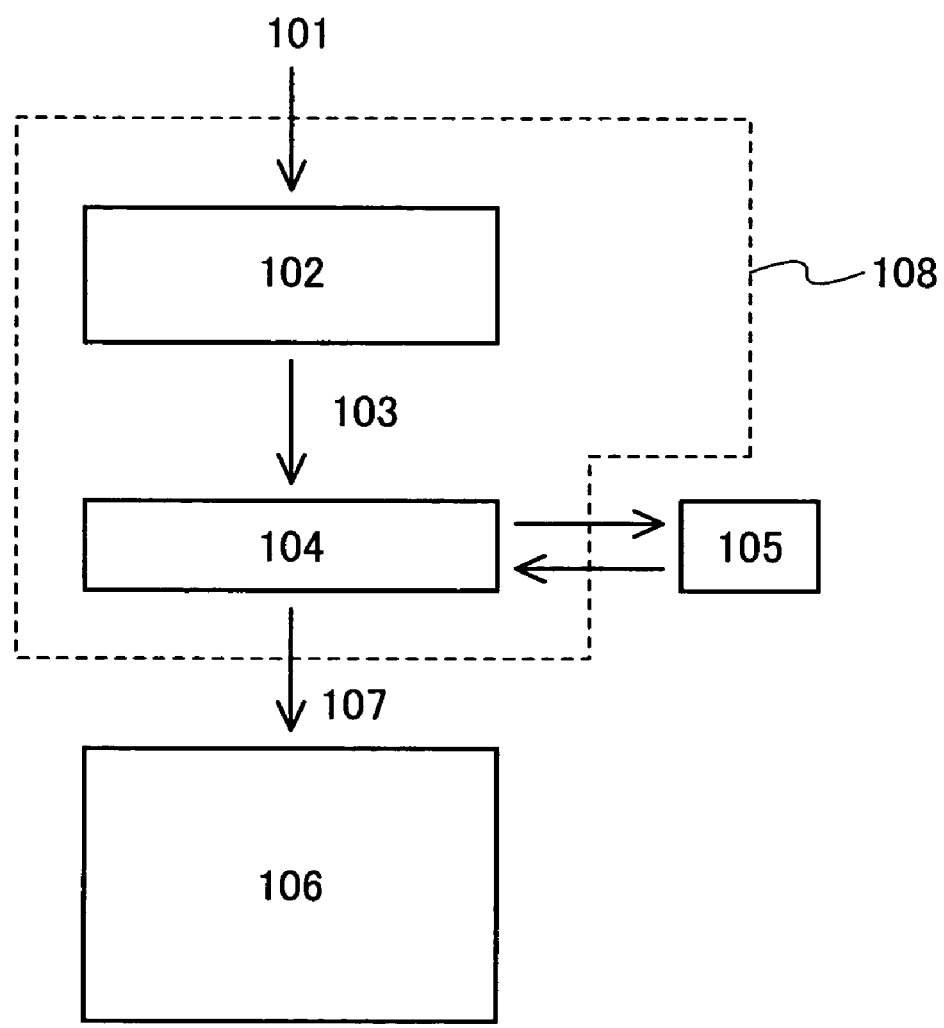
FIG. 1 is a diagram illustrating a structure of a display device of the present invention.

FIG. 1 shows a structure of a display device of this embodiment mode. This display device has a display 106. The display 106 has a specification in which display is controlled in accordance with an RGB signal. A luminance color-difference signal 101 is inputted into a video format conversion circuit 102 as a video signal to this display device. In the video format conversion circuit 102, the luminance color-difference signal 101 is converted into an RGB signal 103. The RGB signal 103 is inputted into a controller 104. The controller 104 inputs a signal to a memory 105. Note that, in a case of using a time gray scale method, the memory 105 is provided because it is necessary to divide one frame period into a plurality of subframe periods. The signal stored in the memory 105 is inputted into the display 106 as an image signal 107 in accordance with drive timing by the controller 104. The controller 104 also generates a signal required for performing display on the display 106 (e.g., a synchronizing signal such as a clock signal or a start pulse signal, or a control signal), and outputs the signal along with the image signal 107 to the display 106. Display is performed in response to the image signal 107, the synchronizing signal, or the control signal on the display 106 into which the image signal 107 is inputted.

In this case, when the display 106 performs display in a digital gray scale method, all signals from the luminance color-difference signal 101 to the image signal 107 can be processed as digital signals. Accordingly, a circuit structure with resistant to noise can be formed. In addition, downsizing and low power consumption of a display device can be achieved.

Figure 2:
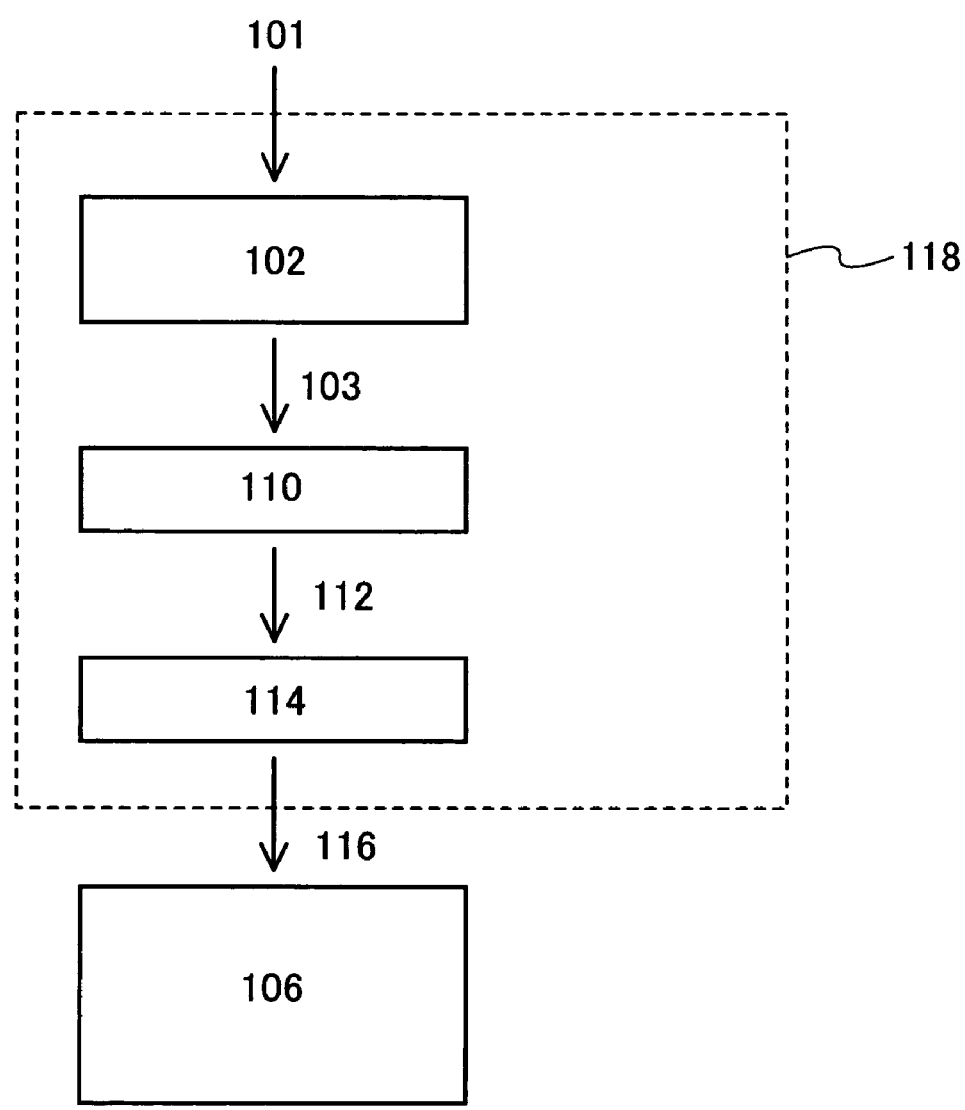
FIG. 2 is a diagram illustrating a structure of a display device of the present invention.

FIG. 2 is a diagram which shows a structure in a case where a display device performs display in an analog gray scale method. In this case, since the display 106 displays in the analog gray scale method, an analog signal is required to be inputted as the RGB signal 103. Since an operation of dividing one frame period into a plurality of subframe periods, or the like is not required in the case of the analog gray scale method, a memory which temporarily stores a signal of a controller 114 can be omitted. The RGB signal 103 outputted from the video format conversion circuit 102 is inputted into a D/A converter circuit 110 and converted into an analog RGB signal 112. The RGB signal 112 is inputted into the controller 114 and inputted into the display 106 as an image signal 116 in accordance with drive timing. The controller 114 also generates a signal (e.g., a synchronizing signal such as a clock signal or a start pulse signal, or a control signal) required for performing display on the display 106, and outputs the signal along with the image signal 116 to the display 106. Display is performed in response to the image signal 116, the synchronizing signal, or the control signal on the display 106 into which the image signal 116 is inputted.

Note that in FIG. 1, the video format conversion circuit 102 and the controller 104 are shown by different blocks; however, as a controller 108, a function of the video format conversion circuit may be included in the controller 108 as shown by a dotted frame in the diagram. Similarly, as a controller 118, functions of the video format conversion circuit and the D/A converter circuit may be included in the controller 118 as shown by a dotted frame in FIG. 2.

As such a structure of a display device, a controller may be provided in one IC chip, and a video format conversion circuit may be provided in the same. Similarly, the memory 105 may be formed in the controller. In this case, the IC chip may be mounted on the display 106 by COG (Chip On Glass) or the like. Mounting an IC chip in this manner contributes to downsizing of a panel.

Figure 3:
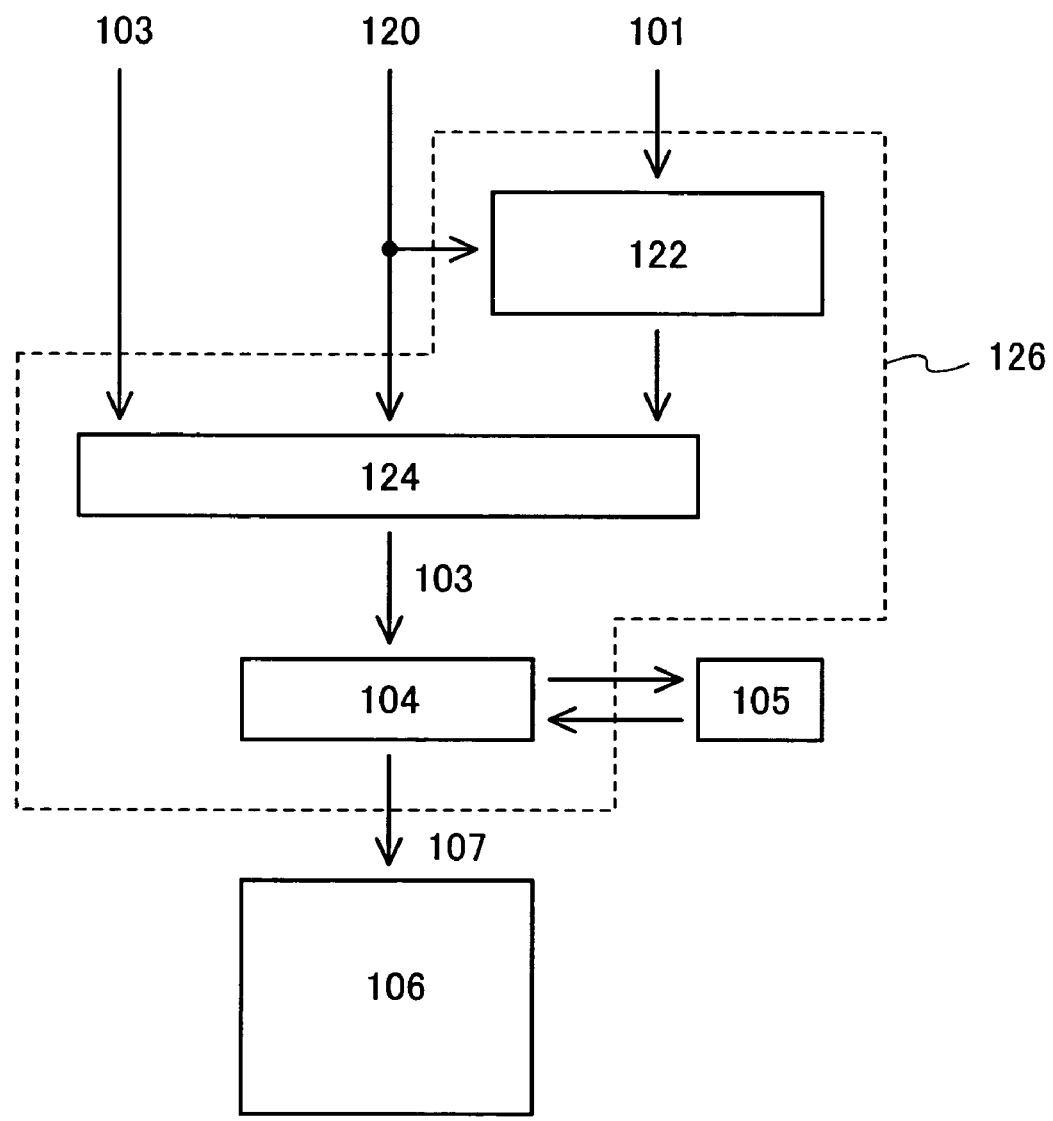
FIG. 3 is a diagram illustrating a structure of a display device of the present invention.

A display device shown in FIG. 3 has a structure where the luminance color-difference signal 101 and the RGB signal 103 are inputted from an external circuit, and both the signals are switched appropriately to display an image. A mode signal 120, inputted into a video format conversion circuit 122 and an input switching circuit 124, is a signal for selecting an input between the luminance color-difference signal 101 and the RGB signal 103. For example, the mode signal 120 is an L signal in a case where the RGB signal 103 is inputted, while the mode signal 120 is an H signal in a case where the luminance color-difference signal 101 is inputted. The video format conversion circuit 122 performs processing of the inputted the luminance color-difference signal 101 in a case where the mode signal 120 is an H signal. On the other hand, the video format conversion circuit 122 does not perform a conversion operation in a case where the mode signal 120 is an L signal. Accordingly, power consumption of a display device can be reduced.

The mode signal 120, and the RGB signal 103 or the RGB signal 103 outputted from the video format conversion circuit 122 are inputted into the input switching circuit 124. The input switching circuit 124 outputs either one of the RGB signals 103 to the controller 104 in accordance with a value of the mode signal 120. For example, since the RGB signal 103 is inputted, the RGB signal 103 is outputted to the controller 104 in the case where the mode signal 120 is an L signal. On the other hand, in the case where the mode signal 120 is an H signal, since the luminance color-difference signal 101 is inputted, the luminance color-difference signal 101 is converted into an RGB signal in the video format conversion circuit 122, and then outputted to the controller 104. The controller 104 inputs a signal to a memory 105. The signal stored in the memory 105 is inputted into the display 106 as an image signal 107 in accordance with drive timing by the controller 104. The controller 104 also generates a signal required for performing display on the display 106 (e.g., a synchronizing signal such as a clock signal or a start pulse signal, or a control signal), and outputs the signal along with the image signal 107 to the display 106. Display is performed in response to the image signal 107, the synchronizing signal, or the control signal on the display 106 into which the image signal 107 is inputted. In this case, when the display 106 performs display in a digital gray scale method, the luminance color-difference signal 101, the RGB signal 103 and the image signal 107 can be processed as digital signals. Accordingly, a circuit structure with resistant to noise can be formed. In addition, downsizing and low power consumption of a display device can be achieved.

Figure 4:
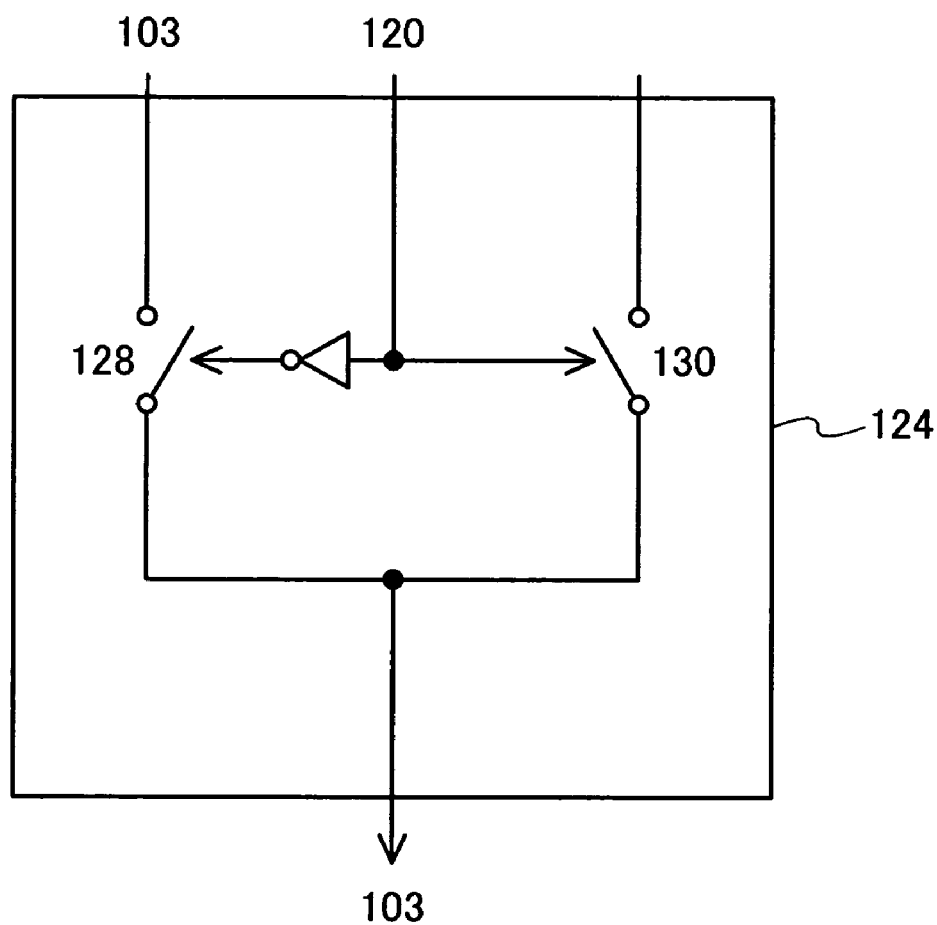
FIG. 4 is a diagram illustrating a structure of a display device of the present invention.

FIG. 4 is a structure example of the input switching circuit 124, and an output signal can be switched by a switch 128 and a switch 130 each of which on/off operation is performed by the mode signal 120. In FIG. 4, since the mode signal 120 is supplied to the switch 128 through an inverter, the structure is formed such that the switch 128 is turned on/off at a timing which is reverse to that of the switch 130.

Note that in FIG. 3, the video format conversion circuit 122, the input switching circuit 124, and the controller 104 are shown by different blocks; however, as a controller 126, functions of the video format conversion circuit and the input switching circuit may be included in the controller 126 as shown by a dotted frame in the diagram.

As such a structure of a display device, a controller may be provided in one IC chip, and a video format conversion circuit and an input switching circuit may be provided in the same. Similarly, the memory 105 may also be included in the controller. In this case, the IC chip may be mounted on the display 106 by COG (Chip On Glass) or the like. Mounting an IC chip in this manner contributes to downsizing of a panel.

Figure 5:
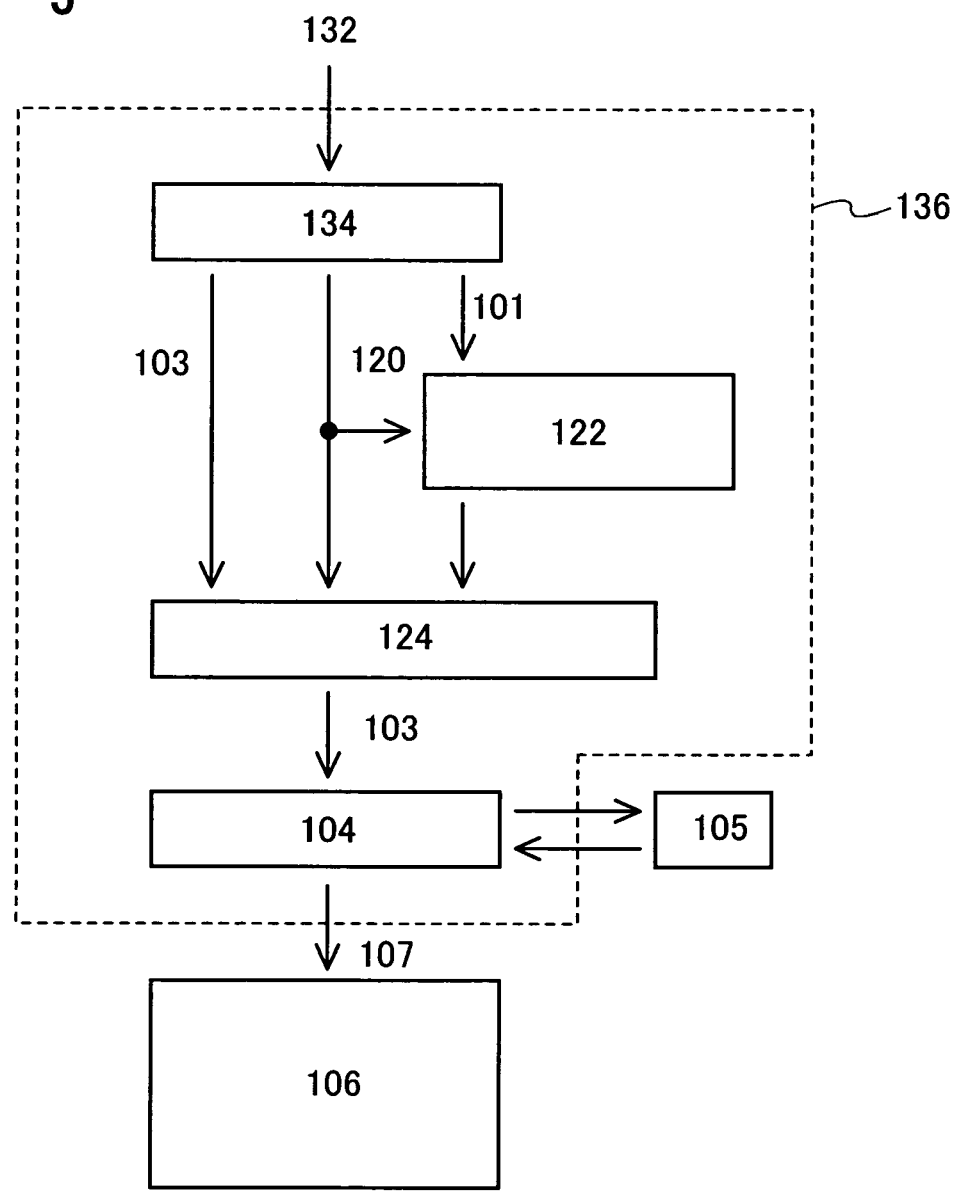
FIG. 5 is a diagram illustrating a structure of a display device of the present invention.

FIG. 3 shows a structure where the RGB signal 103 and the luminance color-difference signal 101 are inputted into the display device with different bus lines. On the other hand, FIG. 5 shows a structure where the RGB signal 103 and the luminance color-difference signal 101 are inputted with the same bus line. In FIG. 5, the RGB signal or the luminance color-difference signal is denoted as an input signal 132. The number of signal lines required for transmitting a signal with a bus line is different between the RGB signal and the luminance color-difference signal, and generally, the number of signal lines required in the case of the luminance color-difference signal is smaller than in the case of the RGB signal. That is, when the input signal 132 is a luminance color-difference signal, a signal is not inputted into several signal lines as long as the same bus line is used physically. By utilizing this property, it can be determined whether the input signal 132 is the RGB signal or the luminance color-difference signal in a signal determination circuit 134. For example, the kind of the input signal 132 can be determined by monitoring whether there is a signal with respect to a particular signal line of a bus line. Moreover, the signal determination circuit 134 generates the mode signal 120 using the discrimination result, and outputs the mode signal to the video format conversion circuit 122 and the input switching circuit 124.

Figure 6:
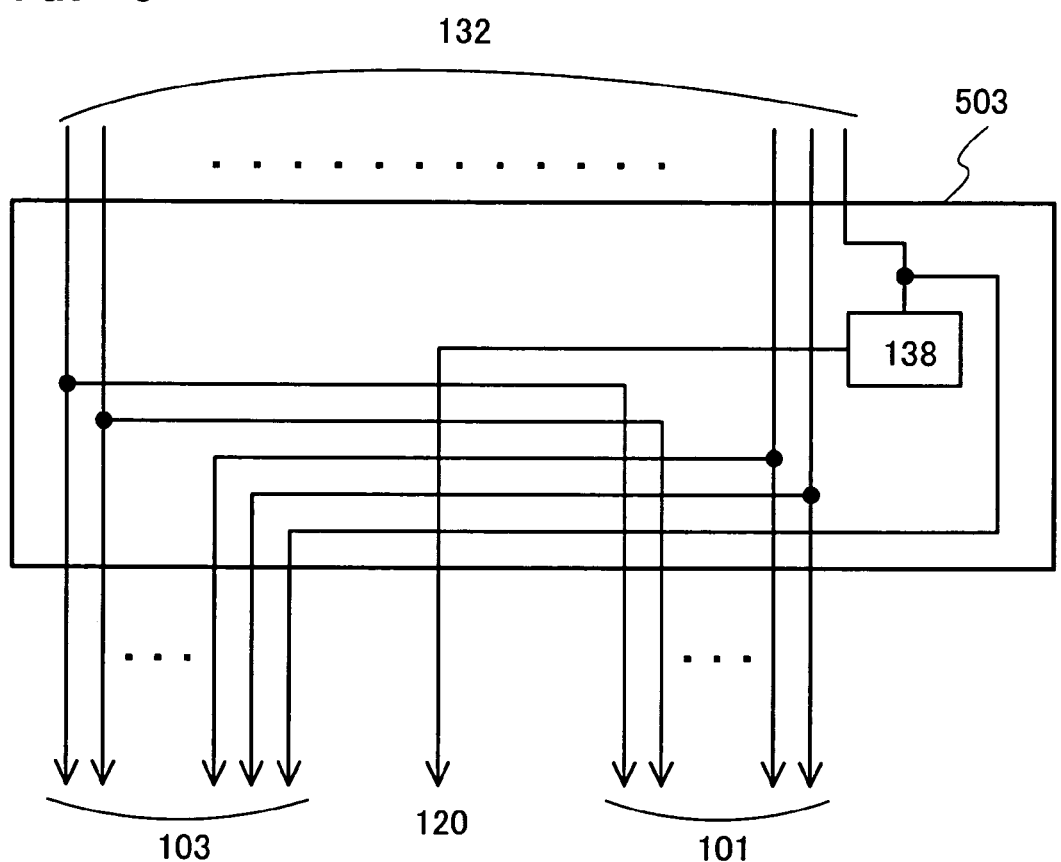
FIG. 6 is a diagram illustrating a structure of a display device of the present invention.

FIG. 6 shows a structure of the signal determination circuit 134. In this diagram, the input signal 132 is inputted with a bus line having a plurality of signal lines. Either of the RGB signal 103 and the luminance color-difference signal 101 can be selected as the input signal 132; however, in this case, the respective numbers of bus lines required for transmitting the signals are different. In FIG. 6, a signal line which is used only when the RGB signal is transmitted is included in the bus line. The signal line which is used only when the RGB signal is transmitted is also inputted into a decision circuit 138. The decision circuit 138 determines whether the input signal 132 is an RGB signal or a luminance color-difference signal based on presence or absence of a signal, and outputs the mode signal 120 in response to the result.

In FIG. 6, regardless of a value of the mode signal 120, the RGB signal 103 and the luminance color-difference signal 101 are outputted; however, the present invention is not limited to this. The RGB signal 103 or the luminance color-difference signal 101 may be outputted in response to the value of the mode signal 120.

Note that in FIG. 5, the controller 104, the video format conversion circuit 122, the input switching circuit 124, and the signal determination circuit 134 are shown by different blocks; however, as a controller 136, functions of the video format conversion circuit and the input switching circuit may be included in the controller 136 as shown by a dotted frame in the diagram. Similarly, the memory 105 may also be included in the controller. In this case, the IC chip may be mounted on the display 106 by COG (Chip On Glass) or the like. Mounting an IC chip in this manner contributes to downsizing of a panel.

In FIG. 5, the luminance color-difference signal 101, the RGB signal 103 and the image signal 107 can be processed as digital signals. FIG. 3 and FIG. 5 exemplify the case of the digital gray scale method; however, an analog gray scale method may also be employed by providing a D/A converter circuit as described in FIG. 2.

Next, handling of a compressed image signal is described with reference to FIG. 7. A compressed file is stored in a recording media 144 such as a hard disk or a semiconductor memory. This file is a picture file or an image file such as an MPEG system, a JPEG system, or a DV system which is a digital video standard. These compressed files are compressed in a state of a luminance color-difference signal. This file is read, and a compressed image signal 140 is inputted into an image expanding circuit 142. The image expanding circuit 142 performs an operation to return the compressed file to an original state. At this time, the signal is outputted from the image expanding circuit 142 as the luminance color-difference signal. Originally, since the signal has been a luminance color-difference signal in a compressed state, image expansion is performed as the state of a luminance color-difference signal. As a result, burden on the image expanding circuit 142 can be lightened. That is, the circuit scale of the image expanding circuit 142 can be reduced, and it is not required to speed up processing speed. The luminance color-difference signal can be inputted into the video format conversion circuit 102, the signal determination circuit 134, or the like as it is, shown in FIGS. 1 to 6.

Figure 7:
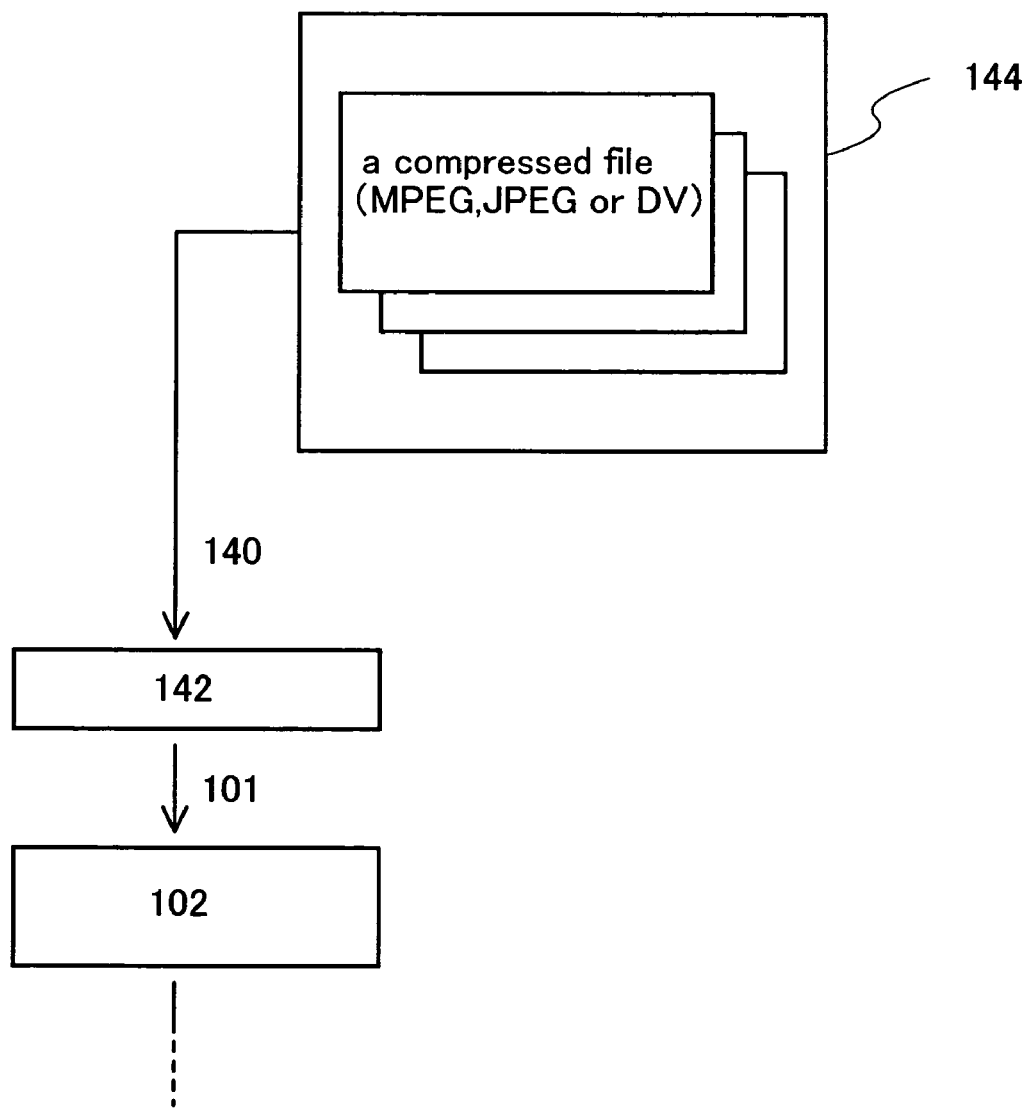
FIG. 7 is a diagram illustrating a structure of a display device of the present invention.

In an electronic apparatus provided with a display portion, in a case where an image or picture file compressed and stored in a hard disk or a semiconductor memory is displayed on the display portion, the structure shown in FIG. 7 is suitable since a structure of an image expanding circuit can be simplified. On the display portion provided for the electronic apparatus, represented by a mobile phone, there are cases where a specific image is displayed such as an operation menu screen, and where compressed arbitrary image information is displayed. In the case of displaying a specific image, since an RGB system is employed in many cases, it is preferable that an RGB system and a luminance color-difference system can be switched as shown in FIG. 3 and FIG. 5.

Figure 8:
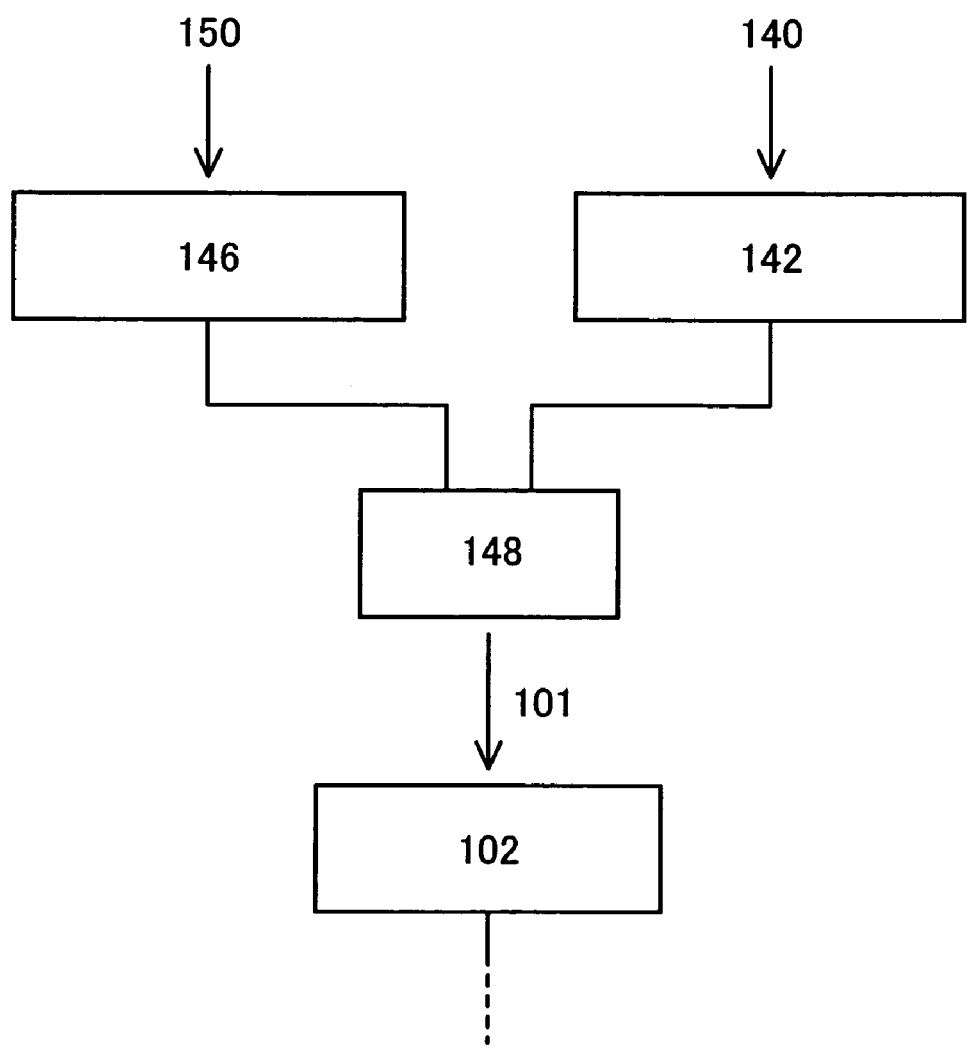
FIG. 8 is a diagram illustrating a structure of a display device of the present invention.

As a video signal, there are a composite signal which is composed of a luminance signal and a color-difference signal, and a component signal in which a color-difference signal is separated into a blue color-difference and a red color-difference. Normal television broadcasting is performed by a composite signal. In a case of treating a composite signal, by using a component signal converter circuit 146, a composite signal 150 is converted into a component signal as shown in FIG. 8. Then, since the signal is switched by an input switching circuit 148 to be outputted, a composite signal such as television or the like can be displayed.

By providing the component signal converter circuit 146 shown in FIG. 8, a display device which displays both of television broadcasting and an image or picture file which is compressed and stored in a hard disk or a semiconductor memory by switching between them can be provided. In addition, in a case where a particular image such as operation menu screen is displayed, an RGB system is employed in many cases. Therefore, as shown in FIG. 3 and FIG. 5, switching between an RGB system and a luminance color-difference system has an advantageous effect on improving operability of a display device.

A luminance color-difference signal can correspond to various formats such as ITU-R BT. 601 format, BTA S-001B format, YCbCr format, YPbPr format, YUV format, YIQ format, or YCC format.

Although a luminance color-difference signal is inputted, any signal as well as a luminance color-difference signal may also be used as long as the signal is other than an RGB signal. For example, even in a case of CMYK or HSV data, a structure can be formed similarly to a case of a luminance color-difference signal. Note that CMYK is an acronym for Cyan, Magenta, Yellow, and black (K is an acronym for Key color). In addition, HSV means Hue, Saturation, and Value.

In a display device of this embodiment mode, there is no particular limitation of a pixel structure in a display portion. A structure of this embodiment mode can be applied to various display devices as long as the display devices use a digital gray scale method. For example, an EL display in which a pixel is formed of an EL element in a display portion, a PDP (Plasma Display) or a DLP (Digital Light Processing) using a DMD (Digital Micromirror Device) may be used.

In accordance with this embodiment mode, by providing a video format conversion circuit, an RGB signal and a luminance color-difference signal can be switched to display an image. Thus, contrast is improved, and better image quality can be provided. In addition, a video signal processing system can be fully digitized, which leads to a circuit structure with resistant to noise. Further, since a display device can be downsized, power consumption can be lowered.

Embodiment Mode 2

A structure of a display for forming a display device and a method of expressing a gray scale are described in this embodiment mode.

Figure 9:
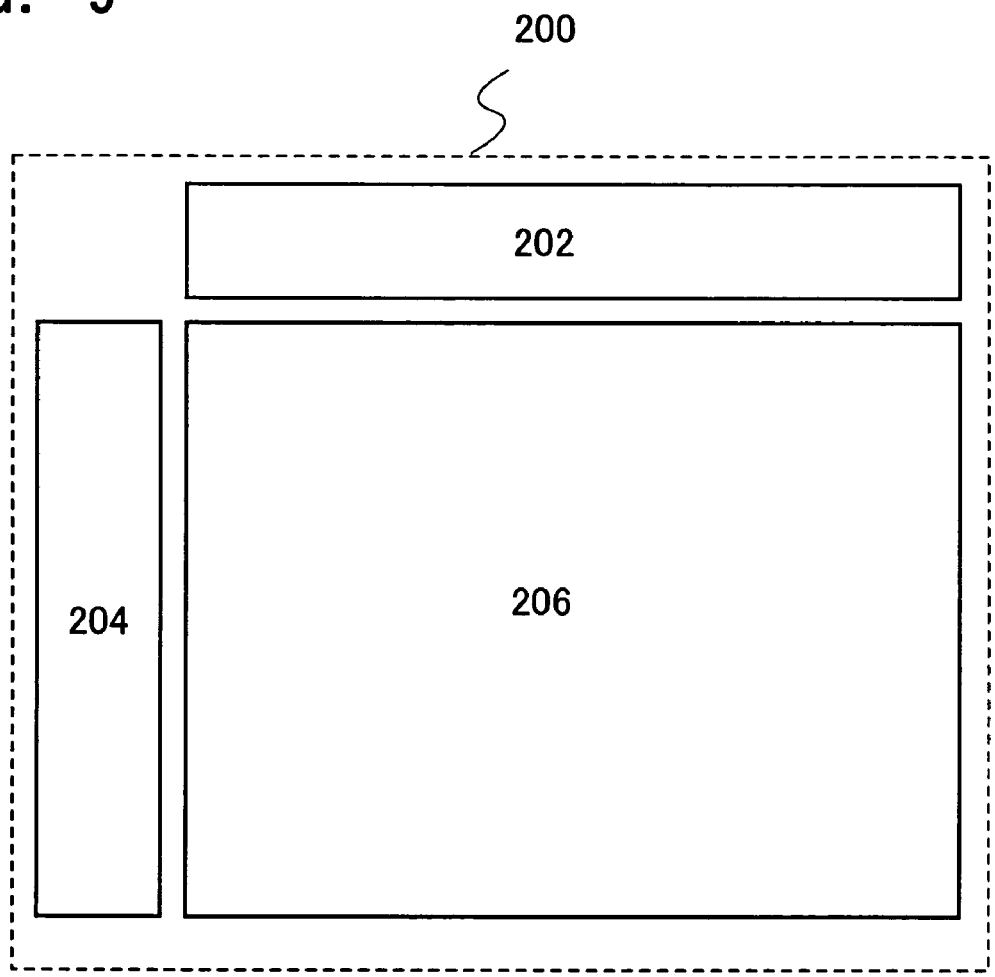
FIG. 9 is a block diagram showing a structure of a display device of the present invention.

A display device includes a display panel and a driver circuit which inputs a video signal or the like to the display panel. FIG. 9 shows a structure example of such a display panel. A display 200 includes a source signal line driver circuit 202, a gate signal line driver circuit 204, and a pixel portion 206. The pixel portion includes pixels disposed in matrix.

There is an active matrix method in which a switching element is arranged in each pixel, as a typical structure of the pixel portion 206. Below, description is made of a method in which two thin film transistors (TFTs) are arranged in each pixel and light emission of a light-emitting element of each pixel is controlled.

Figure 10:
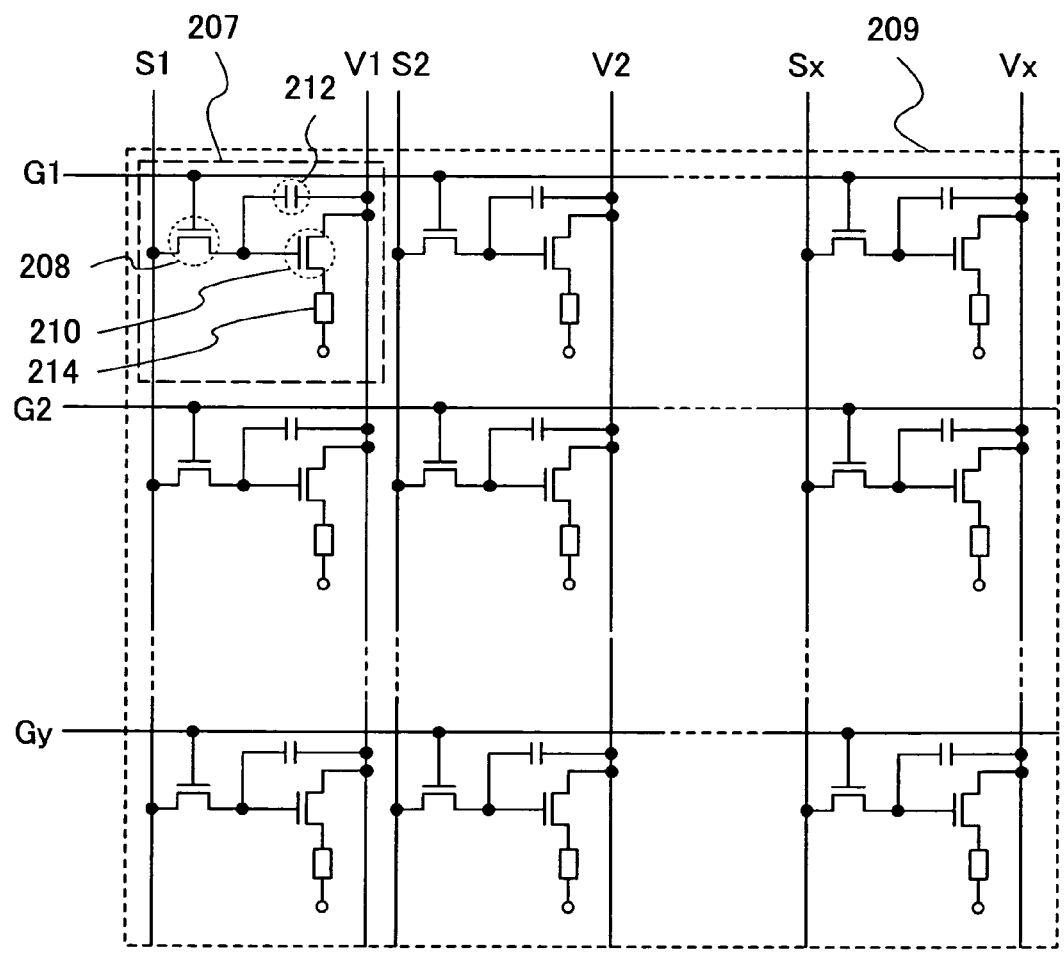
FIG. 10 is a diagram showing a structure of a pixel portion of a display device of the present invention.

A structure of the pixel portion of the display panel is shown in FIG. 10. In a pixel portion 209, source signal lines S1 to Sx, gate signal lines G1 to Gy, and power supply lines V1 to Vx are disposed, and pixels of x columns (where x is a natural number) and y rows (where y is a natural number) are disposed. A pixel 207 has a selecting TFT 208, a driving TFT 210, a storage capacitor 212, and a light-emitting element 214.

Figure 11:
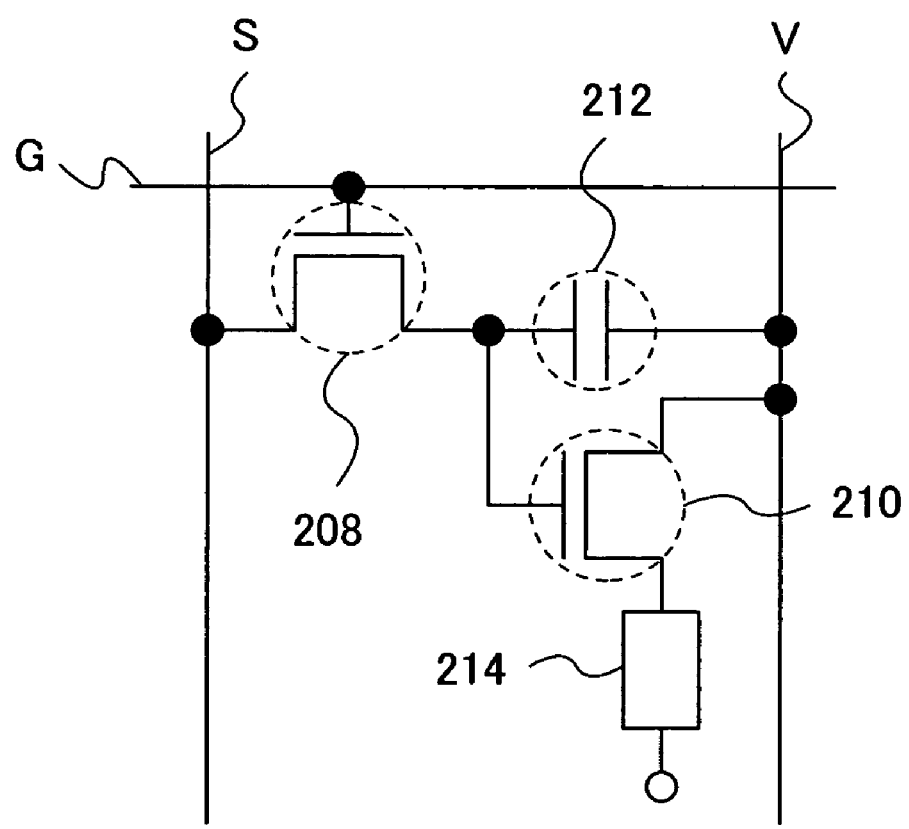
FIG. 11 is a diagram showing a pixel structure of a display device of the present invention.

Details of the pixel 207 in FIG. 10 are shown in FIG. 11. A gate electrode of the selecting TFT 208 is connected to a gate signal line G. One of either a source region or a drain region of the selecting TFT 208 is connected to a source signal line S, while the other one is connected to a gate electrode of the driving TFT 210 and one electrode of the storage capacitor 212. One of either a source region or a drain region of the driving TFT 210 is connected to a power supply line V, while the other one is connected to an anode or a cathode of the light-emitting element 214. The other electrode of the two electrodes of the storage capacitor 212, which is not connected to the driving TFT 210 and the selecting TFT 208, is connected to the power supply line V.

In this specification, the anode of the light-emitting element 214 is referred to as a pixel electrode whereas the cathode of the light-emitting element 214 is referred to as an opposing electrode in the case where the source region or the drain region of the driving TFT 210 is connected to the anode of the light-emitting element 214. On the other hand, in the case where the source region or the drain region of the driving TFT 210 is connected the cathode of the light-emitting element 214, the cathode of light-emitting element 214 is referred to as a pixel electrode whereas the anode of the light-emitting element 214 is referred to as an opposing electrode. In addition, a potential supplied to the power supply line V is referred to as a power supply potential, whereas a potential supplied to the opposing electrode is referred to as an opposing potential.

The selecting TFT 208 and the driving TFT 210 can be selected from a P-channel TFT and an N-channel TFT. The storage capacitor may be appropriately disposed if necessary. For example, when an N-channel TFT used as the driving TFT 210 has an LDD region formed so as to overlap with a gate electrode through a gate insulating film, parasitic capacitance called gate capacitor is formed in this overlapping region. It is possible to use this parasitic capacitance as a storage capacitor for storing a voltage applied to the gate electrode of the driving TFT 210.

A driving method in a case of displaying an image with the pixel having the above-mentioned structure is described below.

When a scanning signal is inputted into the gate signal line G, a potential of the gate electrode of the selecting TFT 208 changes and the selecting TFT 208 is turned on, that is, in a conductive state. Accordingly, a video signal is inputted into this pixel. This is a state where a potential based on the video signal is applied from the source signal line S to the gate electrode of the driving TFT 210 through the selecting TFT 208. In addition, charge is held in the storage capacitor 212 at the same time in response to the video signal. By a voltage applied to the gate electrode of the driving TFT 210, the driving TFT 210 is in a conductive state, and a potential of the power supply line V is supplied to the pixel electrode of the light-emitting element 214 through the driving TFT 210. Thus the light-emitting element 214 emits light.

Next, a method of expressing a gray scale in displaying an image with pixels having such a structure is described.

It is known that the methods of expressing a gray scale are roughly classified into an analog method and a digital method. Compared to the analog method, the digital method has characteristics of not being affected by variation of a TFT which forms a pixel as much. In addition, the digital method is suitable for multiple gray scale display.

As an example of a digital method of expressing a gray scale, a time gray scale method is known. This time gray scale driving method is a method of expressing a gray scale by controlling a period during which each pixel of a display device emits light.

In a time gray scale method, one frame period is divided into a plurality of subframe periods. Then, lighting or non-lighting is selected for each subframe period, and the period during which the light-emitting element emits light in one frame period is controlled so that a gray scale is expressed.

This time gray scale driving method is described in detail using timing charts in FIGS. 12A and 12B. An example of expressing a gray scale by using a 4-bit digital video signal is shown in FIGS. 12A and 12B. FIG. 10 and FIG. 11 are referred to as the structures of a pixel and a pixel portion thereof. Here, by a power source connected to outside, an opposing potential can be switched over such that there is a potential difference between the opposing potential and approximately the same level of potential as a potential of each of the power supply lines V1 to Vx (power supply potential) or the potential of each of the power supply lines V1 to Vx to an extent that the light-emitting element 214 emits light.

One frame period F1 is divided into a plurality of subframe periods SF1 to SF4 in FIG. 12A. The gate signal line G1 is selected first in the first subframe period SF1. Then, a digital video signal is inputted from the source signal lines S1 to Sx in the respective pixels having the selecting TFTs 208 with gate electrodes connected to the gate signal line G1. The driving TFT 210 of each pixel is turned on or off by the inputted digital video signal.

Here, the term "a TFT being turned on" means that the source and the drain are electrically connected to each other by applying a gate voltage. Further, the term "a TFT being turned off" means that the source and the drain are not electrically connected to each other by applying a gate voltage.

At this time, the opposing potential of the light-emitting element 214 is set to be nearly equal to the potential of each of the power supply lines V1 to Vx (power supply potential); therefore, the light-emitting element 214 does not emit light even in a pixel in which the driving TFT 210 is turned on.

FIG. 12B is a timing chart showing an operation of inputting a digital video signal to the driving TFT 210 of each pixel. In FIG. 12B, periods during which the source signal line driver circuit samples signals corresponding to the respective source signal lines are denoted by S1 to Sx. The sampled signals are outputted at the same time to all of the source signal lines in a blanking period shown in the figure. The signals thus outputted are inputted into the gate electrodes of the driving TFTs 210 in the pixels which are selected by a gate signal line.

The aforementioned operation is repeated for all of the gate signal lines G1 to Gy, and a writing period Ta1 is completed. Note that a writing period of the first subframe period SF1 is referred to as Ta1. In general, a writing period of the j-th subframe period (where j is a natural number) is referred to as Taj.

When the writing period Ta1 is complete, the opposing potential changes so as to have a potential difference from the power supply potential to an extent that the light-emitting element 214 emits light. A lighting period Ts1 thus starts. Note that a lighting period of the first subframe period SF1 is referred to as Ts1. A lighting period of the j-th subframe period (where j is a natural number) is referred to as Tsj. In the lighting period Ts1, the light-emitting element 214 of each pixel emits light or does not emit light in response to the inputted signal.

The above operation is repeated for all of the subframe periods SF1 to SF4, thereby completing one frame period F1. The length of the lighting periods Ts1 to Ts4 of the subframe periods SF1 to SF4 are set appropriately, and a gray scale is expressed by the sum total of the lighting period during which the light-emitting element 214 emits light, of the subframe period per frame period F1. That is, a gray scale is expressed by the sum total of the lighting time within one frame period.

A method of expressing $2n$ gray scales by inputting an n-bit digital image signal is described. For example, one frame period is divided into n subframe periods SF1 to SFn, and the ratio of the length of the lighting periods Ts1 to Tsn of the subframe periods SF1 to SFn is set so as to be Ts1: Ts2: ... :Ts(n-1):Tsn=$2^0:2^{-1}: \ldots :2^{-(n-2)}:2^{-(n-1)}$. Note that the lengths of the writing periods Ta1 to Tan are equal.

By calculating the sum total of a lighting period Ts during which a light emission state is selected in the light-emitting element 214 within one frame period, the gray scale level of the pixel in the frame period is determined. For example, providing that n is 8 and the luminance when the pixel emits light in all the lighting periods is 100%, a luminance of 1% can be expressed when the pixel emits light in Ts8 and Ts7, and a luminance of 60% can be expressed when Ts6, Ts4 and Ts1 are selected.

Note that one subframe period may be further divided into a plurality of subframe periods.

In a case where a gray scale is expressed using a time gray scale method, the number of subframes can be set arbitrarily. In addition, the length of a lighting period of each subframe period or which subframe is selected in emitting light, that is, a method of selecting a subframe, is not limited particularly.

For example, a case of expressing 16 gray scales is shown in FIG. 13. One frame period may be divided into four subframes (SF1 to SF4), and a ratio of the lighting periods Ts1: Ts2:Ts3:Ts4 of SF1 to SF4 may be $2^0:2^1:2^2:2^3$.

In addition, a method of expressing a gray scale, the gray scale may be expressed by sequentially adding a lighting period included in each of a part or all of subframes formed by dividing one frame. That is, the number of subframes for lighting may be increased as the gray scale level is increased. In this case, a subframe for lighting at a low gray scale level is also used for lighting at a high gray scale level. Such a gray scale method is called an "overlapped time gray scale method" in this specification. For example, examples in which an overlapped time gray scale method is applied to the case where 16 gray scales are expressed are shown in FIGS. 14A and 14B.

In FIG. 14A, one frame period is divided into five subframes (SF1 to SF5), the ratio of lighting periods of the subframes SF1 to SF5, Ts1:Ts2:Ts3:Ts4:Ts5 is $2^0:2^1:2^2:2^2: 2^2$, and an overlapped time gray scale method is applied to the subframes SF3 to SF5 of which the length of the lighting periods are equal. In FIG. 14B, one frame period is divided into five subframes (SF1 to SF5), the ratio of lighting periods of the subframes SF1 to SF5, Ts1:Ts2:Ts3:Ts4:Ts5 is $2^2:2^12^0:2^2:2^2$, and an overlapped time gray scale method is applied to the subframes SF1, SF4, and SF5 of which the length of the lighting periods are equal. Note that by applying an overlapped time gray scale method, a pseudo contour can be reduced.

Note that subframes to which an overlapped time gray scale method is applied are not limited to subframes of which the lengths of the lighting periods are equal. In addition, an appearance order of subframes is not limited to the above.

As a structure of a pixel portion included in a display of a display device of the present invention, a pixel having a known structure as well as the pixel of the structure shown in FIG. 10 can be employed freely. In addition, as a source signal line driver circuit and a gate signal line driver circuit included in the display of the display device of the present invention, a circuit having a known structure can be used freely. Further, the present invention can be applied not only to a display device using a light-emitting element as a light-emitting element, but also to a self-light-emitting type display device such as an FED or a PDP.

In accordance with this embodiment mode ever, in a case of using a time gray scale method, by providing a video format conversion circuit, an RGB signal and a luminance color-difference signal can be switched to display an image. Thus, contrast is improved, and better image quality can be provided. In addition, a video signal processing system can be fully digitized, which leads to a circuit structure with resistant to noise. Further, since a display device can be downsized, power consumption can be lowered.

Embodiment Mode 3

Figure 15:
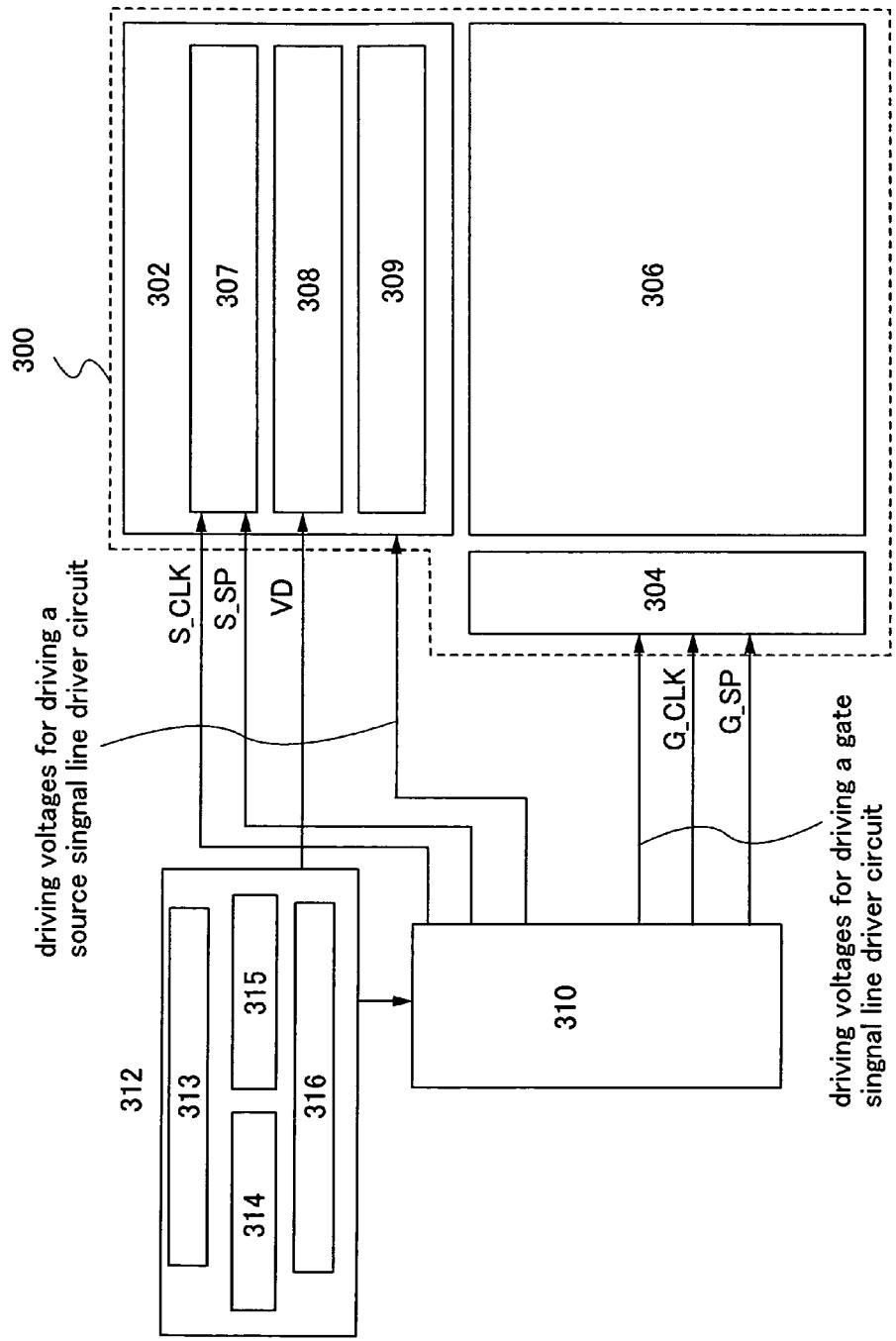
FIG. 15 is a block diagram showing a structure of a display device of the present invention.

In this embodiment mode, description is made with reference to FIG. 15 of a circuit which inputs signals for performing a time gray scale driving method into a source signal line driver circuit and a gate signal line driver circuit of a display. In this embodiment mode, description is made of an example of a display device for displaying an image by inputting a 4-bit digital image signal to the display device.

A signal control circuit 312 reads in a digital image signal (called a video signal inputted into a display), and outputs a digital video signal (VD) to a display 300. A signal obtained by converting the digital image signal into a signal to be inputted into the display in the signal control circuit 312 is called a "digital video signal" here.

Signals and driving voltages for driving a source signal line driver circuit 302 and a gate signal line driver circuit 304 in the display 300 are inputted by a display controller 310. The source signal line driver circuit 302 in the display 300 includes a shift register 307, a LAT (A) 308, and a LAT (B) 309. In addition, a level shifter, a buffer, and the like may be provided in the source signal line driver circuit 302.

The signal control circuit 312 includes a CPU 313, a memory (A) 314, a memory (B) 315, and a memory controller 316.

A digital image signal inputted into the signal control circuit 312 is controlled by the memory controller 316 and inputted into the memory (A) 314. Here, the memory (A) 314 has a capacity large enough to store 4-bit digital image signals for the whole pixels of a pixel portion 306 in the display 300. When signals for one frame period are stored in the memory (A) 314, a signal of each bit is sequentially read by the memory controller 316, which is then inputted into the source signal line driver circuit 302 as a digital video signal VD.

When the read operation of the signals stored in the memory (A) 314 starts, a digital image signal corresponding to the next frame period is inputted though the memory controller 316, and thus starts to be stored in the memory (B) 315. The memory (B) 315 has, similarly to the memory (A) 314, a capacity large enough to store 4-bit digital image signals for the whole pixels of the display device.

The signal control circuit 312 has the memory (A) 314 and the memory (B) 315 each of which is capable of storing 4-bit digital image signals for one frame period. By alternately using the memory (A) 314 and the memory (B) 315, digital image signals are sampled.

As long as the signal control circuit 312 has a memory capacity which is capable of storing data of a plurality of frames, and a function to perform storing and reading of video signals for every one frame period as described above, the present invention is not limited to the structure of FIG. 15.

Figure 16:
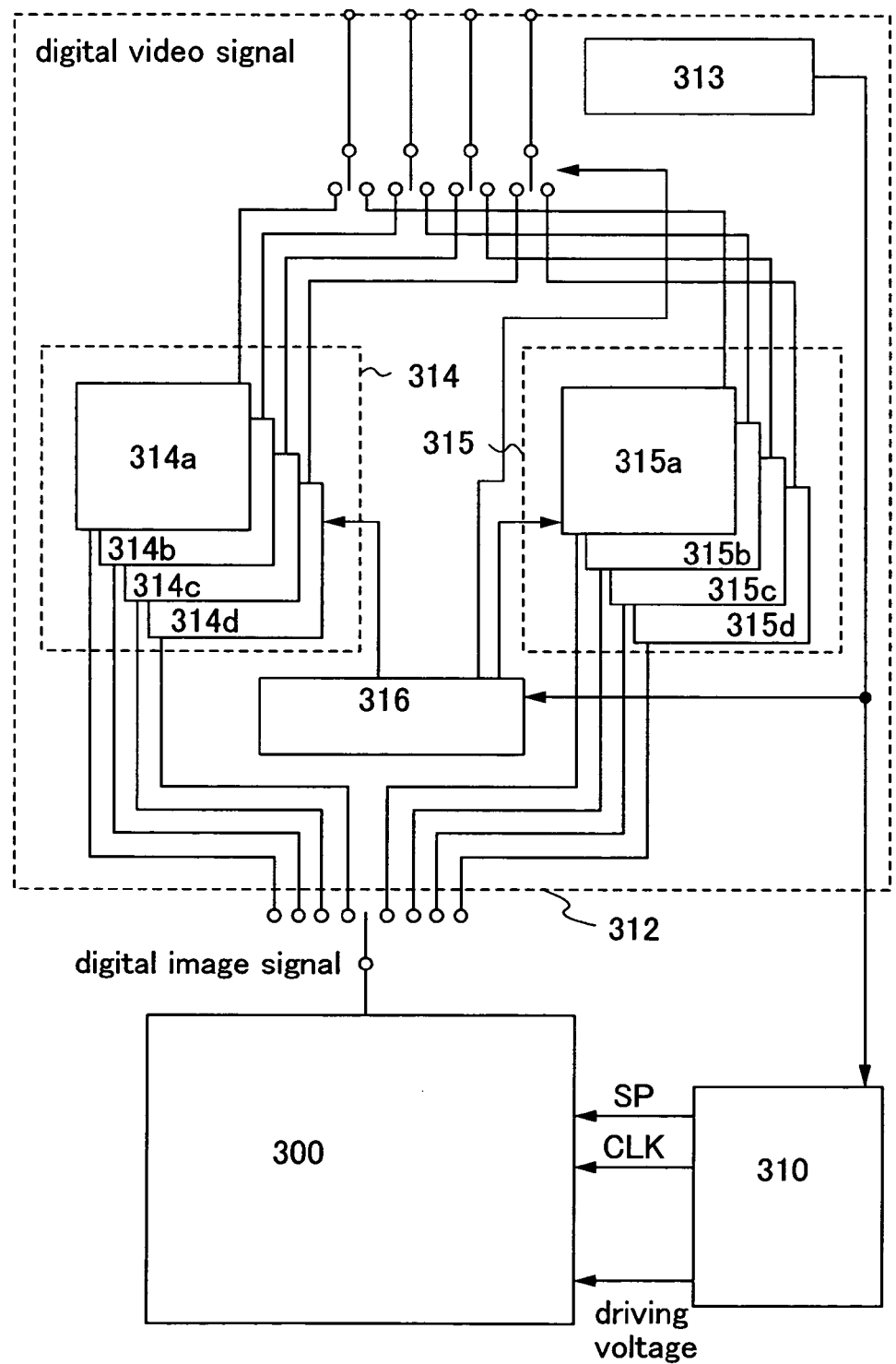
FIG. 16 is a block diagram showing a structure of a display device of the present invention.

FIG. 16 is a block diagram of a display device performing the aforementioned operation. The display device includes the signal control circuit 312, the display controller 310, and the display 300.

The display controller 310 supplies a start pulse SP, a clock pulse CLK, and a driving voltage to the display 300.

FIG. 16 shows an example of a display device in which a 4-bit digital image signal is inputted and a gray scale is expressed by using a 4-bit digital video signal in a first display mode. The memory (A) 314 includes memories (A) 314a to 314d which store data of first to fourth bits of a digital image signal respectively. Similarly, the memory (B) 315 includes memories (B) 315a to 315d which store data of first to fourth bits of a digital image signal respectively. The memory corresponding to each bit has memory elements for storing one bit of a signal, in number corresponding to the number of pixels which constitute one screen.

In general, in a display device capable of expressing a gray scale using an n-bit digital video signal, the memory (A) 314 includes the memories (A) 314a to 314d for storing the data of the first to n-th bits respectively. Similarly, the memory (B) 315 includes the memories (B) 315a to 315d for storing data of first to n-th bits respectively. The memory corresponding to each bit has a capacity large enough to store one bit of a signal, in number corresponding to the number of pixels which constitute one screen.

Figure 17:
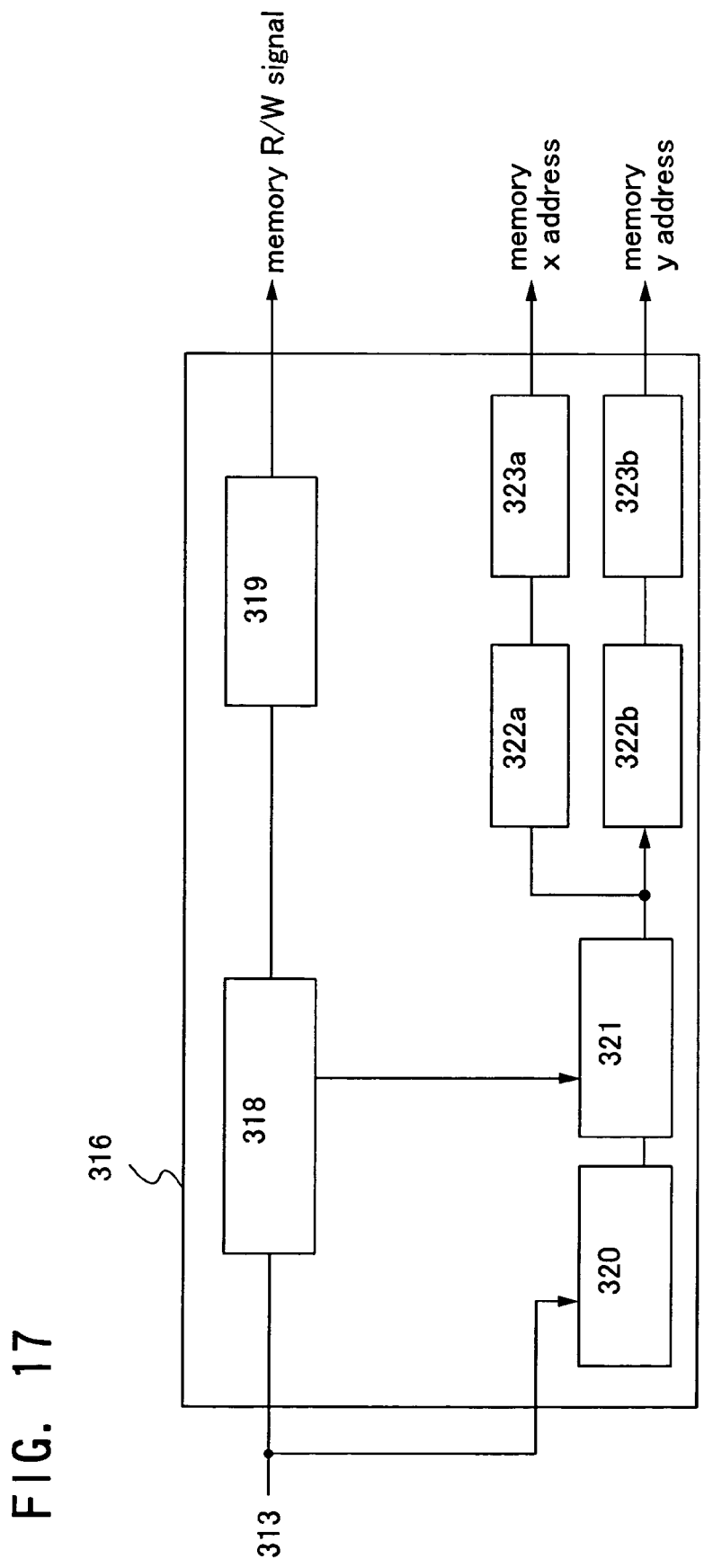
FIG. 17 is a diagram showing a structure of a memory controller of a display device of the present invention.

FIG. 17 shows a structure of the memory controller 316. In FIG. 17, the memory controller 316 includes a gray scale limiting circuit 318, a memory control circuit 319, a reference oscillator circuit 320, a variable frequency dividing circuit 321, an x counter 322a, a y counter 322b, an x decoder 323a, and a y decoder 323b.

The memory (A) 314 and the memory (B) 315 or the like shown in FIG. 15, 16, or the like are collectively referred to as a memory. In addition, the memory includes a plurality of memory elements. The memory elements are selected by an address (x, y).

A signal from the CPU 313 is inputted into the memory control circuit 319 through the gray scale limiting circuit 318. The gray scale limiting circuit 318 inputs the signal into the memory control circuit 319 in accordance with either the first display mode or the second display mode. The memory control circuit 319 selects whether or not to write a digital image signal corresponding to each bit into the memory, in accordance with the signal from the gray scale limiting circuit 318. Similarly, an operation of reading a digital video signal which has been written into the memory is selected.

The signal from the CPU 313 is inputted into the reference oscillating circuit 320. A signal from the reference oscillating circuit 320 is inputted into the variable frequency dividing circuit 321, and converted into a signal with a suitable frequency. Here, into the variable frequency dividing circuit 321, the signal from the gray scale limiting circuit 318 in accordance with either the first display mode or the second display mode is inputted. Based on this signal, the signal from the variable frequency dividing circuit 321 selects an x-address of the memory through the x-counter 322a and the x-decoder 323a. Similarly, the signal from the variable frequency dividing circuit is inputted into the y-counter 322b and the y-decoder 323b, and selects a y address of the memory.

By using the memory controller 316 with the above-described constitution, the amount of data of a signal to be written into and read from the memory, in the digital image signal inputted into the signal controlling circuit can be suppressed when high gray scale display is not required. Further, the frequency for reading out the signal from the memory can be changed.

Figure 18:
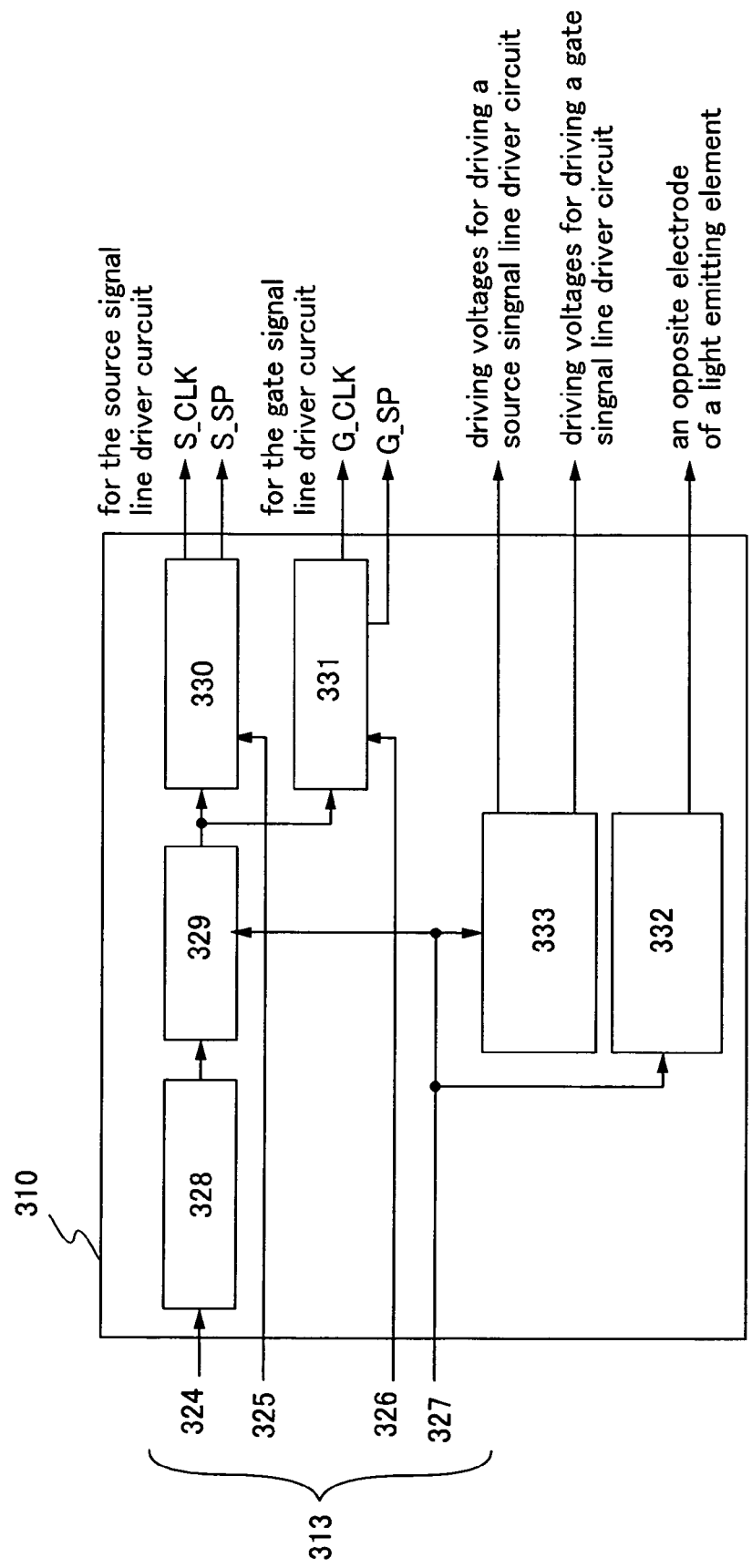
FIG. 18 is a diagram showing a structure of a display controller of a display device of the present invention.

A structure of the display controller 310 is described below. FIG. 18 is a diagram showing the structure of the display controller of the present invention. The display controller 310 includes a reference clock generating circuit 328, a variable frequency dividing circuit 329, a horizontal clock generating circuit 330, a vertical clock generating circuit 331, a power source controlling circuit for a light-emitting element 332, and a power supply controlling circuit for a driver circuit 333.

A clock signal 324 inputted from the CPU 313 is inputted into the reference clock generating circuit 328, and generates a reference clock. This reference clock is inputted into the horizontal clock generating circuit 330 and the vertical clock generating circuit 331 through the variable frequency dividing circuit 329. A gray scale controlling signal 327 is inputted into the variable frequency dividing circuit 329. The frequency of the reference clock is changed by this signal.

The extent that the frequency of a reference clock is changed in the variable frequency dividing circuit 329 can be determined arbitrarily.

Further, a horizontal synchronizing signal 325 for determining a horizontal period is inputted into the horizontal clock generating circuit 330 from the CPU 313, and a clock pulse S_CLK and a start pulse S_SP for the source signal line driver circuit are outputted. Similarly, a vertical period signal 326 for determining a vertical period is inputted into the vertical clock generating circuit 331 from the CPU 313, and a clock pulse G_CLK and a start pulse G_SP for the gate signal line driver circuit are outputted.

In this manner, reading out of a lower bit signal from the memory is not conducted and the frequency of reading out a signal from the memory is reduced in the memory controller of the signal controlling circuit. In response to this operation, the display controller lowers the frequencies of the sampling pulse SP and of the clock pulse CLK to be inputted into each of the driver circuits (the source signal line driver circuit and the gate signal line driver circuit), and can set a writing period and a lighting period of a subframe period for expressing an image to be long.

In this embodiment mode, one frame period is divided into four subframe periods, and $2^4$ gray scales are expressed by using a 4-bit digital video signal; however, one subframe period may be further divided into a plurality of subframe periods. For example, one frame period may be divided into six subframe periods.

The power source controlling circuit for the light-emitting element 332 controls the potential of an opposing electrode (opposing potential) of a light-emitting element such that it is maintained at a potential which is nearly the same as the power source potential during the writing period whereas it has a potential difference from the power source potential to an extent that the light-emitting element emits light in the lighting period. Here, the gray scale controlling signal 327 is also inputted into the power source controlling circuit for the light-emitting element 332. By this, in the pixel in which a light emitting state is selected, the potential of the opposing electrode of the light-emitting element is changed so as to reduce a voltage applied between both electrodes of the light-emitting element, by an amount of the increase in the light emitting period of the light-emitting element.

The power supply controlling circuit for the driver circuit 333 controls a power source voltage to be inputted into each driver circuit. Here, the gray scale controlling signal 327 is inputted also into the power supply controlling circuit for the driver circuit 333; therefore, the power source voltage for a driver circuit to be outputted is changed.

Note that the power supply controlling circuit for the driver circuit 333 may adopt a known structure such as a technique disclosed in Japanese Patent No. 3110257 (Japanese Patent Laid-Open No. Hei 8-69690).

The above-mentioned signal controlling circuit 312, memory controller 316, CPU 313, memory (A) 314, memory (B) 315, and display controller 310 may be formed over the same substrate as pixels, or may be formed by LSI chips and then be attached onto the substrate of the display 300 by COG, or may be attached onto the substrate by using TAB, or may be formed over a substrate different from that of the display and connected by using an electric wire.

A similar effect can be obtained by combining the display device of this embodiment mode with Embodiment Mode 1 or Embodiment Mode 2.

Embodiment Mode 4

Figure 19:
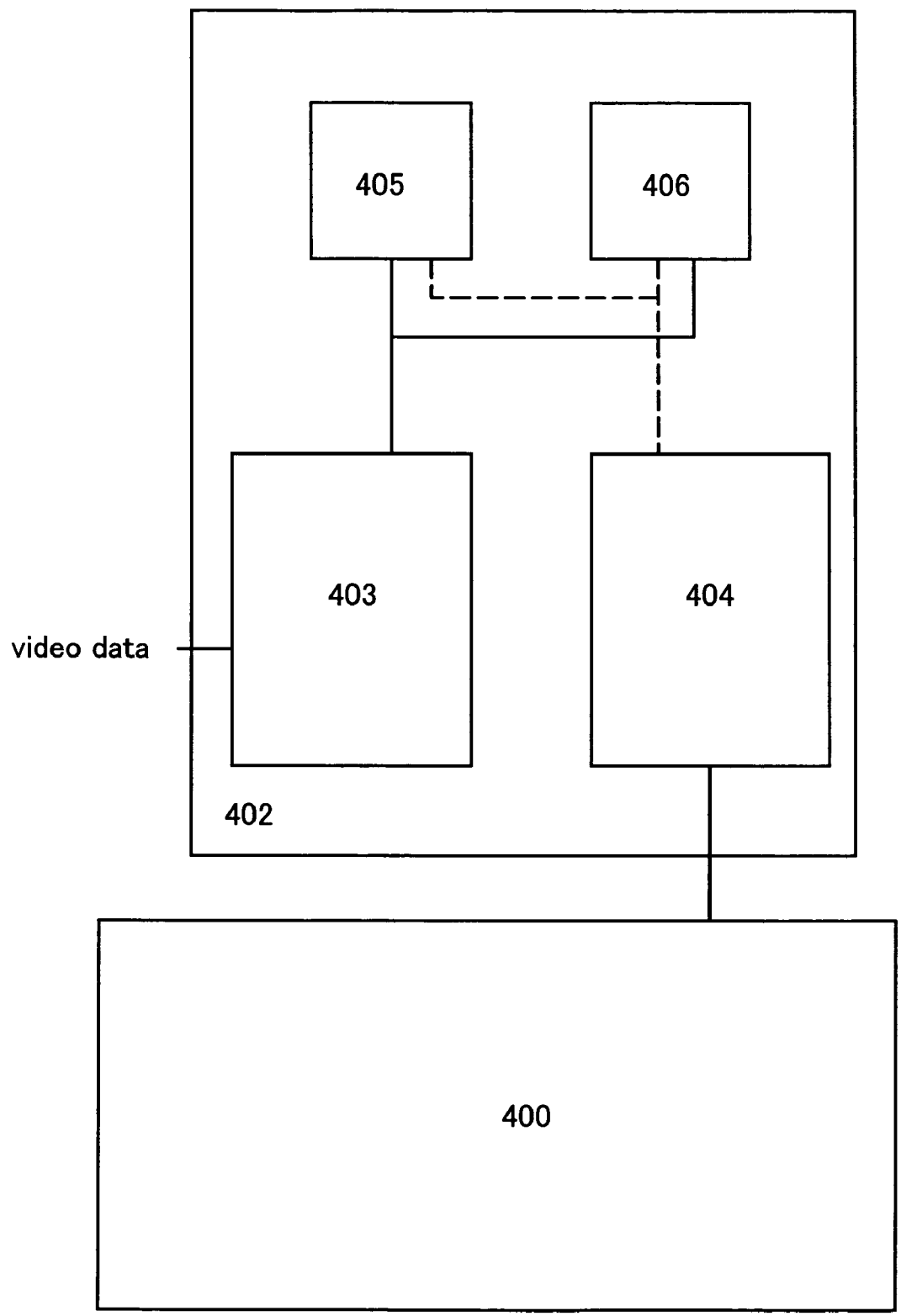
FIG. 19 is a diagram showing an example of a block diagram of a control circuit.

A driver circuit of a display device is described in this embodiment mode. In order to perform display by using a time gray scale, a circuit for converting signals into signals for time gray scale is required. As the circuit for converting signals into signals for time gray scale, a control circuit as shown in FIG. 19 can be employed for example denoted. A control circuit 402 includes memories (A) 405 and (B) 406 for storing data, a logic circuit for reading data and writing the data into the memory (a W-logic 403), and a logic circuit for reading the data from the memory and outputting the data to a display 400 (an R-logic 404).

Figure 20:
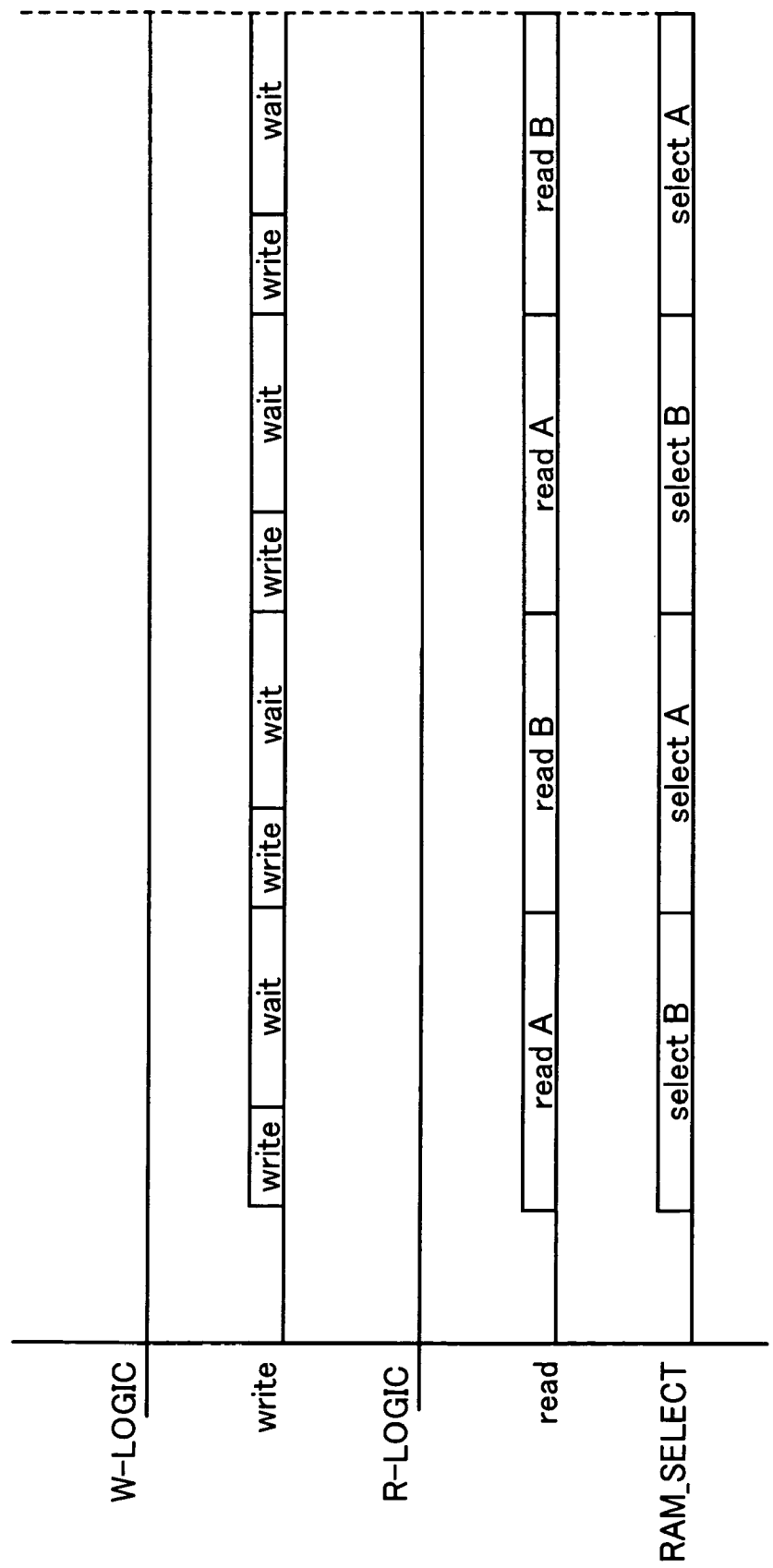
FIG. 20 is a diagram showing a timing chart of an operation of FIG. 19.

FIG. 20 is a timing chart of a control circuit of this embodiment mode. Data is written and read alternately using the memories (A) 405 and (B) 406 in order to allow digital data that is inputted into the W-logic 403 to be adapted to the time gray scale method.

When the R-logic 404 reads signals stored in the memory (A) 405, digital image signals that can be used for the next frame period are simultaneously inputted into the memory (B) 406 through the W-logic 403 and starts to be stored.

Thus, the control circuit 402 includes the memories (A) 405 and (B) 406 that can store digital image signals of 1 frame period each, and samples the digital image signals by using the memories (A) 405 and (B) 406 alternately.

At this time, the control circuit is put in a Wait (stand-by) state until the next reading signal is given after writing into the memory (A) 405 or (B) 406. Further, roles of the memories (A) 405 and (B) 406 are switched from/to writing to/from reading in timing with reading which takes more time.

In addition, allotment of two memories may be determined every cycle of writing signals, and a start of reading may be determined through start signals for writing and horizontal synchronizing signals. The problem that the frame frequency decreases can thus be prevented.

Figure 21:
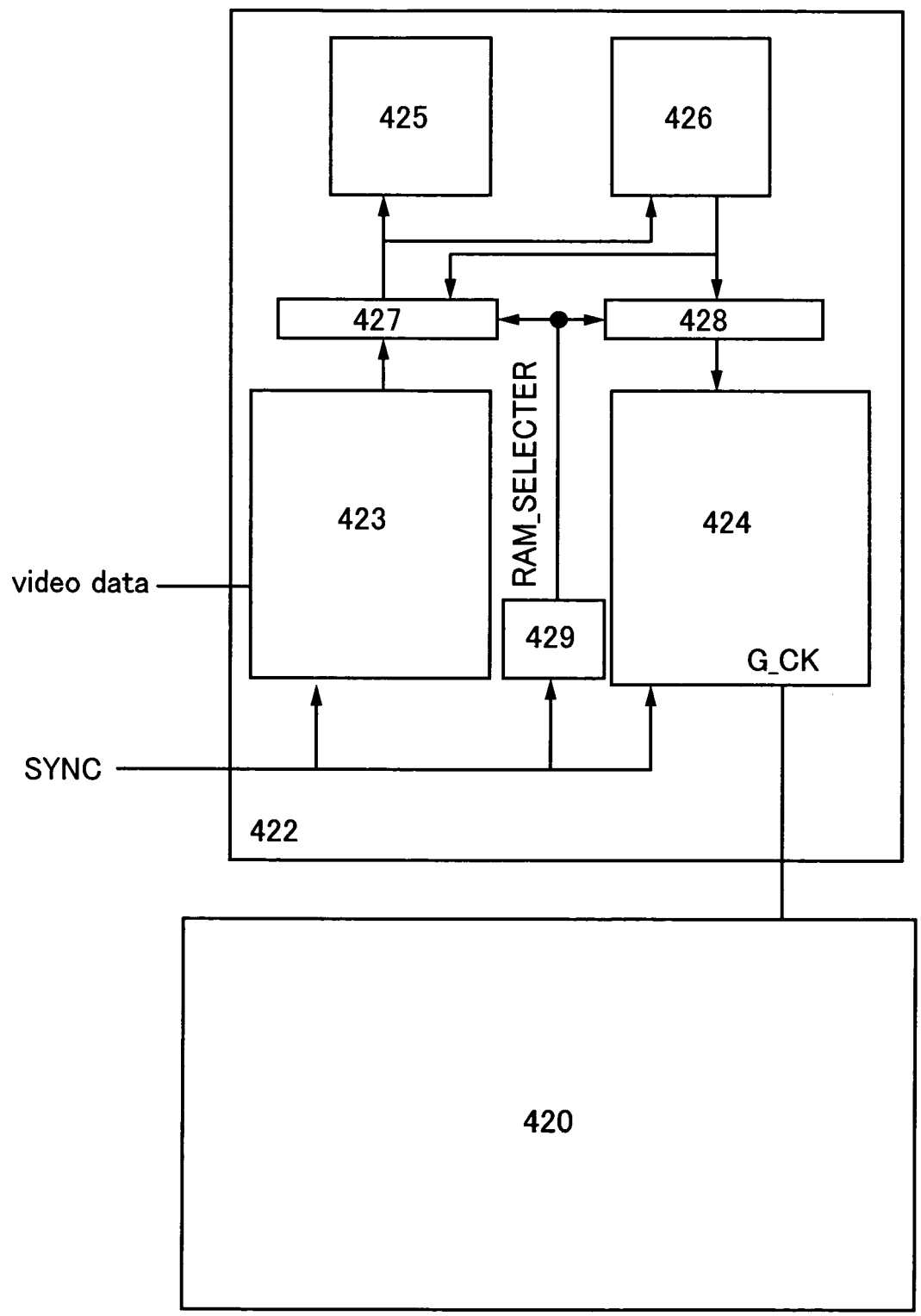
FIG. 21 is a diagram showing an example of a block diagram of a control circuit.

FIG. 21 is a block diagram showing another structure in this embodiment mode.

A control circuit 422 includes memories (A) 425 and (B) 426, selectors (A) 427 and (B) 428 for selecting a function of writing or reading for the memory, a logic circuit for writing into the memory (a W-logic 423), a logic circuit for reading from the memory and outputting (an R-logic 424) to a display 420, and a circuit for determining a starting point of vertical synchronizing signals (SYNC) (a TOP 429).

Signals of SYNC, G_CK, RAM_SELECTOR, and READ_ENABLE are newly adopted to achieve synchronization.

RAM_SELECTOR is inverted every time a SYNC signal is inputted, and roles of writing and reading of the memories (A) 425 and (B) 426 are determined by the selectors (A) 427 and (B) 428.

Figure 22:
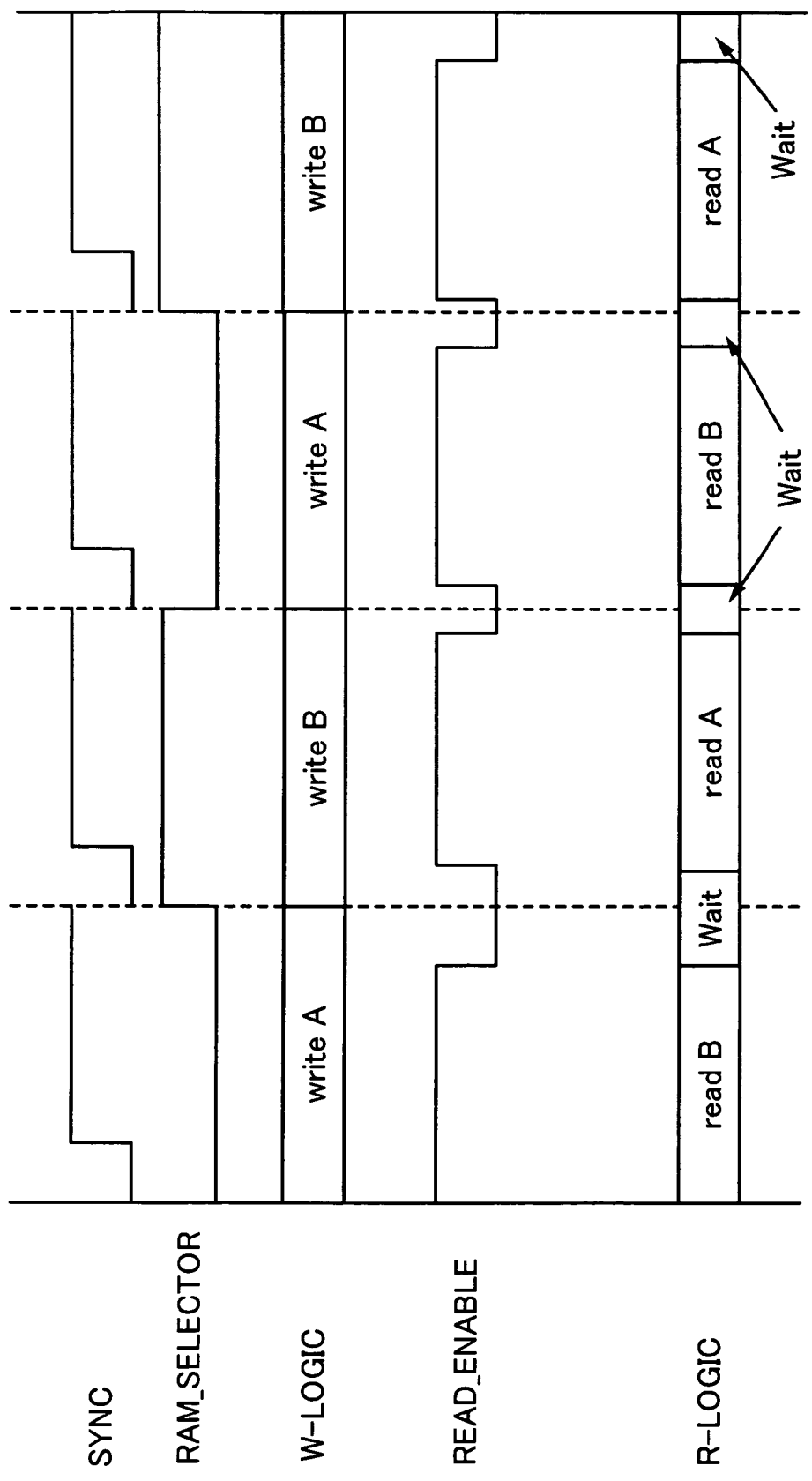
FIG. 22 is a diagram showing a timing chart of an operation of FIG. 21.

FIG. 22 is a timing chart of operations of the TOP 429, the W-logic 423, and the R-logic 424. RAM_SELECTOR is inverted when a SYNC signal is inputted, and roles of the two memories (A) 425 and (B) 426 are switched from/to writing to/from reading. At the same time, the W-logic performs writing, the R-logic starts to read, and a READ_ENABLE signal becomes at H level (or L level).

Figure 23:
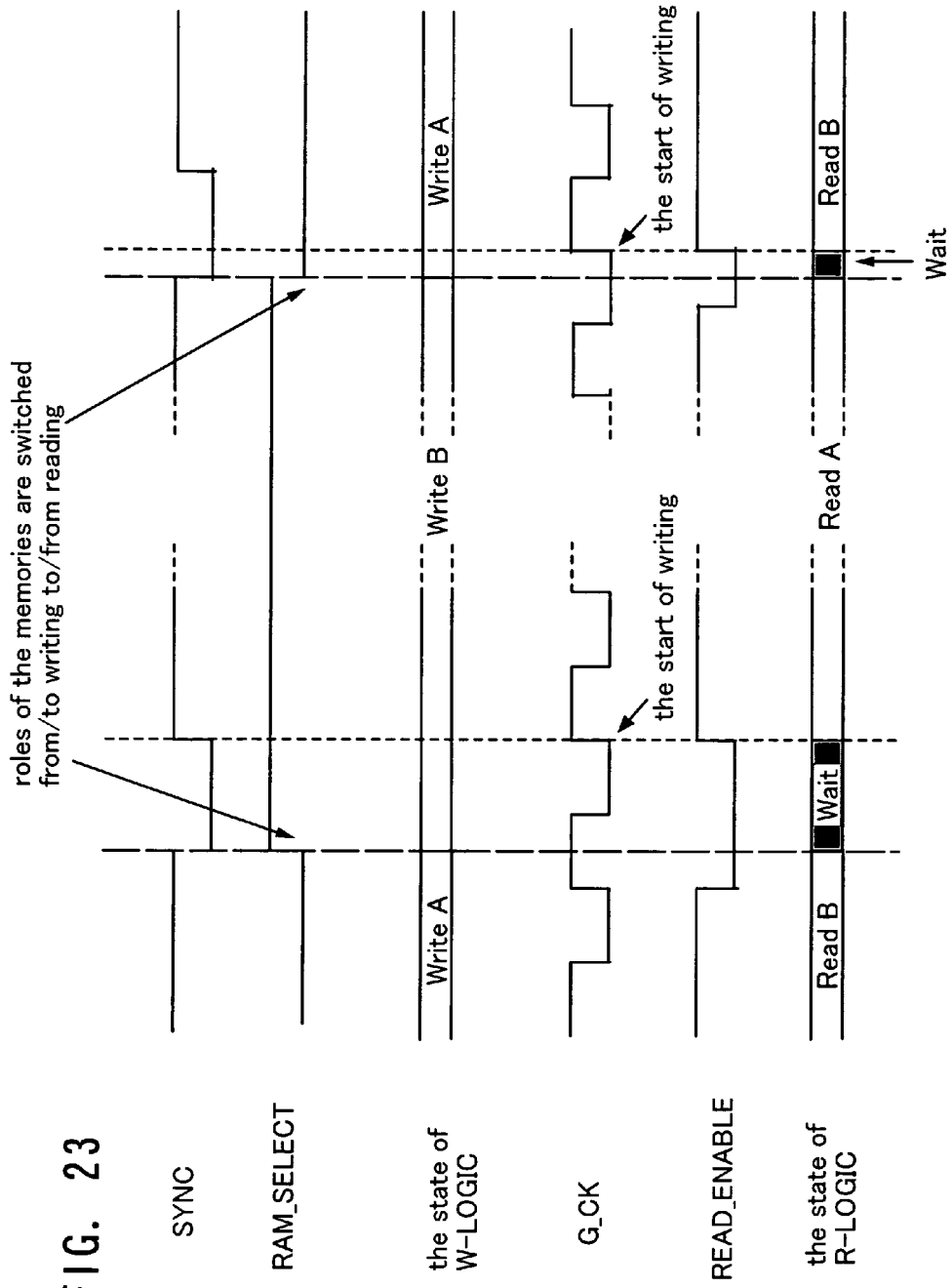
FIG. 23 is a diagram showing timing of writing and reading, and a timing chart regarding the synchronization.

FIG. 23 is timing of writing and reading, and a timing chart regarding the synchronization. RAM_SELECTOR is inverted by vertical synchronizing signals (SYNC), and roles of the memories are switched from/to writing to/from reading. Therefore, the W-logic alternately uses the memories (A) 425 and (B) 426 shown in FIG. 21 for writing data.

READ_ENABLE is to be signals indicating that the R-logic is in a readable state at the time of H level and indicating that the R-logic is in a stand-by state (Wait) at the time of L level.

Further, READ_ENABLE is put in a writable state (High) from a starting point (High) of horizontal synchronizing signals (G_CK) after RAM_SELECTOR is inverted, and the R-logic is put in a readable state from a stand-by state for reading (Wait). Note that the stand-by state for reading (Wait) of the R-logic automatically becomes a stand-by state for reading (Wait) after a reading cycle ends. In other words, RAM_SELECTOR is inverted by vertical synchronizing signals, and a period of a stand-by state for reading (Wait) is changed from each state of G_CK and READ_ENABLE signals. Note that READ_ENABLE indicating a start of horizontal synchronizing signals (G_CK) and a readable state or a stand-by state may be at H level or L level.

Therefore, different cycles of writing and reading are synchronized by adjusting a period of a stand-by state (Wait) of the R-logic.

Figure 24:
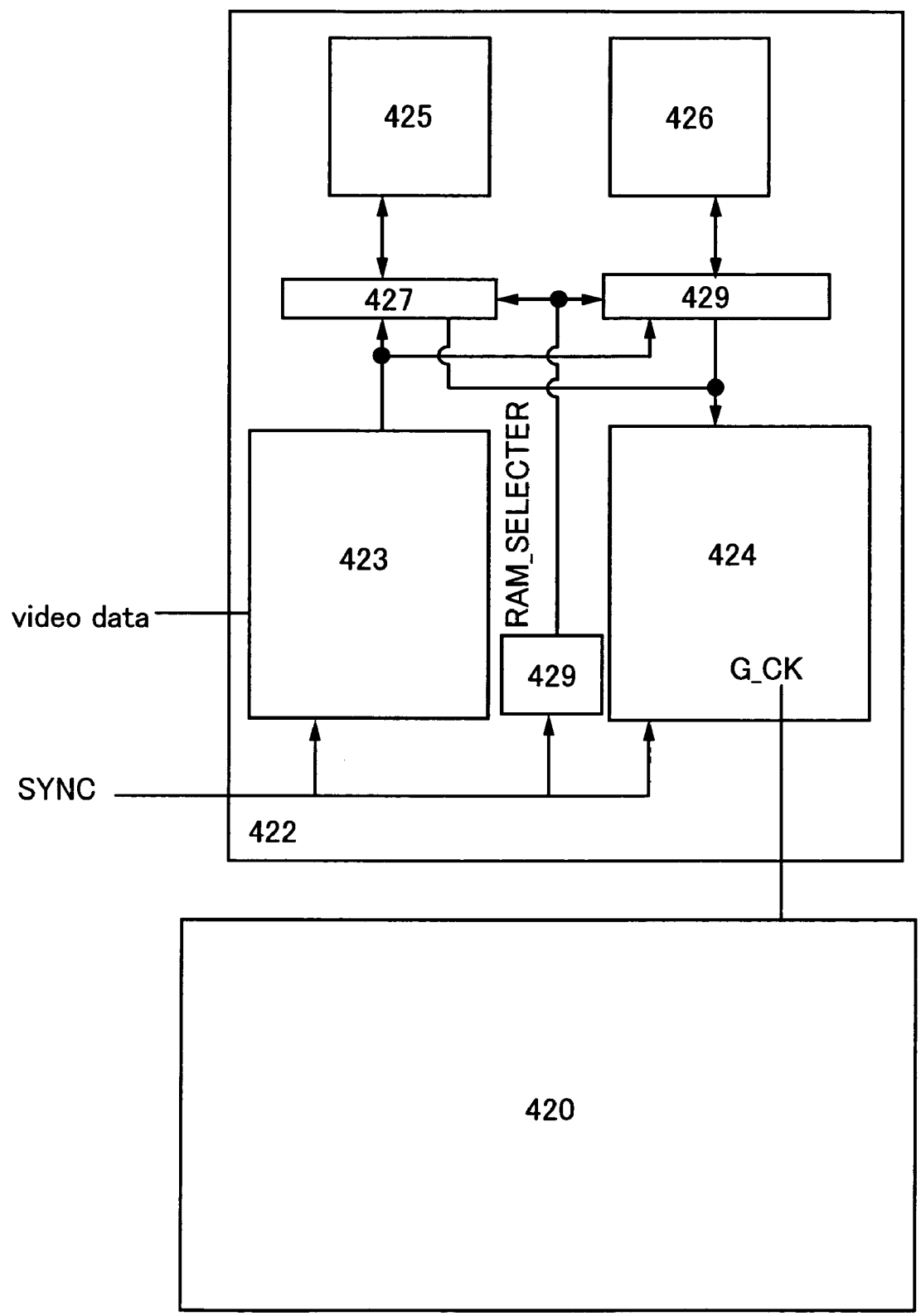
FIG. 24 is a diagram showing an example of a block diagram of a control circuit.

This embodiment mode is not limited to the block diagram of FIG. 21, and a block diagram shown in FIG. 24 can be used. Although in FIG. 24, the same reference numerals are used as that of FIG. 21, functions of the selectors (A) 427 and (B) 428 are different. The selector (A) 427 can write data to the R-logic 424, and the selector (B) 428 can read data from the W-logic. Accordingly, functions of reading and writing of data can be exchanged to each other as for both of the memories (A) 425 and (B) 426.

Figure 25:
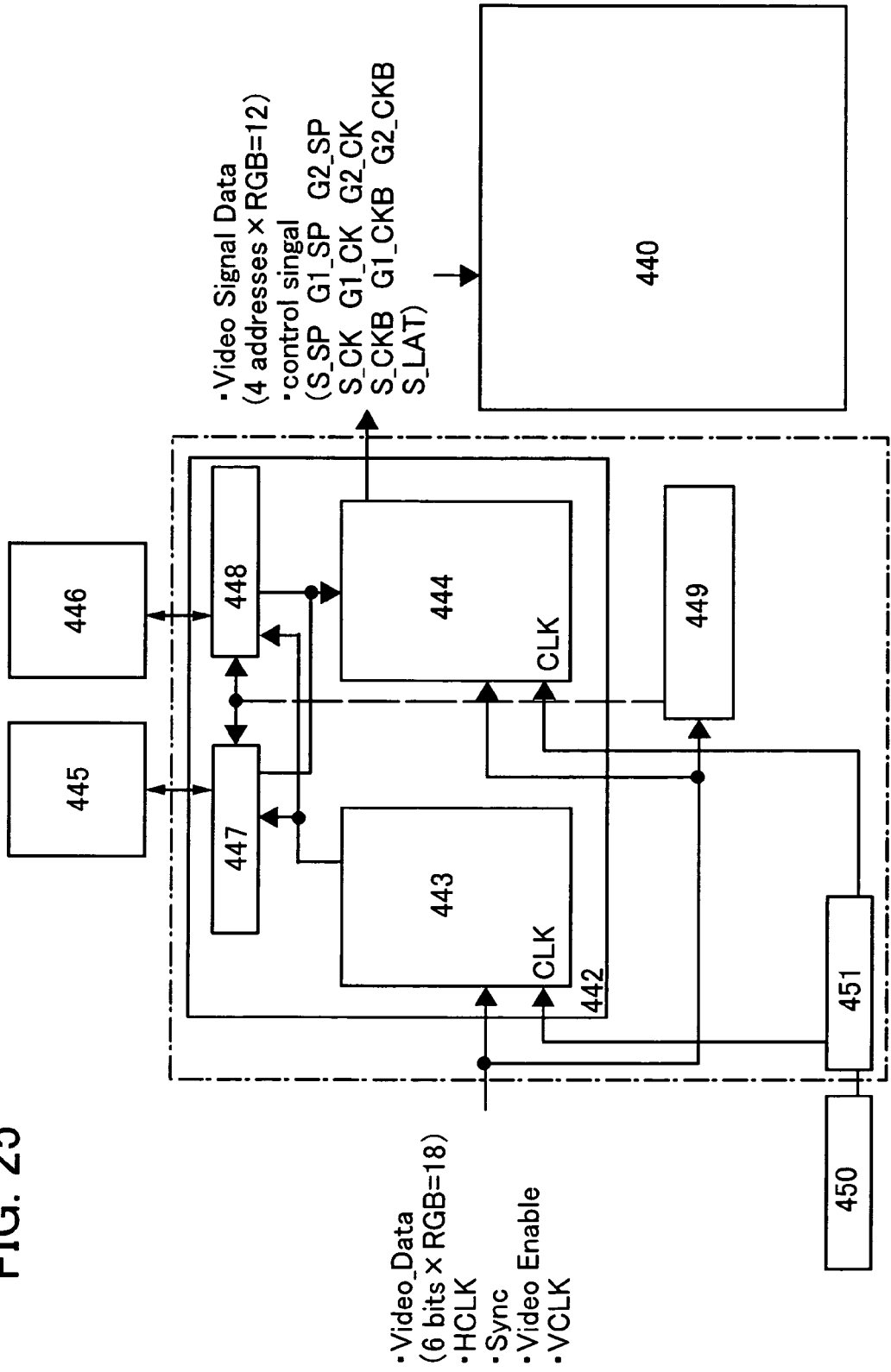
FIG. 25 is a diagram showing an example of a display device using the present invention.

Next, an example of a structure of a control circuit that outputs signals to a display panel using light-emitting elements is described with reference to FIG. 25.

18-bit (6 bits×RGB) Video_Data and control signals are inputted into an FPGA 442 which is a control circuit. Operations from the input of Video_Data to the output to a display 440 are described.

Reading of each row is controlled by VCLK (a cycle is 68.8 μsec). First, Video_Data starts to be inputted by the input of an SYNC signal. After the SYNC signal is inputted and a certain off period passes, Video_Data starts to be inputted into a W-logic 443. One row of Video_Data is read per half cycle of VCLK. After 220 rows are inputted and a certain off period passes, the SYNC signal is inputted again, and Video_Data is inputted. An input cycle for full screen is 16.6698 msec (243 cycles of VCLK, 60 cycles per second).

Reading of each block in one row is controlled by HCLK (a cycle is 400 nsec). HCLK reads Video_Data during the period in which Video_Enable is High. After data of one row, more specifically data of 176 blocks is read and a certain off period (Video_Enable is at L level) passes, the next row of Video_Data is read. By repeating this operation for 220 rows, data for one screen is completed.

On the other hand, memories (A) 445 and (B) 446 are connected to the FPGA 442, and a RAM_SELECT value is inverted every input of the SYNC signal.

A RAM_SELECT signal from the FPGA operates selectors (A) 447 and (B) 448 and determines which memory is to be written or read.

Each FPGA includes 144 (6×8×3) flip-flops. Each flip-flop can store data (6 bits) for one color at a certain point. Data is sequentially outputted to the next flip-flop by HCLK. When the flip-flop has eight blocks of data, the data is stored in 144 registers and are written to a memory selected by RAM_SELECT.

Since the display 440 displays images by using time gray scale, data written to the memory (A) 445 or (B) 446 is rearranged for outputting to the display and is sequentially outputted to the display 440. An R-logic 444 reads data for full screen rearranged for the output to the display from the memory (A) 445 or (B) 446, and then outputs the data to the display 440.

In displaying images on the display 440, Video Signal Data is processed in 12 bits (4 (addresses)×RGB (three colors)). G1_CK, G2_CK, G1_CKB, and G2_CKB are clock signals whose cycles are 12 μs each. On a timing of either a rising edge or a falling edge of G1_CK and G1_CKB, a row into which the Video Signal Data is inputted moves.

Two cycles (24 μsec) after G1_SP falls, writing is sequentially performed from a top row in sequence. Writing for 220 rows makes a display for one screen; however, four dummy cycles (48 μsec) come before displaying the next image in order to delay writing. In addition, G2_SP rises in erasing the written data as needed.

S_CK and S_CKB are clock signals whose cycles are 200 nsec each. On a timing of either a rising edge or a falling edge of S_CK and S_CKB, a block into which Video_Data is inputted moves. Four cycles (800 nsec) after G1_CLK rises or falls, S_LAT becomes High to store an electric charge, and when S_SP changes from H level to L level, Video Signal Data starts to be inputted. As data is inputted every four address, repeating it 44 times completes writing for one row.

The W-logic 443 and the R-logic 444 are operated by inputting clock signals from an oscillation element 450 through a PLL 451. In addition, the timing of writing and reading to the memories (A) 445 and (B) 446 is controlled in accordance with the rising edge and the falling edge of the clock signals through a TOP 449.

An LSI as well as an FPGA may be used for each of the W-logic 443 and the R-logic 444.

Figure 26:
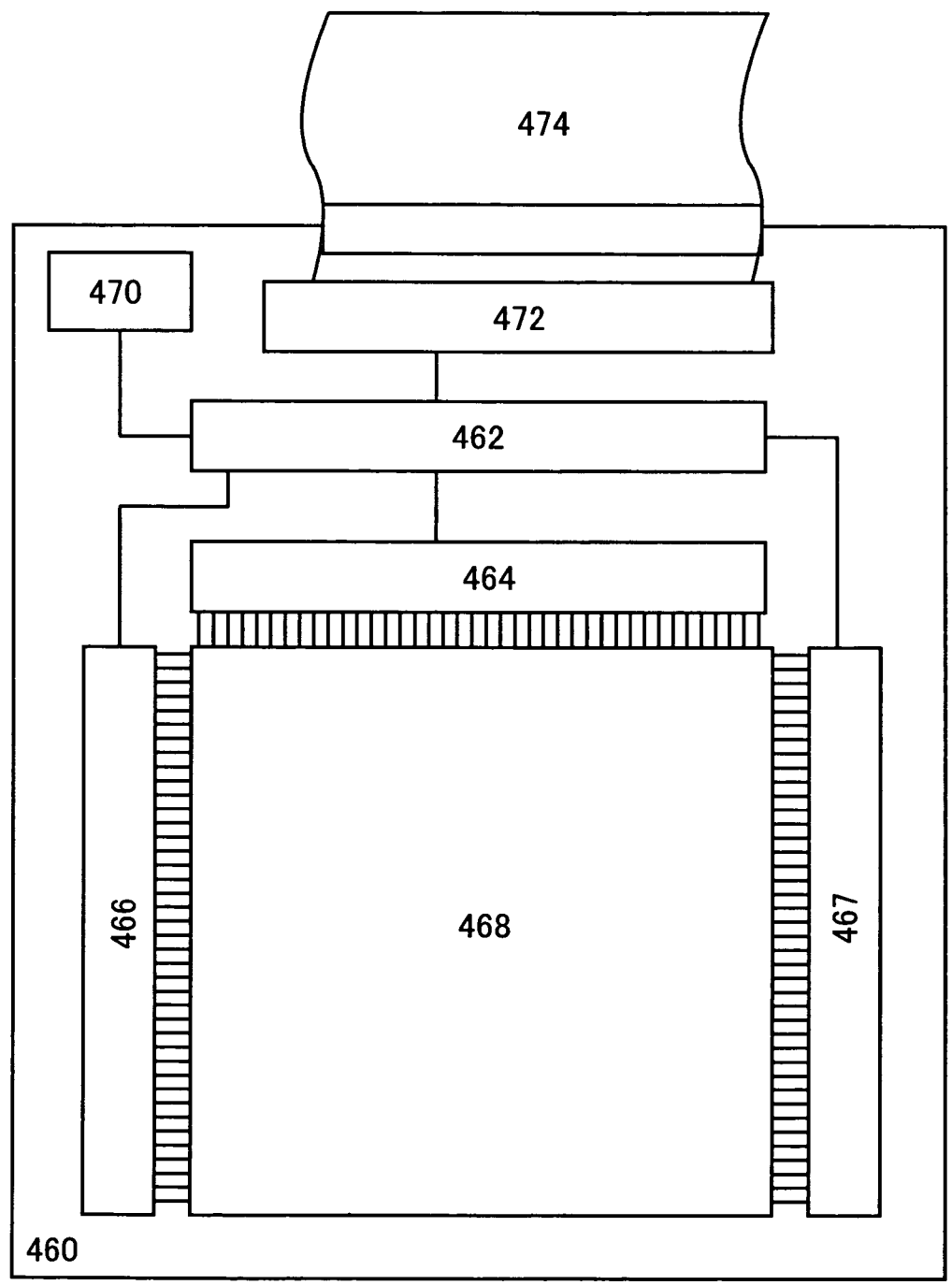
FIG. 26 is a diagram showing an example of a display device using the present invention.

Next, with reference to FIG. 26, an example of a display device with the use of a light-emitting element by a control circuit is shown.

A display device includes a control circuit 462, a source signal line driver circuit 464, gate signal line driver circuits 466 and 467, a display portion 468, a memory 470, an FPC 474, and a connector 472. Each circuit of the display device is formed over a panel 460, or is attached externally.

Data and control signals sent from the FPC 474 through the connector 472 are inputted into the control circuit 462 and the data is rearranged for outputting in the memory 470, and then is sent to the control circuit 462 again. The control circuit 462 sends data and signals used for displaying to the source signal line driver circuit 464 and the gate signal line driver circuits 466 and 467, and then an image is displayed at the display portion 468 using light-emitting elements.

The source signal line driver circuit 464 and the gate signal line driver circuits 466 and 467 can be substituted for known circuits. Furthermore, the number of the gate signal line driver circuits can be reduced to one depending on the circuit structure.

Figure 27:
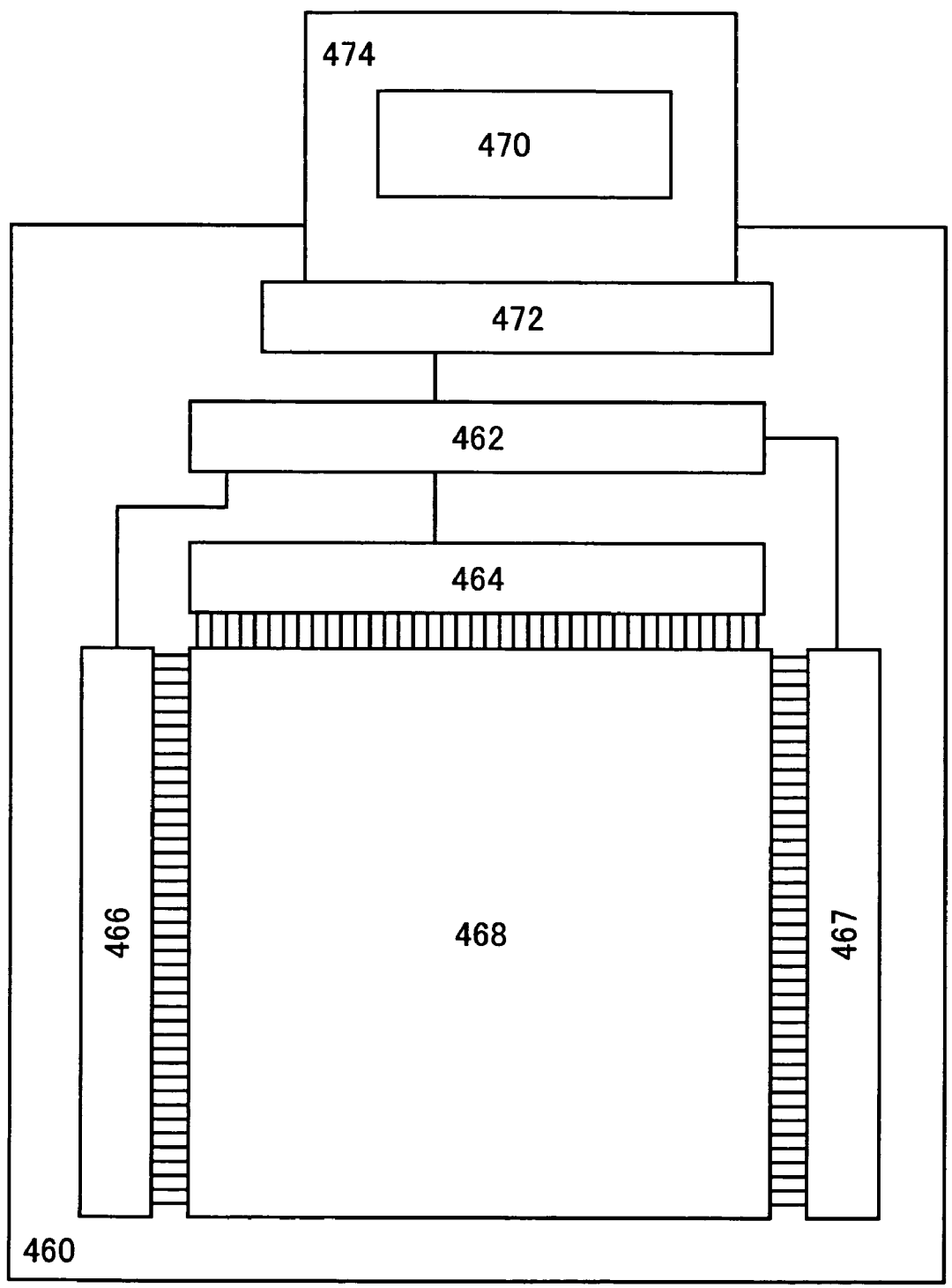
FIG. 27 is a diagram showing an example of a display device using the present invention.

Next, with reference to FIG. 27, another example of a display device with the use of a light-emitting element by a control circuit is shown.

A display device includes the control circuit 462, the source signal line driver circuit 464, the gate signal line driver circuits 466 and 467, the display portion 468, the memory 470, and the connector 472 including the FPC 474. Each circuit of the display device is formed on the panel 460, or is attached externally.

Operations of the display device are now described. Data and control signals sent from the FPC 474 through the connector 472 are inputted into the control circuit 462 and the data is returned to the memory 470 in the FPC 474, and then is rearranged for outputting and sent to the control circuit 462 again. The control circuit 462 sends data and signals used for displaying to the source signal line driver circuit 464 and the gate signal line driver circuits 466 and 467, and then an image is displayed at the display portion 468 using light-emitting elements.

Note that the source signal line driver circuit 464 and the gate signal line driver circuits 466 and 467 can be substituted for known circuits. Furthermore, the number of the gate signal line driver circuits can be reduced to one depending on the circuit structure.

The memory 470 is incorporated in the FPC 474 as shown in FIG. 27, so that the display device can be made smaller.

Next, an example of a structure of a control circuit for outputting to a display using light-emitting elements having another structure is described with reference to FIG. 28.

Time gray scale display naturally has a higher operating frequency as compared with analog display. At least one subframe is required to be added for increasing the number of gray scales by 1 bit, and 8 or more subframes are required for obtaining an 8-bit gray scale. Further, in order to perform a gamma correction so as to obtain a natural image by increasing the number of gray scales of a dark space, the number of subframes is needed to be increased further, and 10 or more subframes are required in some cases. Therefore, the operating frequency also needs to be decupled or more.

In order to drive the device with such an operating frequency, an SRAM to be used needs a high-speed operation, and an SRAM-IC for a high-speed operation needs to be used.

SRAM for a high-speed operation; however, consumes a large amount of power in storing, so that it is not appropriate for mobile devices. In addition, in order to use a low-power-consumption SRAM, a frequency needs to decrease more.

Figure 28:
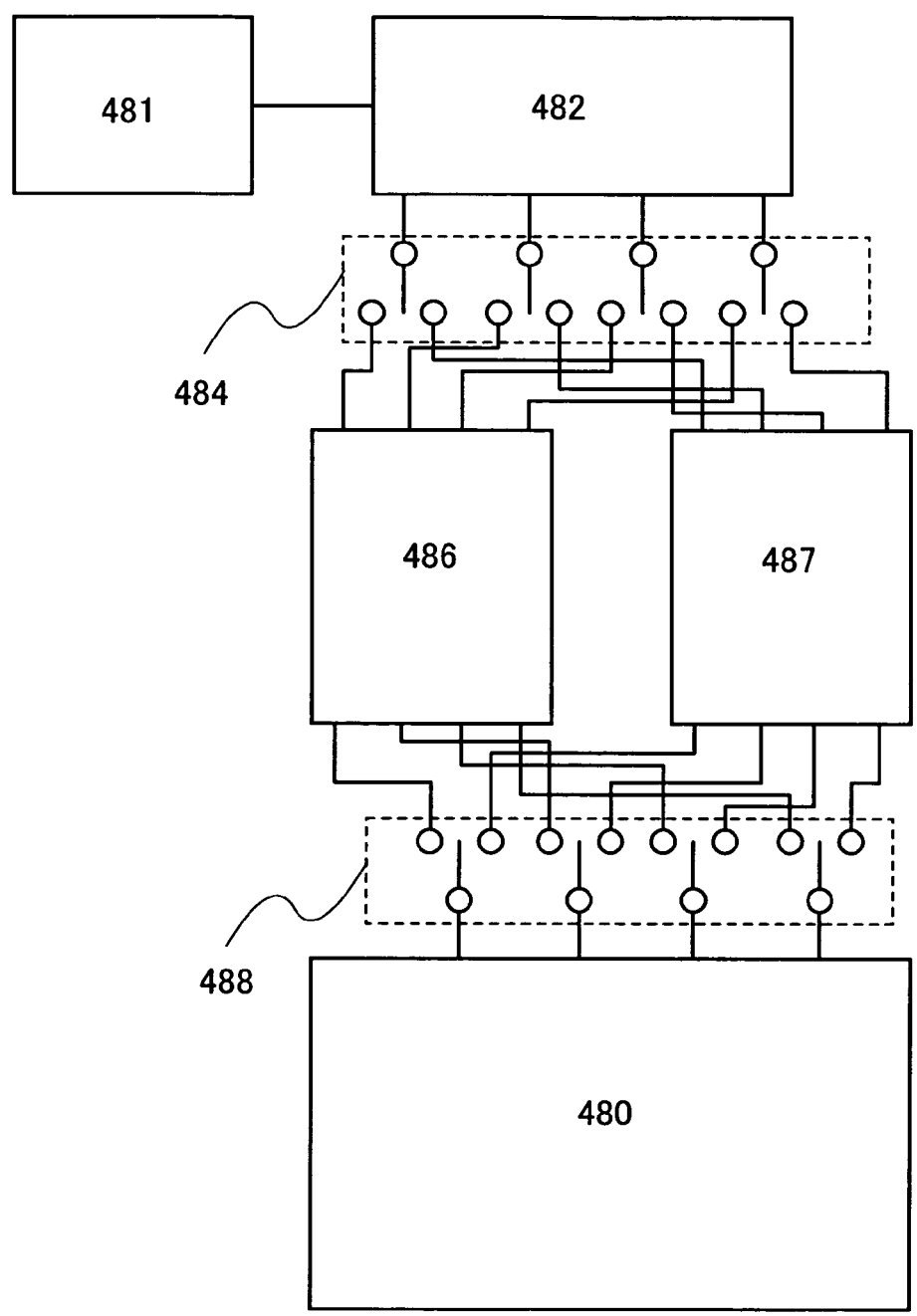
FIG. 28 is a diagram showing an example of a display device using the present invention.

As shown in FIG. 28, digital video signals 481 are converted from serial to parallel by using a serial-parallel conversion circuit 482 before writing the digital video signals 481 to SRAMs (1) 486 and (2) 487. Then, writing is performed to a display 480 through switches 484 and 488.

By taking such a measure, parallel calling can be made with a low frequency. Hence, a low-power-consumption SRAM can be used with a low frequency to achieve low power consumption of mobile devices.

Embodiment Mode 5

Figure 29:
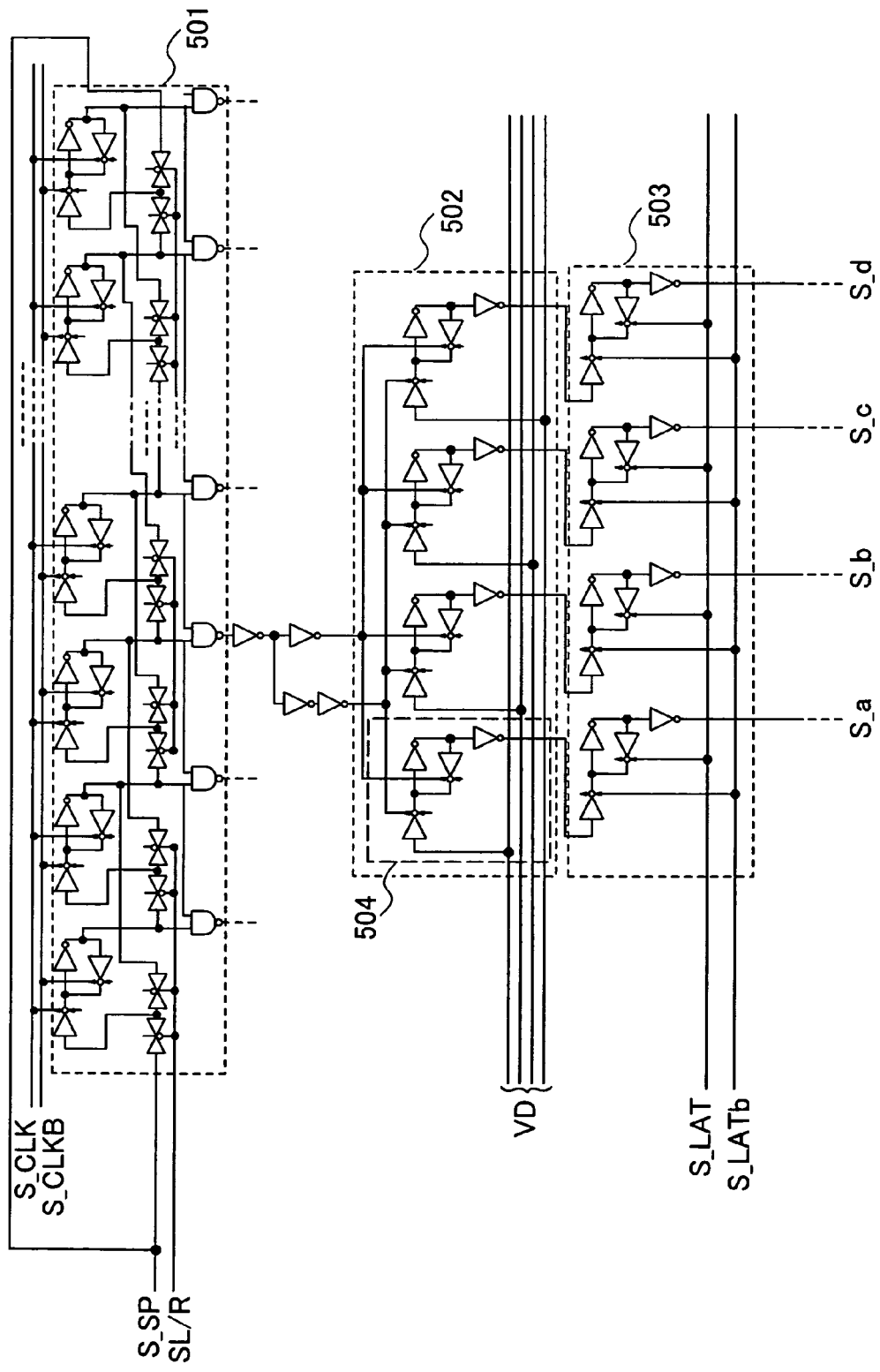
FIG. 29 is a diagram showing a structure of a source signal line driver circuit of a display device of the present invention.

In this embodiment mode, described is a structure example of the source signal line driver circuit of the display device of the present invention. The structure example of the source signal line driver circuit is shown in FIG. 29.

The source signal line driver circuit includes a shift register 501, a scanning direction switching circuit, a LAT (A) 502, and a LAT (B) 503. In FIG. 29, although only a part of the LAT (A) 502 and a part of the LAT (B) 503 which are corresponding to one of outputs from the shift register 501 are illustrated, the LAT (A) 502 and the LAT (B) 503 having the respective same structures correspond to each output from the shift register 501.

The shift register 501 includes a clocked inverter, an inverter, and a NAND circuit. A start pulse S_SP for a source signal line driver circuit is inputted into the shift register 501. By changing the state of the clocked inverter between a conductive state and a non-conductive state in accordance with a clock pulse S_CLK for a source signal line driver circuit and an inverted clock pulse S_CLKB for a source signal line driver circuit that is a signal of which polarity is inverted from that of the clock pulse S_CLK, a sampling pulse is outputted sequentially from the NAND circuit to the LAT (A) 502.

In addition, the scanning direction switching circuit includes a switch, and functions to switch the scanning direction of the shift register 501 between left and right directions. In FIG. 29, the shift register 501 outputs the sampling pulse sequentially from the left to the right in the case where a scanning direction switching signal L/R corresponds to a Lo signal. On the other hand, in the case where the scanning direction switching signal L/R corresponds to an H level signal, the sampling pulse is outputted sequentially from the right to the left.

Each stage of the LAT (A) 502 includes a clocked inverter and a latch circuit 504 by an inverter. Here, "each stage of the LAT (A) 502" means a LAT (A) 502 for taking in an image signal to be inputted into one source signal line.

The digital video signal VD outputted from the signal controlling circuit is inputted by being divided into p (where p is a natural number). That is, signals corresponding to respective outputs to p source signal lines are inputted in parallel. When a sampling pulse is inputted at the same time to the clocked inverters of p stages of the LAT (A) 502 through buffers, the respective inputted signals after being divided into p are sampled at the same time in the p stages of the LAT (A) 502.

In this embodiment mode, a source signal line driver circuit for outputting a signal voltage to x source signal lines is described as an example; therefore, x/p sampling pulses are outputted sequentially from the shift register per horizontal period. In accordance with each sampling pulse, the p stages of the LAT (A) 502 sample respective digital video signals which correspond to outputs to the p source signal lines, at the same time.

In this specification, a method in which a digital video signal inputted into the source signal line driver circuit is divided into p-phase parallel signals and the p digital video signals are taken in at the same time by using one sampling pulse, is called a p-division drive. A 4-division drive is performed in FIG. 29.

By performing the above-described division drive, there can be a margin on the sampling of the shift register in the source signal line driver circuit. Reliability of the display device can thus be increased.

When all of the signals for one horizontal period are inputted into the respective stages of the LAT (A) 502, a latch pulse LS and an inverted latch pulse LSB of which polarity is inverted from that of the latch pulse LS are inputted, and the respective signals inputted into the stages of the LAT (A) 502 are all outputted to respective stages of the LAT (B) 503.

Note that "each stage of the LAT (B) 503" means a LAT (B) 503 into which the signal from each stage of the LAT (A) 502 is inputted.

Each stage of the LAT (B) 503 includes a clocked inverter and an inverter. The respective signals outputted from the stages of the LAT (A) 502 are stored in the LAT (B) 503, and are outputted to source signal lines S1 to Sx at the same time. Note that a level shifter, a buffer, or the like may be arbitrarily provided although not shown here.

The start pulse S_SP, the clock pulse S_CLK, or the like to be inputted into the shift register 501, the LAT (A) 502, and the LAT (B) 503, are inputted from the display controller described in Embodiment Mode of the present invention.

In this embodiment mode, an operation of inputting a digital video signal with a small number of bits to the LAT (A) of the source signal line driver circuit is performed by the signal controlling circuit. Meanwhile, an operation of reducing the frequency of the clock pulse S_CLK, the start pulse S_SP, or the like to be inputted into the shift register of the source signal line driver circuit and decreasing a driving voltage of operating the source signal line driver circuit is performed by the display controller.

In this manner, an operation of sampling the digital video signal by the source signal line driver circuit is reduced in the second display mode, so that the power consumption of the display device can be suppressed.

The display device of this embodiment mode can freely adopt a source signal line driver circuit having a known structure, as well as the source signal line driver circuit having the structure of this embodiment mode. In addition, depending on the structure of the source signal line driver circuit, the number of signal lines to be inputted into the source signal line driver circuit from the display controller and the number of power supply lines of a driving voltage are changed.

This embodiment mode can be implemented freely combined with Embodiment Modes 1 to 4.

Embodiment Mode 6

In this embodiment mode, described is a structure example of the gate signal line driver circuit of the display device of the present invention.

The gate signal line driver circuit includes a shift register, a scanning direction switching circuit, or the like. Note that a level shifter, a buffer, or the like may be arbitrarily provided although not shown here.

A start pulse G_SP, a clock pulse G_CLK, a driving voltage, or the like is inputted into the shift register, and a gate signal line selection signal is outputted.

A structure of the gate signal line driver circuit is described with reference to FIG. 30. A shift register 505 includes clocked inverters 506 and 507, an inverter 508, and a NAND circuit 511. The start pulse G_SP is inputted into the shift register 505. By changing the state of the clocked inverters 506 and 507 between a conductive state and a non-conductive state in accordance with the clock pulse G_CLK and an inverted clock pulse G_CLKB which is a signal of which polarity is inverted from that of the clock pulse G_CLK, sampling pulses are outputted sequentially from the NAND circuit 511.

In addition, the scanning direction switching circuit includes a switch 509 and a switch 510, and functions to switch the scanning direction of the shift register between left and right directions. In FIG. 30, the shift register outputs the sampling pulse sequentially from the left to the right in the case where a scanning direction switching signal U/D corresponds to an Lo signal. On the other hand, in the case where the scanning direction switching signal U/D corresponds to at H level, the sampling pulse is outputted sequentially from the right to the left.

The sampling pulse outputted from the shift register is inputted into a NOR circuit 512, and operation is performed with an enable signal ENB. This operation is performed in order to prevent a condition in which adjacent gate signal lines are selected at the same time due to dullness of the sampling pulses. A signal outputted from the NOR circuit 512 is outputted to each of gate signal lines G1 to Gy, through buffers 513 and 514. Note that a level shifter, a buffer, or the like may be arbitrarily provided although not shown here.

The start pulse G_SP, the clock pulse G_CLK, the driving voltage, or the like to be inputted into the shift register are inputted from the display controller described in Embodiment Mode.

Figure 30:
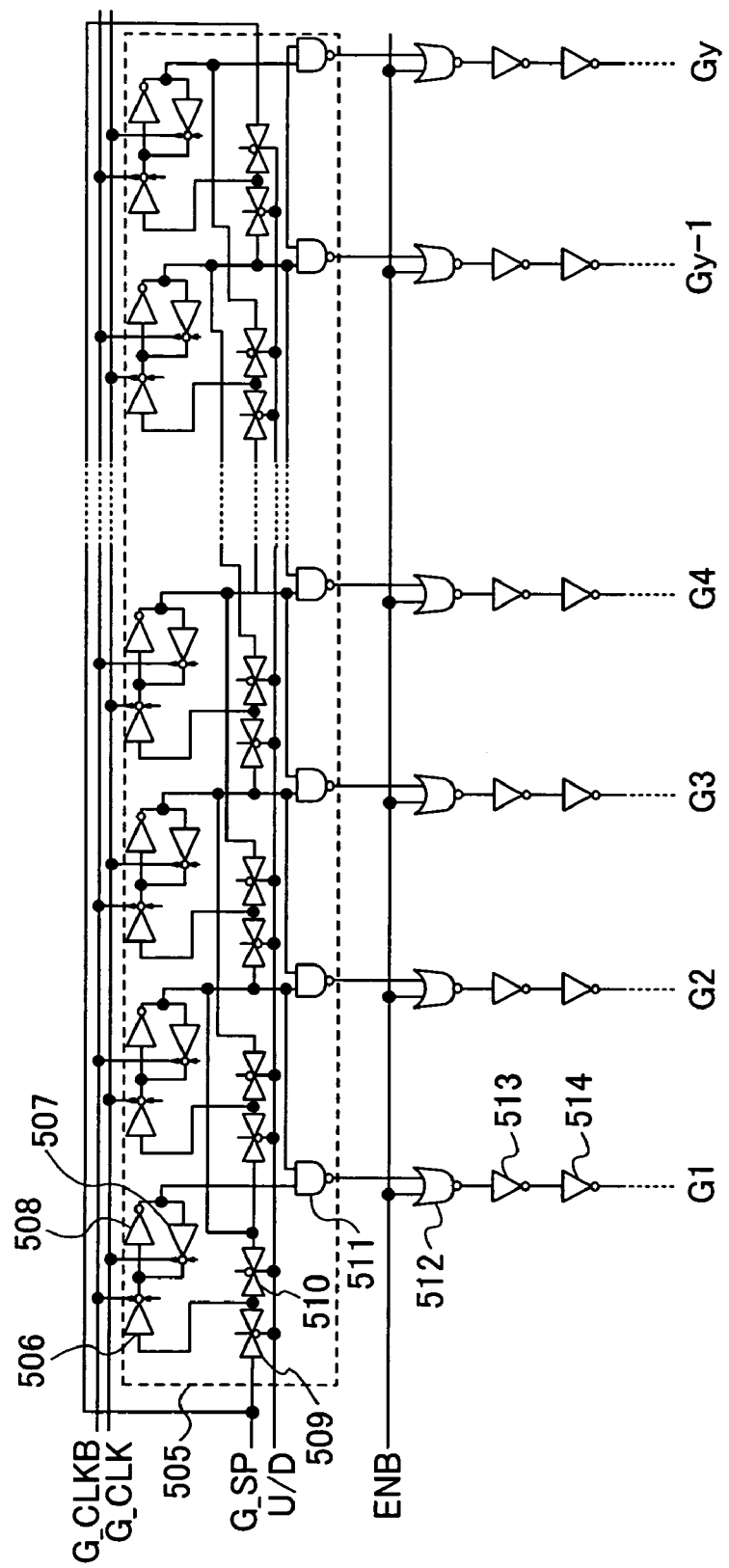
FIG. 30 is a diagram showing a structure of a gate signal line driver circuit of a display device of the present invention.

Note that the display device of this embodiment mode can freely adopt a gate signal line driver circuit having a known structure, as well as the gate signal line driver circuit having the structure shown in FIG. 30. Depending on the structure of the gate signal line driver circuit, the number of signal lines to be inputted into the gate signal line driver circuit from the display controller and the number of power supply lines of a driving voltage are changed.

This embodiment mode can be implemented freely combined with Embodiment Modes 1 to 5.

Embodiment Mode 7

As for the display device using the time gray scale method, in addition to a method in which an address period and a lighting period are separated which is described hereinabove, a driving method of simultaneously performing writing and display has been proposed. For example, it has been disclosed in Japanese Patent Laid-Open No. 2001-343933. According to this method, in addition to the conventional selecting TFT and driving TFT, an erasing TFT is provided so that the number of gray scales can be increased.

Specifically, a plurality of gate signal line drive circuits are provided, writing is performed by a first gate signal line drive circuit, and erasing is performed by a second gate signal line drive circuit before wiring is completed for all lines. In the case of about 4 bits, this does not affect so much; however, in the case where the number of gray scales is 6 bits or more or in the case where it is necessary to increase the number of subframes for a measure against pseudo contour, this is a very effective measure. The present invention can also be applied to a display device using such a driving method.

Figure 31:
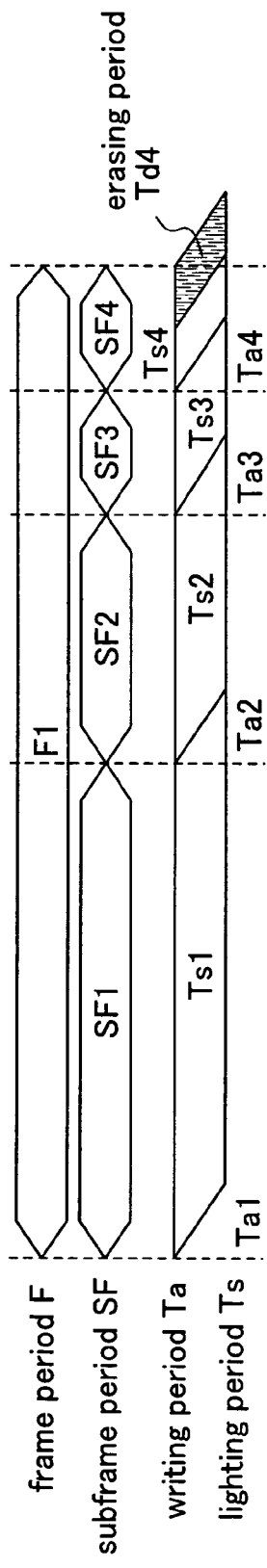
FIG. 31 is a diagram showing a timing chart which shows a driving method of a display device of the present invention.

FIG. 31 is a timing chart in a case where a 4-bit gray scale display is performed. In FIG. 31, erasing is performed by the second gate signal line driver circuit at the fourth bit to shorten a lighting period.

Figure 32:
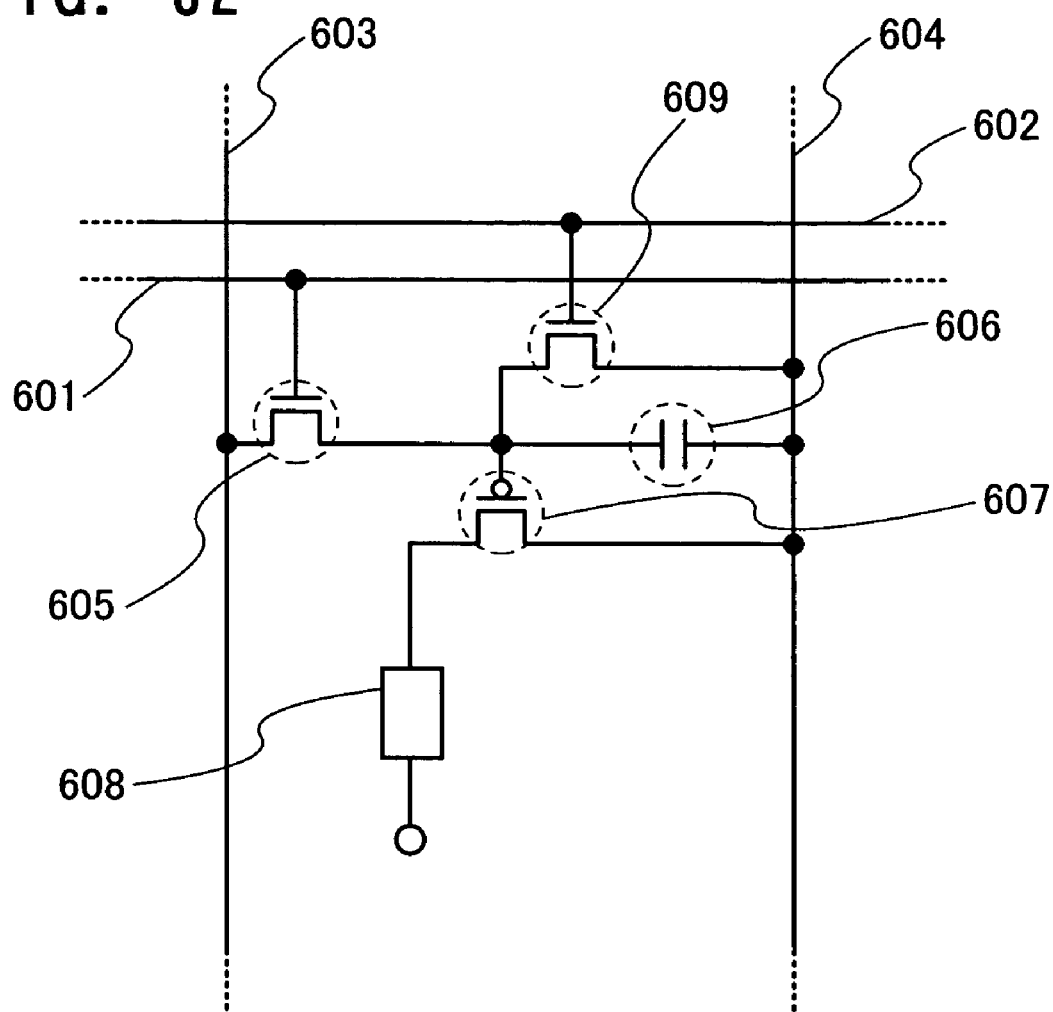
FIG. 32 is a diagram showing a pixel structure of a display device of the present invention.
Figure 33:
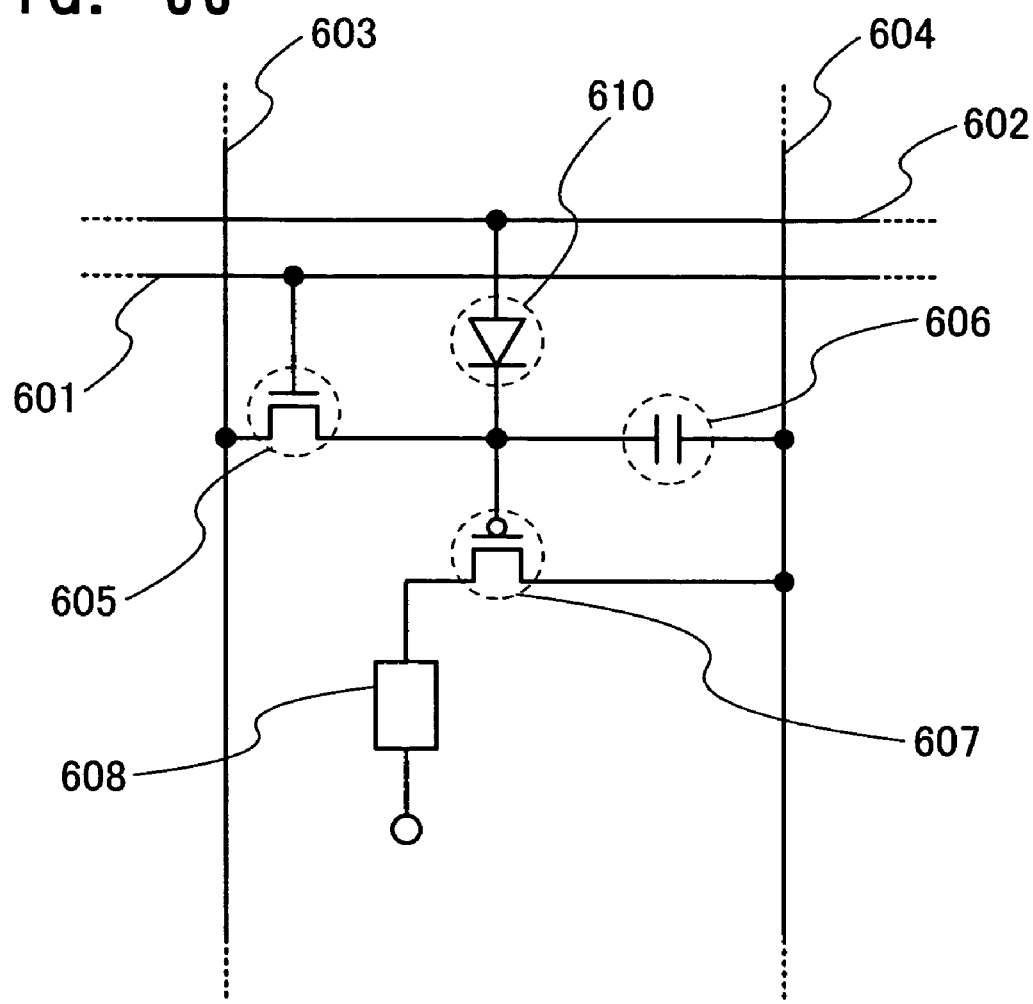
FIG. 33 is a diagram showing a pixel structure of a display device of the present invention.
Figure 34:
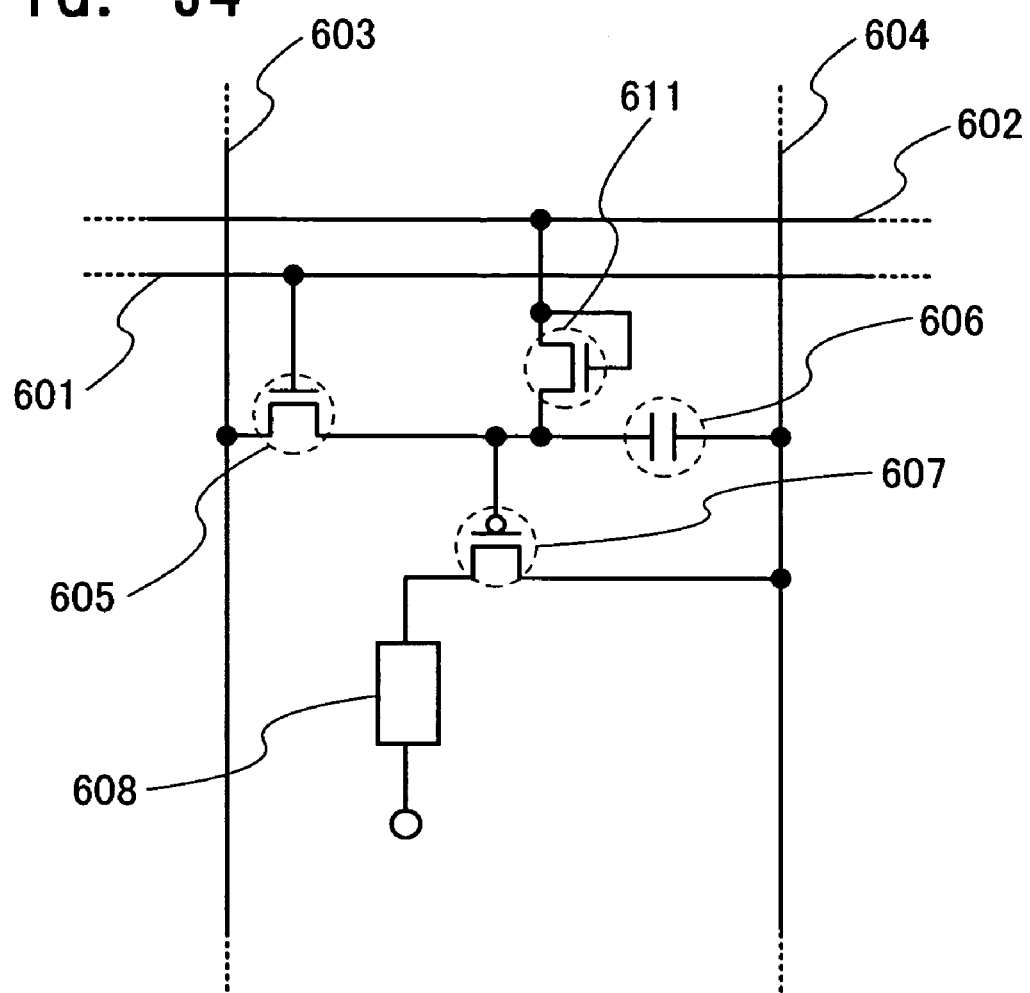
FIG. 34 is a diagram showing a pixel structure of a display device of the present invention.

Examples of a pixel structure for realizing this driving method are shown in FIG. 32, FIG. 33, and FIG. 34. FIG. 32 shows an example in which an erasing TFT is provided. When writing a signal, a potential of a first gate signal line 601 is made higher; therefore, the first gate signal line 601 is selected, a selecting TFT 605 is turned on, and a signal is inputted from a source signal line 603 to a storage capacitor 606. Then, in accordance with the signal, a current of a driving TFT 607 is controlled and from a power supply line 604, a current flows to a light-emitting element 608.

When erasing a signal, a potential of a second gate signal line 602 is made higher; therefore, the second gate signal line 602 is selected, an erasing TFT 609 is turned on, and the driving TFT 607 is turned off. Then, a current is prevented from flowing from the power supply line 604 to the light-emitting element 608. Accordingly, a non-lighting period can be formed so that the length of a lighting period can freely be controlled.

In FIG. 32, although the erasing TFT 609 is used, another method can also be used. This is because a non-lighting period may forcibly be formed by preventing a current from being supplied to the light-emitting element 608. Accordingly, a non-lighting period may be formed by arranging a switch somewhere in a path where a current flows from the power supply line 604 to the light-emitting element 608 and controlling on/off of the switch. Alternatively, a gate-source voltage of the driving TFT 607 may be controlled to forcibly turn the driving TFT 607 off.

FIG. 33 shows an example in the case where a driving TFT is forcibly turned off. The selecting TFT 605, the driving TFT 607, an erasing diode 610, and the light-emitting element 608 are arranged. A source of the selecting TFT 605 and a drain thereof are connected to the source signal line 603 and a gate of the driving TFT 607. A gate of the selecting TFT 605 is connected to the first gate signal line 601. A source of the driving TFT 607 and a drain thereof are connected to the power supply line 604 and the light-emitting element 608. The erasing diode 610 is connected to the gate of the driving TFT 607 and the second gate signal line 602.

The storage capacitor 606 has a function to store a gate potential of the driving TFT 607. Accordingly, it is connected between the gate of the driving TFT 607 and the power supply line 604; however, the present invention is not limited to this. It may be arranged so as to store the gate potential of the driving TFT 607. In addition, in a case where the gate potential of the driving TFT 607 can be stored by using gate capacitor of the driving TFT 607 or the like, the storage capacitor 606 may be omitted.

As an operation method, when a potential of the first gate signal line 601 is made higher, the first gate signal line 601 is selected, the selecting TFT 605 is turned on, and a signal is inputted from the source signal line 603 to the storage capacitor 606. Then, in accordance with the signal, a current of the driving TFT 607 is controlled and a current flows from the power supply line 604 to the light-emitting element 608.

When erasing a signal, a potential of the second gate signal line 602 is made higher; therefore, the second gate signal line 602 is selected, the erasing diode 610 is turned on, and a current is made to flow from the second gate signal line 602 to a gate of the driving TFT 607. Accordingly, the driving TFT 607 is turned off. Then, a current is prevented from flowing from the power supply line 604 to the light-emitting element 608. Accordingly, a non-lighting period can be formed so that the length of a lighting period can freely be controlled.

When storing a signal, the second gate signal line 602 is not selected. Then, the erasing diode 610 is turned off so that the gate potential of the driving transistor 607 is stored.

The driving TFT 607 may be any element as long as it has a rectifying property. Various rectifying elements such as a PN diode, a PIN diode, a Schottky diode, or a zener diode can be used.

In addition, the erasing diode may be a diode-connected transistor (a gate and a drain thereof are connected). FIG. 34 is a circuit diagram in that case. As an erasing diode 611, a diode connected transistor is used. Here, although an N-channel transistor is used, the present invention is not limited to this. A P-channel transistor may also be used.

This embodiment mode can be freely combined with Embodiment Modes 1 to 6.

Embodiment Mode 8

Figure 35:
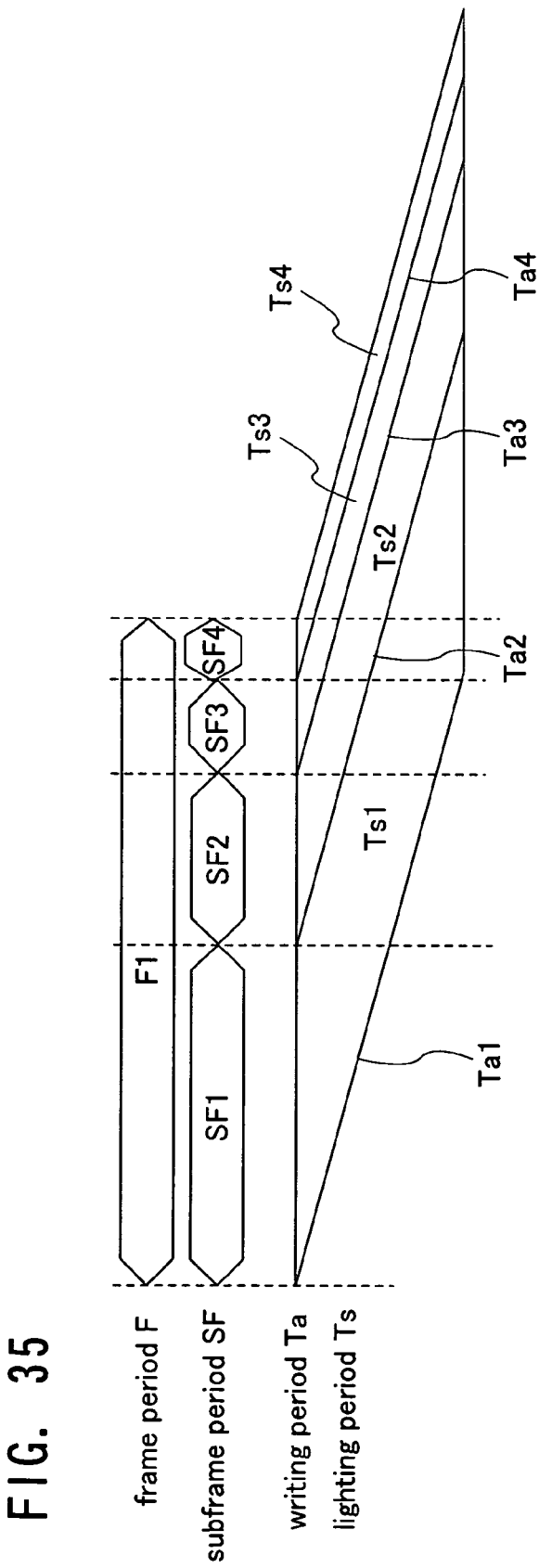
FIG. 35 is a diagram showing a timing chart which shows a driving method of a display device of the present invention.

Further, another method of simultaneously performing an address period and a lighting period similarly to Embodiment Mode 7 is described in this embodiment mode. A timing chart in this case is shown in FIG. 35. A pixel structure is the same as shown in FIG. 11.

Figure 36:
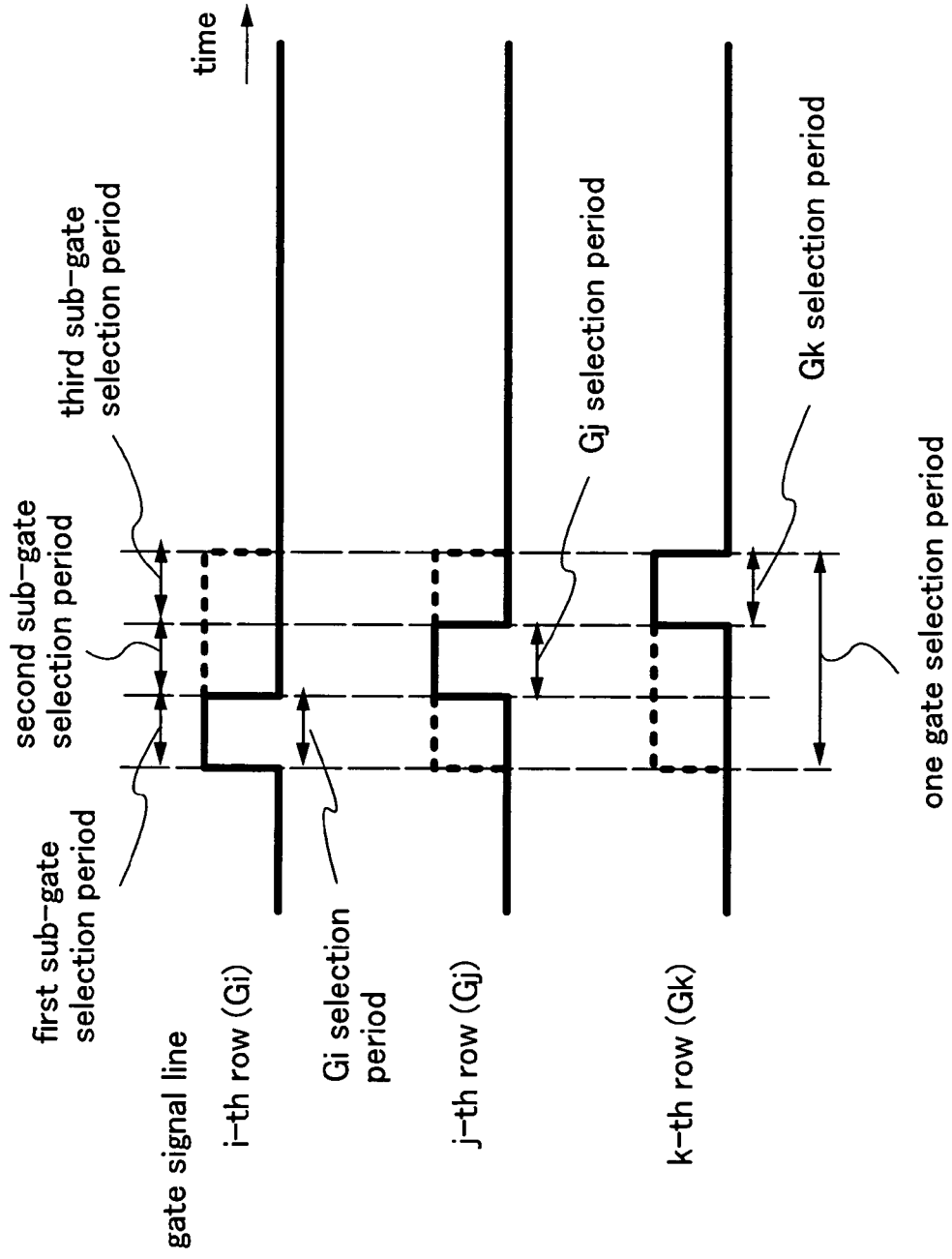
FIG. 36 is a diagram showing a timing chart which shows a driving method of a display device of the present invention.

As shown in FIG. 36, one gate selection period is divided into a plurality of sub-gate selection periods (it is divided into three in the case of FIG. 36). Then, in each sub-gate selection period, a potential of each gate signal line is made high; therefore, each gate signal line is selected and a corresponding signal is inputted into a source signal line. For example, in one gate selection period, the i-th row is selected in a first sub-gate selection period, the j-th row is selected in a second sub-gate selection period, and the k-th row is selected in the third sub-gate selection period. Then, in the next one gate selection period, the (i+1)-th row is selected in the first sub-gate selection period, the (j+1)-th row is selected in the second sub-gate selection period, and the (k+1)-th row is selected in the third sub-gate selection period. According to this, such operation that three rows seem to be selected at the same time in one gate selection period can be realized.

Figure 37:
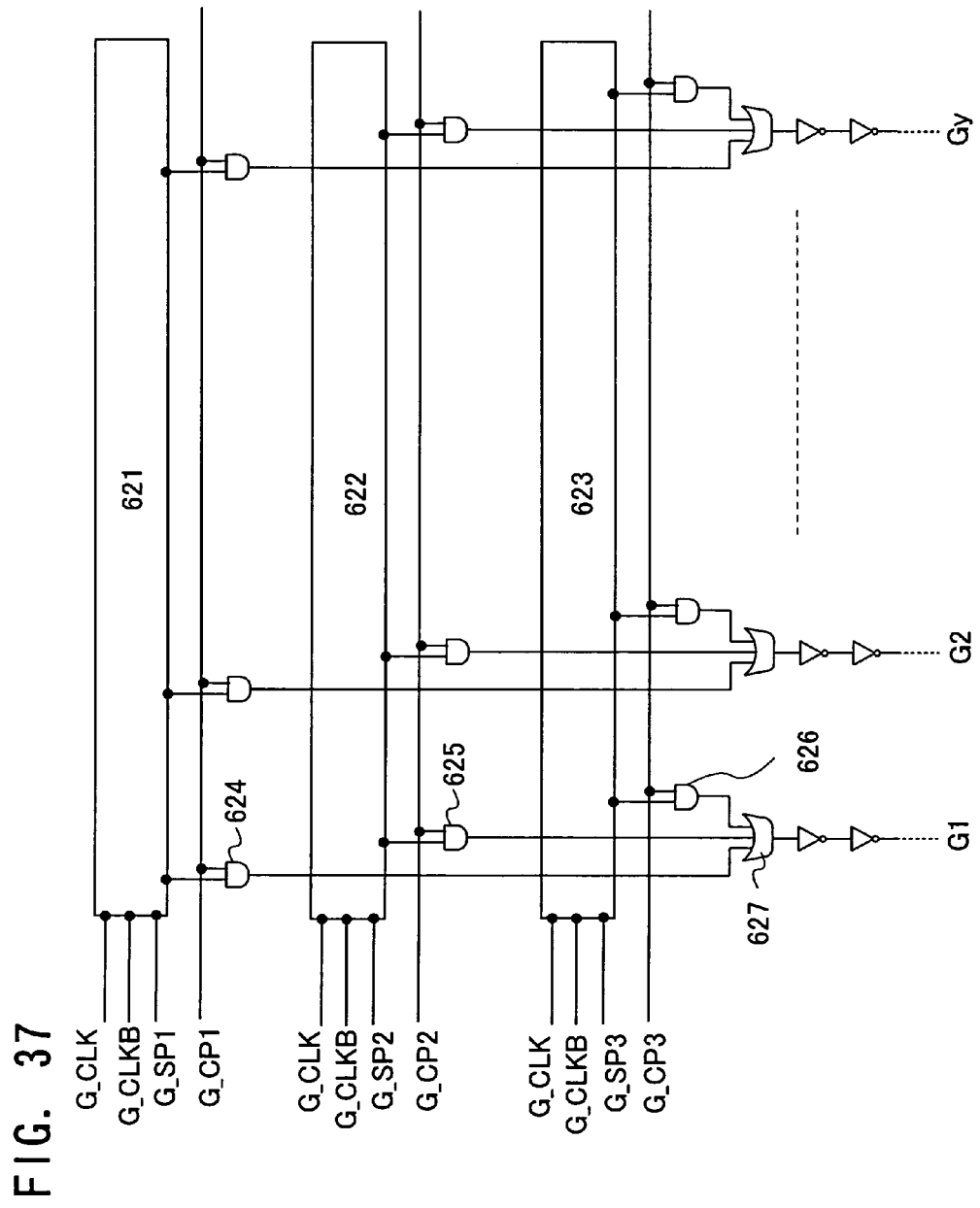
FIG. 37 is a diagram showing a structure of a gate signal line driver circuit of a display device of the present invention.

A structure example of the gate signal line driver circuit when implementing this driving method is shown in FIG. 37. In the case where one gate selection period is divided into three sub-gate selection periods, a first shift register 621, a second shift register 622, and a third shift register 623 are prepared. Note that as for the shift register, for example, the shift register 505 shown in the gate signal line selection circuit (FIG. 30) described in embodiment mode 6 may be used. The first shift register 621, the second shift register 622, and the third shift register 623 are operated by start pulses G_SP1, G_SP2, and G_SP3 respectively and outputs sampling pulses respectively. Next, the respective sampling pulses and signals for dividing one gate selection period G_CP1, G_CP2, and G_CP3 are inputted into AND circuits 624, 625, and 626 respectively so that a logical AND operation is performed. Finally, respective outputs of the AND circuits 624, 625, and 626 are inputted into an OR circuit 627 so that logical OR operation is performed. Then, only in a period during which an output signal of the OR circuit 627 is at H level, the gate signal line is selected.

Figure 38:
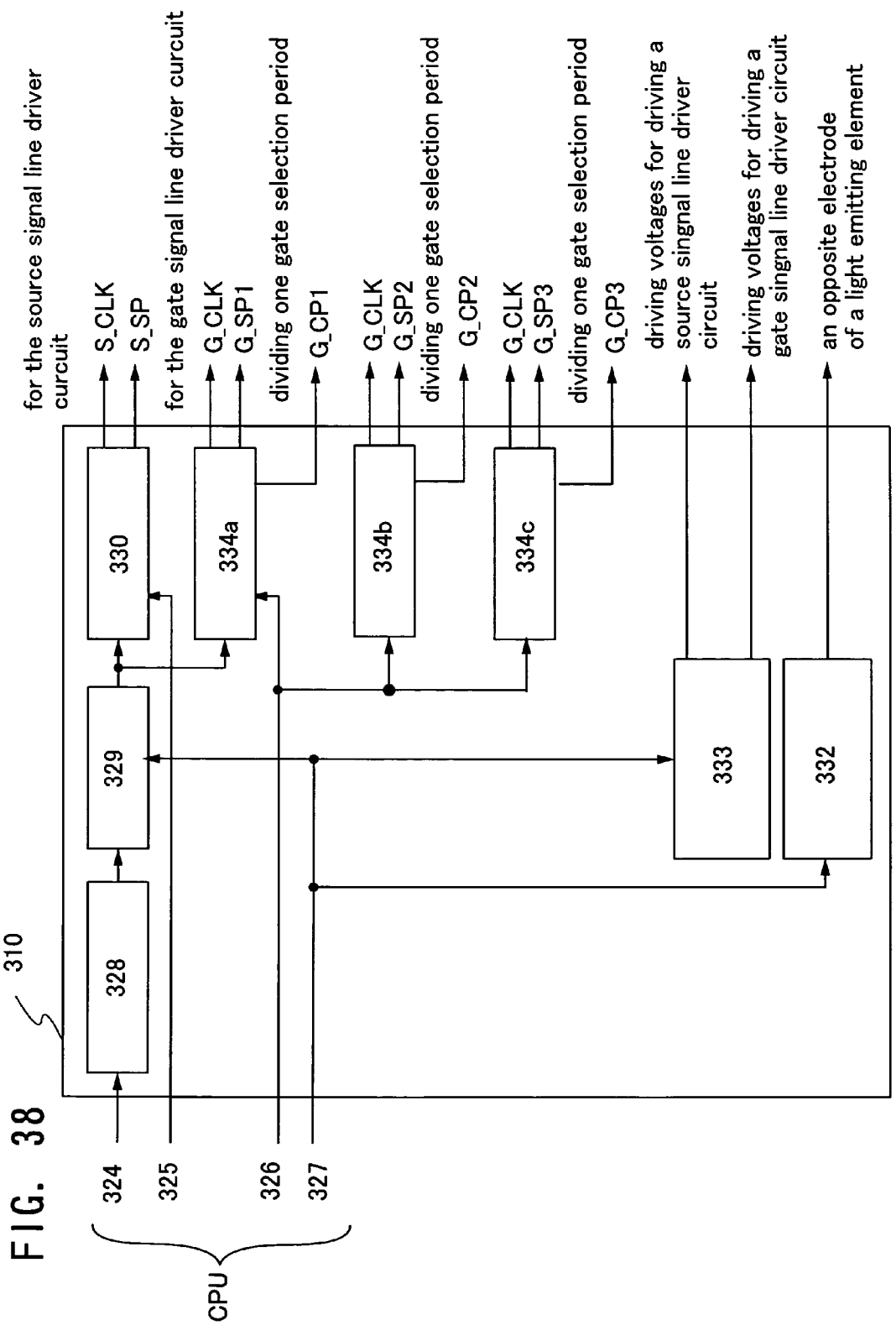
FIG. 38 is a diagram showing a structure of a display controller of a display device of the present invention.

The start pulses G_SP1, G_SP2, and G_SP3 and the signals for dividing one gate selection period G_CP1, G_CP2, and G_CP3 are sent from the display controller. A structure example of the display controller in this embodiment mode is shown in FIG. 38. In the example shown in FIG. 38, vertical clock generating circuits 334*a*, 334*b*, and 334*c* for producing the respective start pulses and the respective signals for dividing one gate selection period for the respective shift registers are provided. According to this, the respective shift registers can be operated independently.

Figure 39:
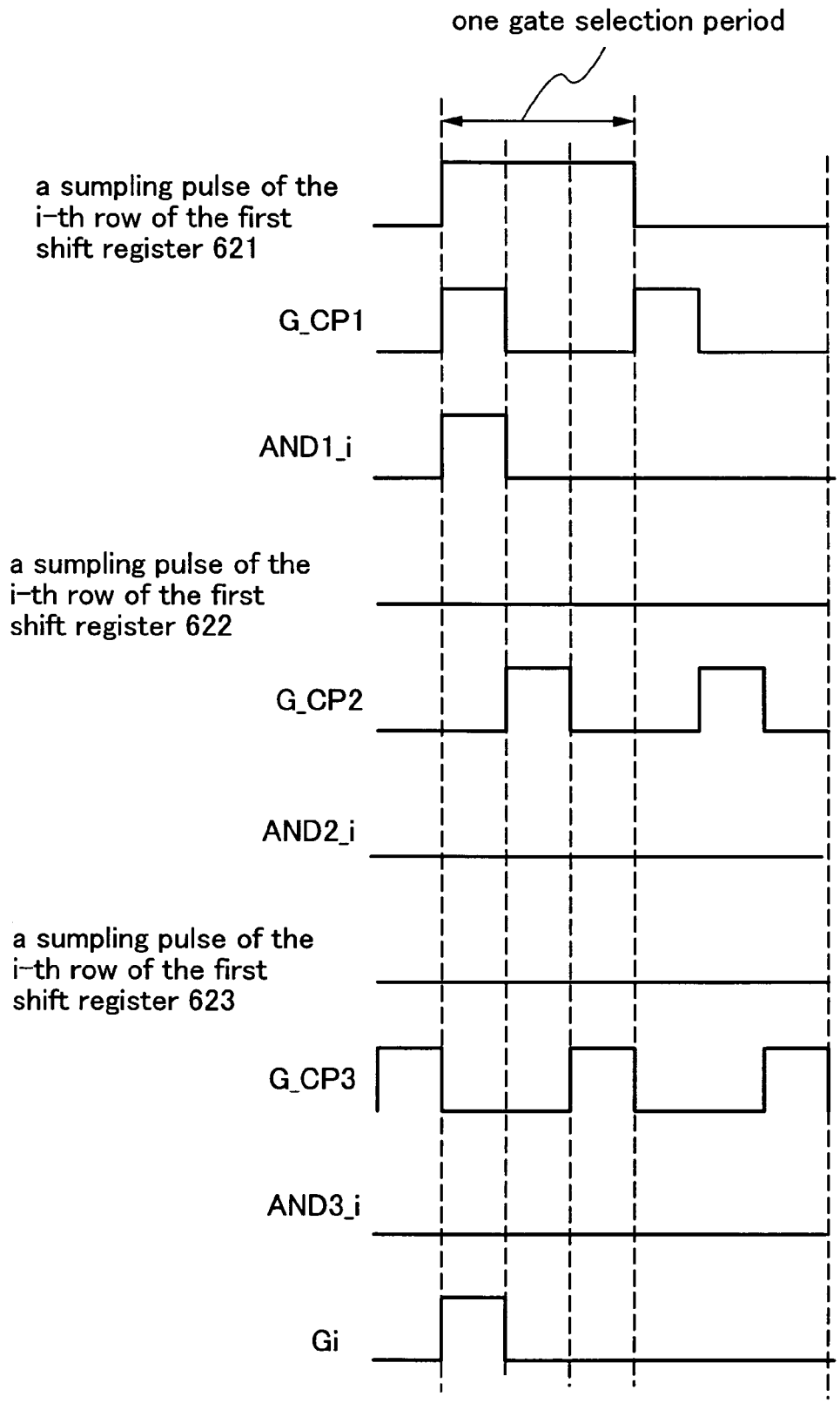
FIG. 39 is a diagram showing a timing chart which shows a driving method of a display device of the present invention.

Next, timing charts of the gate signal line selection circuit of this embodiment mode are shown in FIG. 39. FIG. 39 shows a case of selecting the gate line of the i-th row by using the first shift register 621.

The signal for dividing one gate selection period is a signal of which one cycle is one gate selection period, and the signal for dividing one gate selection period G_CP1 is an H level signal only in the first ⅓ period of one gate selection period and is a Lo signal in the rest ⅔ period of the one gate selection period. Similarly, the signal for dividing one gate selection period G_CP2 is an H level signal only in the middle ⅓ period of one gate selection period and is a Lo signal in the rest ⅔ period of the one gate selection period. The signal for dividing one gate selection period G_CP3 is an H level signal only in the last ⅓ period of one gate selection period and is a Lo signal in the rest ⅔ period of the one gate selection period.

For example, considered is a case where only a sampling pulse of the i-th row of the first shift register 621 is an H level signal. Here, respective output signals of the AND circuits with respect to sampling pulses of the i-th rows of the shift registers and the signals for dividing one gate selection period are denoted by AND1_i, AND2_i, and AND3_i. Since only the sampling pulse of the i-th row of the first shift register 621 is an H level signal, when performing a logical AND operation with the signal for dividing one gate selection period G_CP1, a signal which is at H level only in the first ⅓ period of one gate selection period can be obtained. In addition, since the respective sampling pulses of the i-th rows of the second shift register 622 and the third shift register 623 are Lo signals, when performing logical AND operations with the respective signals for dividing one gate selection period, signals which are Lo during one gate selection period can be obtained. Finally, a logical OR operation of AND1_i, AND2_i, and AND3_i is performed, so that a signal which is at H level only in the first ⅓ period of one gate selection period can be obtained. Therefore, the gate signal line of the i-th row is selected only in the first ⅓ period of the one gate selection period.

Similarly, in a case where only a sampling pulse of the j-th row of the second shift register 622 is an H level signal, by using the signal for dividing one gate selection period G_CP2, the gate signal line of the j-th row only in the middle ⅓ period of one gate selection period can be selected. In addition, for example, in a case where only a sampling pulse of the k-th row of the third shift register 623 is an H level signal, by using the signal for dividing one gate selection period G_CP3, the gate signal line of the k-th row only in the last ⅓ period of one gate selection period can be selected.

Figure 40:
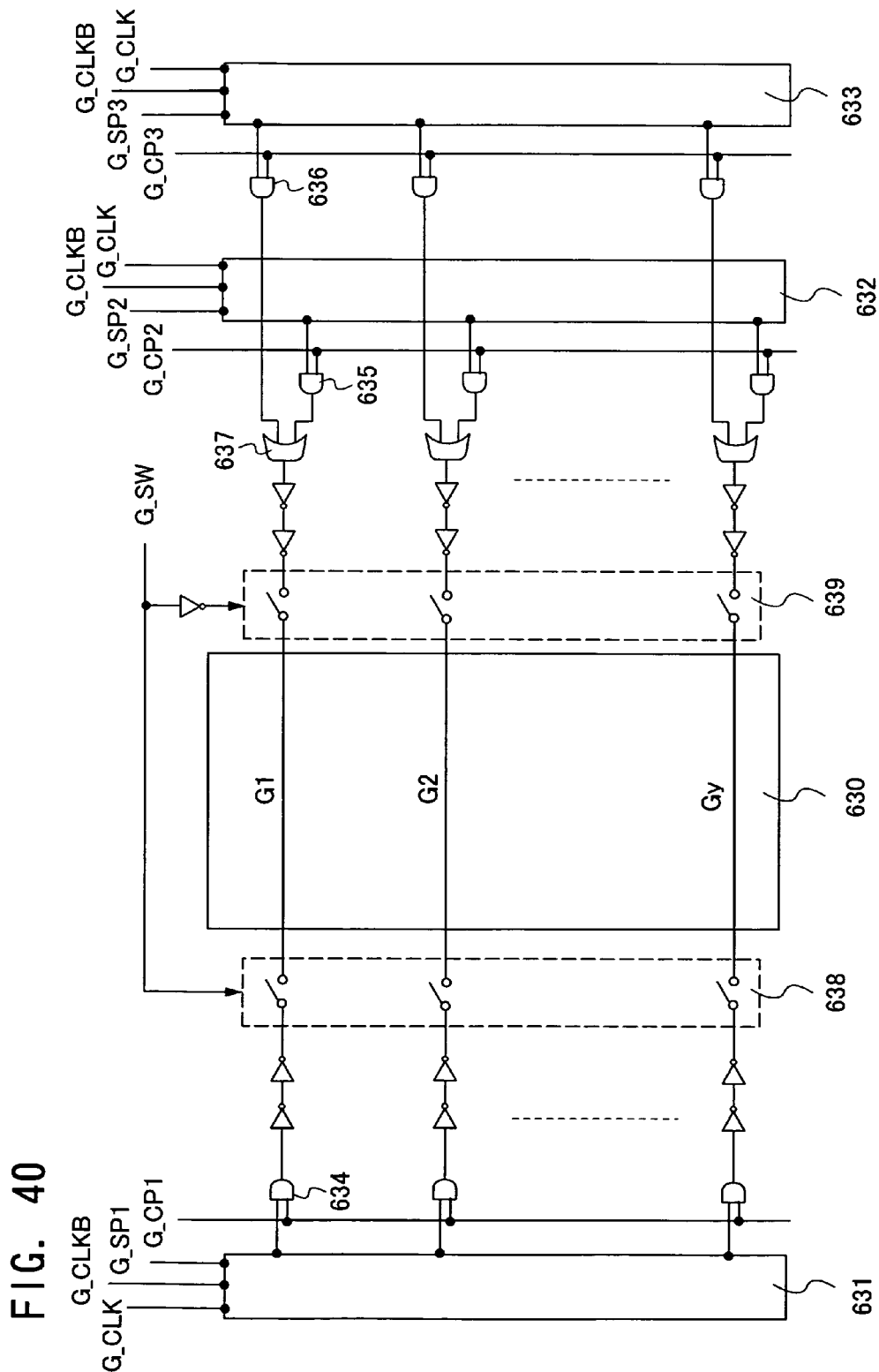
FIG. 40 is a diagram showing a structure of a gate signal line driver circuit of a display device of the present invention.

Another structure example of the gate signal line selection circuit is shown in FIG. 40. In the case where one gate selection period is divided into three sub-gate selection periods, a first shift register 631, a second shift register 632, and a third shift register 633 are prepared, and the first shift register 631 is disposed on one side of a pixel portion 630 and the second shift register 632 and the third shift register 633 are disposed on the other side of the pixel portion 630. The first shift register 631 inputs a sampling pulse which is an output of the shift register 631 and the signal for dividing one gate selection period G_CP1, to an AND circuit 634. Then, only in a period during which an output signal of the AND circuit 634 is at H level, the gate signal line is selected. Meanwhile, the second shift register 632 and the third shift register 633 input sampling pulses which are outputted from the respective shift registers and the signals for dividing one gate selection period G_CP2 and G_CP3, to an AND circuit 635 and an AND circuit 636 respectively, and outputs thereof are inputted into an OR circuit 637. Then, only in a period during which an output signal of the OR circuit 637 is at H level, the gate signal line is selected. Note that switches 638 and 639 are connected in between an output line of the AND circuit 634 and the gate signal line and between an output line of the OR circuit 637 and the gate signal line, respectively. These switches are controlled by a switch controlling signal G_SW sent from the display controller, and turns on the switches connected to the gate signal line where the respective output signals of the AND circuit 634 and the OR circuit 637 are at H levels; therefore, the gate signal line is selected.

A pair of the switches 638 and 639 which are connected to both sides of each gate signal line are controlled so as to operate exclusively. When the gate signal line of the i-th row is selected by using the first shift register 631, the switch 638 is turned on and the switch 639 is turned off of the switches connected to the gate signal line of the i-th row. As a result of this, only an output of the first shift register 631 is inputted into the gate signal line of the i-th row. When the gate signal line of the j-th row is selected by using the second shift register 632, the switch 639 is turned on and the switch 638 is turned off of the switches connected to the gate signal line of the j-th row. As a result of this, only an output of the second shift register 632 is inputted into the gate signal line of the j-th row.

As described above, by using the gate signal line selection circuit of this embodiment mode, gate signal lines of three rows can be selected during one gate selection period.

Note that, in the case where one gate selection period is divided into "a" sub-gate selection periods (where "a" is a natural number equal to or more than 2), "a" stages of shift registers are prepared and a gate signal line selection circuit may include the same manner as this embodiment mode.

Figure 41:
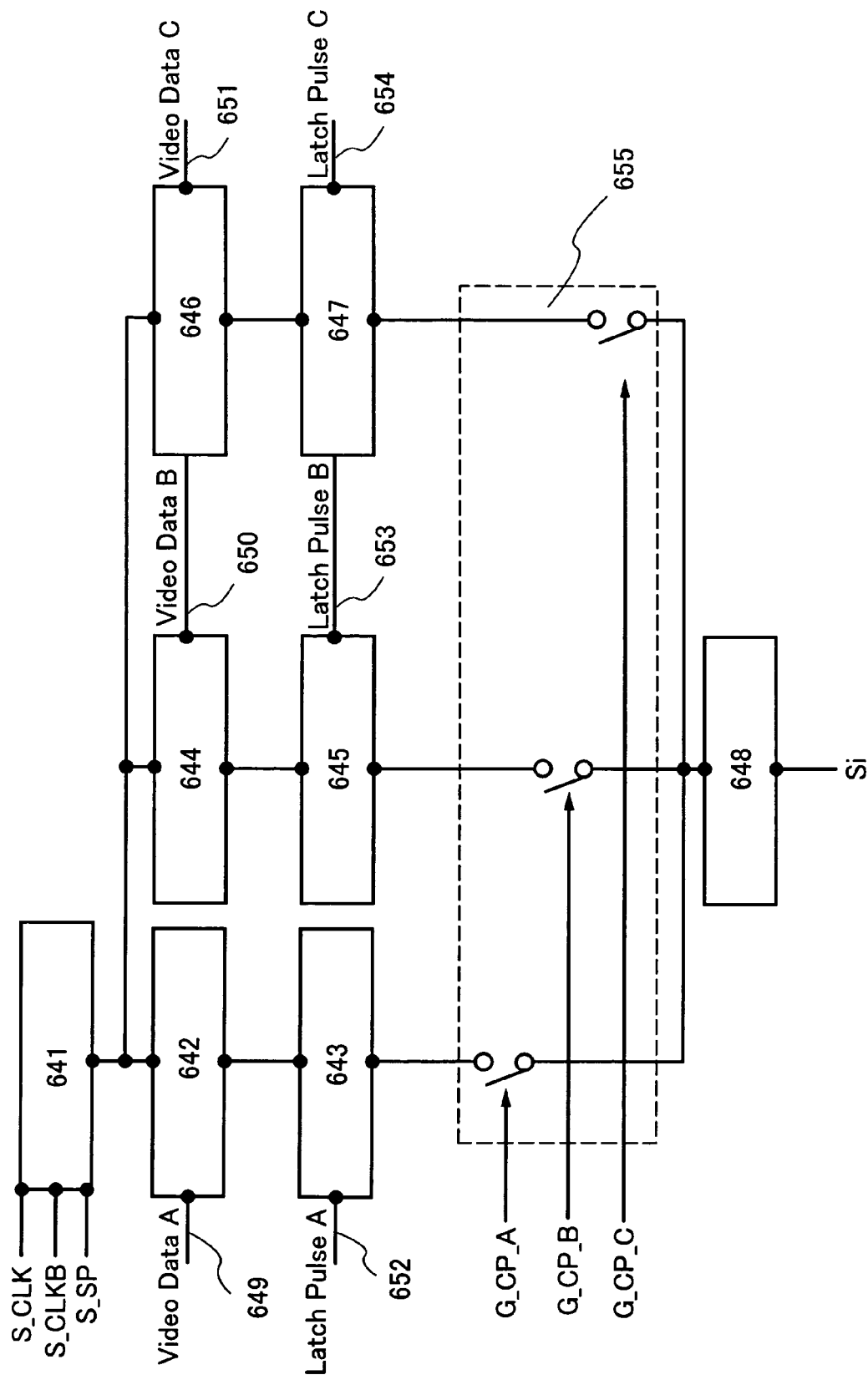
FIG. 41 is a diagram showing a structure of a source signal line driver circuit of a display device of the present invention.

Next, a structure example of the source signal line driver circuit when implementing this driving method is shown in FIG. 41. FIG. 41 illustrates a source signal line driver circuit of the i-th column. In the case where one gate selection period is divided into three sub-gate selection periods, three pairs of a first latch circuit and a second latch circuit are prepared at a subsequent stage of a shift register 641. Each pair of the first latch circuit and the second latch circuit stores a video signal of different rows. For example, a video signal of the i-th row inputted from a video signal line (A) 649 is stored in a first latch circuit (A) 642 and a second latch circuit (A) 643. A video signal of the j-th row inputted from a video signal line (B) 650 is stored in a first latch circuit (B) 644 and a second latch circuit (B) 645. A video signal of the k-th row inputted from a video signal line (C) 651 is stored in a first latch circuit (C) 646 and a second latch circuit (C) 647. A latch control line (A) 652, a latch control line (B) 653, and a latch control line (C) 654 control the second latch circuit (A) 643, the second latch circuit (B) 645, the second latch circuit (C) 647 respectively. Then, a video signal of a row to be inputted into the source signal line of the i-th column is selected by a switching switch 655 and is inputted through a level shifter 648. Note that the operation of the switching switch may be controlled such that a different switch is turned on for each of the three sub-gate selection periods. For example, using the signal for dividing one gate selection period G_CP used in the gate signal line driver circuit shown in FIG. 37, only the video signal of the i-th row which is stored in the first latch circuit (A) 642 and the second latch circuit (A) 643 may be inputted into the source signal line in the first ⅓ period of one gate selection period. Similarly, only the video signal of the j-th row which is stored in the first latch circuit (B) 644 and the second latch circuit (B) 645 may be inputted into the source signal line in the middle ⅓ period of the one gate selection period, and only the video signal of the k-th row which is stored in the first latch circuit (C) 646 and the second latch circuit (C) 647 may be inputted into the source signal line in the last ⅓ period of the one gate selection period.

By using such the source signal line driver circuit, video signals of three rows can be inputted into the source signal line during one gate selection period. By using both the source signal line driver circuit and the gate signal line driver circuit shown in FIG. 37, the driving method can be implemented in which a plurality of gate signal lines are selected during one gate selection period.

By using the above-described driving method, a lighting period of a light-emitting element per frame period can be increased so that luminance can be improved. In addition, the respective frequencies of the clock pulse, the start pulse, or the like inputted into the shift register of each driver circuit (the source signal line driver circuit and the gate signal line driver circuit) can be reduced, and the driving voltage of operating each driver circuit can be decreased. Further, since the circuit structure can be simplified, it can be applied to an inexpensive display device.

Note that as for details of such the driving method, Japanese Patent Laid-Open No. 2001-324958 (United States Patent Application 2001/0022565), or the like has described for example, the content of which can be combined with this application.

Note that this embodiment mode can be freely combined with Embodiment Modes 1 to 8.

Embodiment Mode 9

Figure 42:
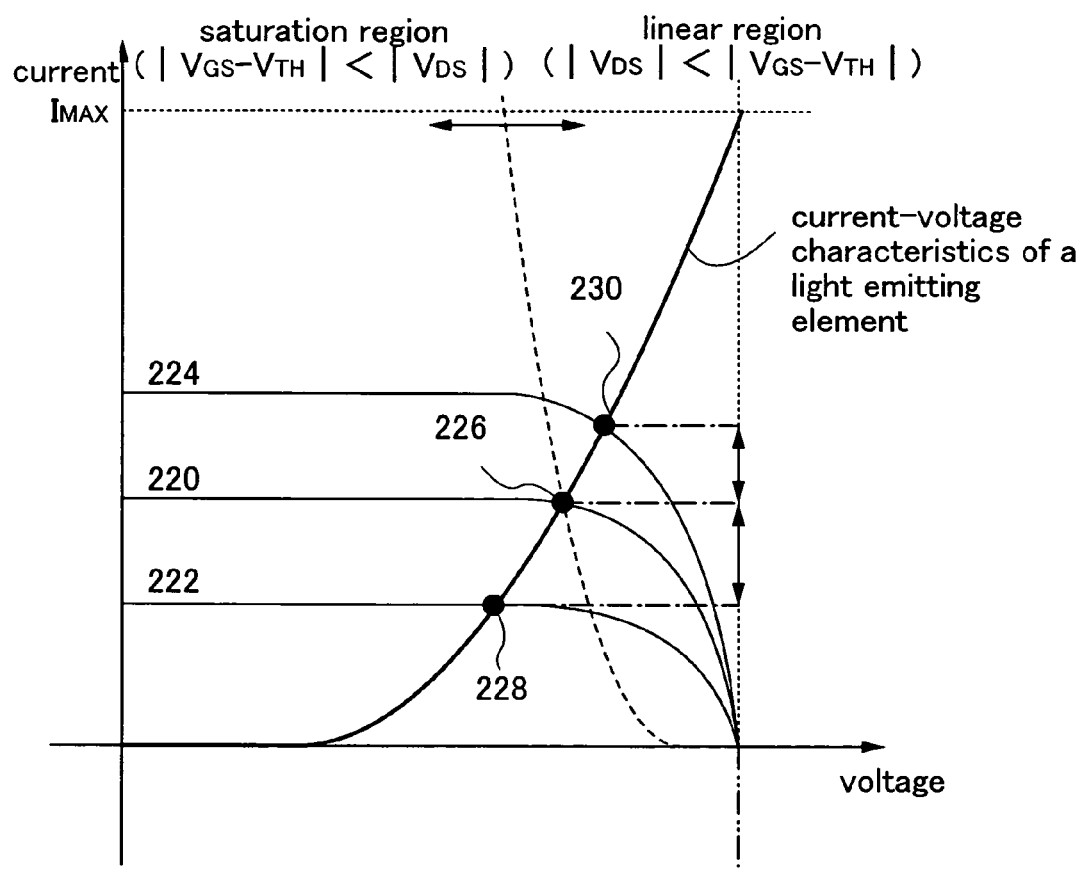
FIG. 42 is a diagram showing an operating condition of a driving TFT of the present invention.

In this embodiment mode, description is made of a constant current drive method in which a driving TFT in a pixel is operated in a saturation region so that the driving TFT is used as a current source. Operating points 226, 228, and 230 of the driving TFT is shown in FIG. 42. When the constant current drive is conducted, the driving TFT is operated in a saturation region in which there exists the operating point 228. When the constant voltage drive is conducted, the driving TFT is operated in a linear region in which there exists the operating point 230.

Even in the constant current drive method, by controlling an operating period of the driving TFT, time gray scale can be conducted. This has been described in Japanese Patent Laid-Open No. 2002-108285 (United States Patent Application 2002/0047568). The present invention can be applied to such a constant current time gray scale. That is, by using the pixel shown in Embodiment Modes 1 to 8, a gray scale display can be performed with time gray scale by a constant current drive method. By using a constant current drive method, when a light-emitting element deteriorates and a light-emitting property varies, deterioration of image quality can be suppressed.

Embodiment Mode 10

Figure 43:
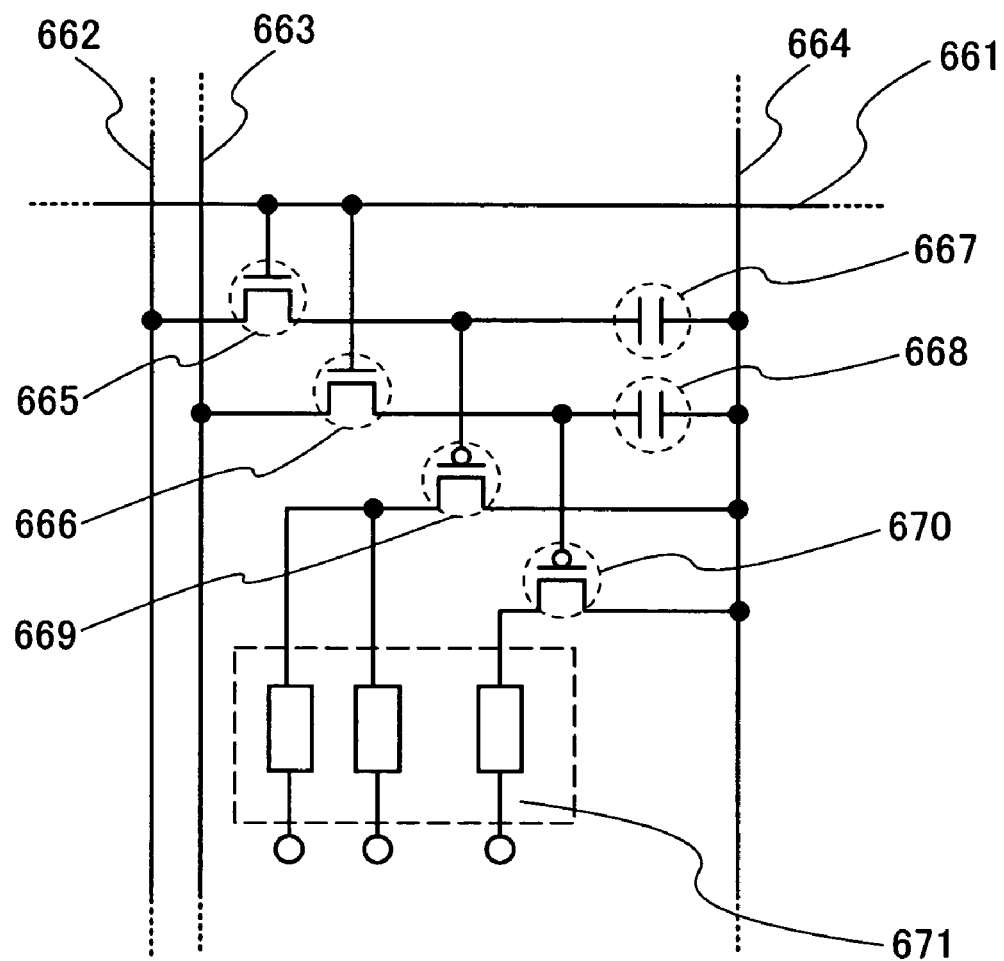
FIG. 43 is a diagram showing a pixel structure of a display device of the present invention.
Figure 44:
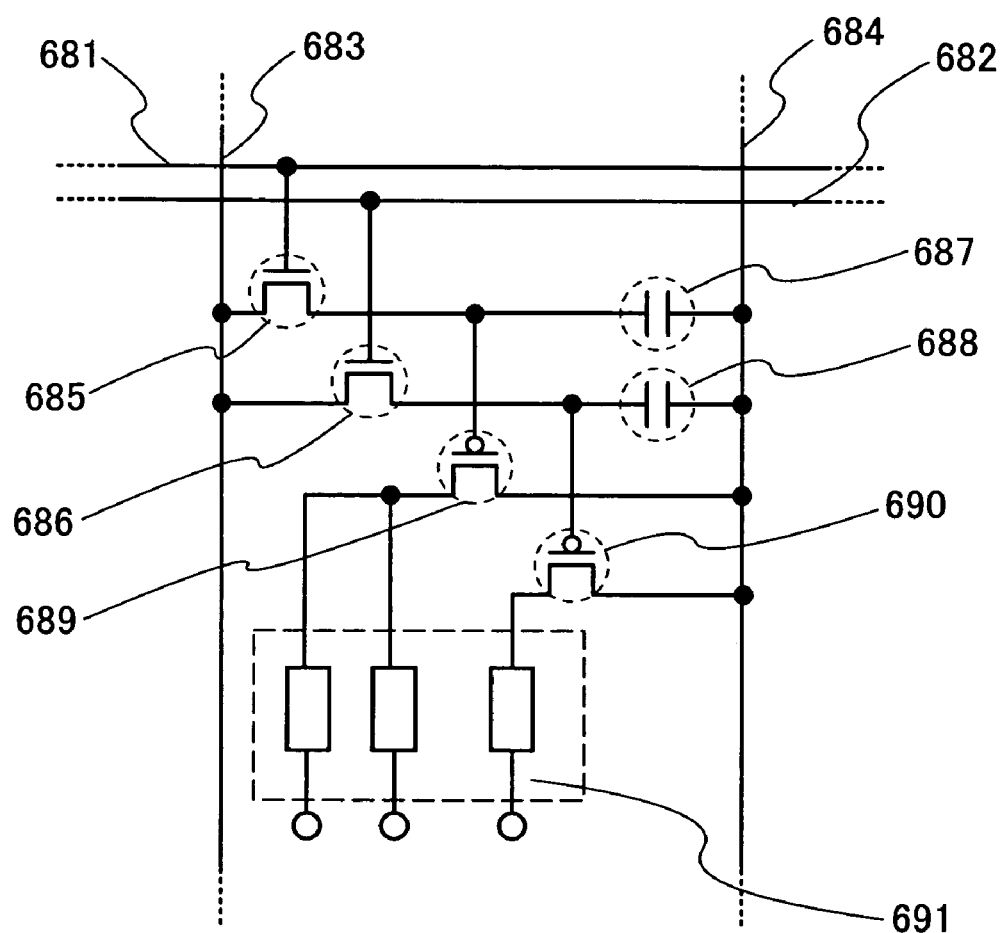
FIG. 44 is a diagram showing a pixel structure of a display device of the present invention.

Described in Embodiment Modes 1 to 9 is the display device in which the time gray scale method is used; however, the display device of the present invention may be applied to the case of another gray scale expression method. For example, the present invention can be applied even in the case of a driving method using an area gray scale method. FIGS. 43 and 44 show examples of a pixel structure in the case of applying the area gray scale method. The pixel by which the area gray scale method is conducted has a feature that one pixel includes a plurality of light-emitting elements each of which can be controlled independently. Each of a light-emitting element 671 and a light-emitting element 691 in FIGS. 43 and 44 includes three elements, two of which can be controlled independently. Relatively, one of the two light-emitting elements capable of being controlled independently can emit light at a luminance of 1 while the other can emit light at a luminance of 2. According to this, luminances of 0, 1, 2, and 3 can be expressed in one pixel even when the light-emitting element is driven with a binary of light emission and non-light emission.

FIG. 43 is a structure example of the case where a plurality of source signal lines are provided, a source signal line to which a signal is inputted and the signal are controlled so that the number of light-emitting elements which emit light is changed to express a gray scale. In FIG. 43, by increasing a potential of a gate signal line 661, the gate signal line 661 is selected, a first selecting TFT 665 and a second selecting TFT 666 are turned on, and respective signals of a first source signal line 662 and a second source signal line 663 are inputted into a first storage capacitor 667 and a second storage capacitor 668 respectively. Consequently, in accordance with the respective signals, currents of a first driving TFT 669 and a second driving TFT 670 are controlled, and a current flows from a power supply line 664 to the light-emitting element 671.

At this time, depending on the signals inputted into the first and the second source signal lines, the light-emitting element 671 which emits light is changed in number. For example, when an H level signal is inputted into the first source signal line 662 whereas a Lo signal is inputted into the second source signal line 663, only the first driving TFT 669 is turned on; therefore, the two light-emitting elements emit light. On the other hand, when a Lo signal is inputted into the first source signal line 662 whereas an H level signal is inputted into the second source signal line 663, only the second driving TFT 670 is turned on; therefore, the one light-emitting element emits light. Further, when H level signals are inputted into the first source signal line 662 and the second source signal line 663, both the first driving TFT 669 and the second driving TFT 670 are turned on; therefore, the three light-emitting elements emit light.

FIG. 44 is a structure example of the case where a plurality of gate signal lines are provided, a gate signal line to which a signal is inputted is controlled so that the number of light-emitting elements which emit light is changed to express a gray scale. In FIG. 44, by increasing respective potentials of a first gate signal line 681 and a second gate signal line 682, the first gate signal line 681 and the second gate signal line 682 are selected, a first selecting TFT 685 and a second selecting TFT 686 are turned on, and a signal of a source signal line 683 is inputted into a first storage capacitor 687 and a second storage capacitor 688. Consequently, in accordance with the signal, currents of a first driving TFT 689 and a second driving TFT 690 are controlled, and a current flows from a power supply line 684 to the light-emitting element 691.

At this time, depending on the gate signal line selected between the first and the second gate signal lines, the light-emitting element 691 which emits light is changed in number. For example, when only the first gate signal line 681 is selected, only the first selecting TFT 685 is turned on and the current only of the first driving TFT 689 is controlled; therefore, the two light-emitting elements emit light. On the other hand, when only the second gate signal line 682 is selected, only the second switching TFT 682 is turned on and the current only of the second driving TFT 690 is controlled; therefore, the one light-emitting element emits light. Further, when both the first gate signal line 681 and the second gate signal line 682 are selected, the first selecting TFT 685 and the second selecting TFT 686 are turned on and the respective currents of the first driving TFT 689 and the second driving TFT 690 are controlled; therefore, the three light-emitting elements emit light.

By using such a pixel circuit, the present invention can be applied to an area gray scale method.

This embodiment mode can be implemented freely combined with Embodiment Modes 1 to 9.

Embodiment Mode 11

In this specification, a light-emitting element is an element having a structure in which an EL layer is interposed between an anode and a cathode. The EL layer emits light when an electric field is generated. In addition, in this specification, the light-emitting element includes both an element that utilizes light (fluorescence) emitted when making a transition from a singlet excited state to a base state, and an element that utilizes light (phosphorescence) emitted when making a transition from a triplet excited state to a ground state.

As an EL layer, there are a hole injecting layer, a hole transporting layer, a light-emitting layer, an electron transporting layer, an electron injecting layer, and the like. The basic structure of a light-emitting element is a stack of an anode, a light-emitting layer, and a cathode in this order. Other than this, there are a structure of stacking an anode, a hole injecting layer, a light-emitting layer, an electron injecting layer, and a cathode in this order, a structure of stacking an anode, a hole injecting layer, a hole transporting layer, a light-emitting layer, an electron transporting layer, an electron injecting layer, and a cathode in this order, and the like.

Note that the EL layer is not limited to a layer having a stacked-layer structure in which the hole injecting layer, the hole transporting layer, the light-emitting layer, the electron transporting layer, the electron injecting layer, and the like are clearly distinguished. That is, the EL layer may have a structure including a layer in which respective materials of forming the hole injecting layer, the hole transporting layer, the light-emitting layer, the electron transporting layer, the electron injecting layer, or the like are mixed. Further, an inorganic material may be mixed as well.

Further, any material of a low molecular organic material, a high molecular organic material, and a medium molecular material can be used for the EL layer of a light-emitting element. Further, an organic-inorganic composite material may be included. Note that in this specification, a medium molecular material does not have the subliming property, and the number of molecules thereof is 20 or less or a molecular chain length thereof is 10 µm or less.

The light-emitting layer is not limited to an organic material, and can also be formed using an inorganic material. As a host material for forming the light emitting layer, an inorganic material can be used. As an inorganic material, it is preferable to use sulfide, oxide, or nitride of a metal material such as zinc, cadmium, and gallium. For example, as sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium monosulfide (BaS), or the like can be used. As oxide, zinc oxide (ZnO), yttrium oxide ($Y_2O_3$), or the like can be used. In addition, as nitride, aluminum nitride (AlN), gallium nitride (GaN), indium nitride (InN), or the like can be used. Furthermore, zinc selenide (ZnSe), zinc telluride (ZnTe), or the like can be used as well. Alternatively, ternary mixed crystal such as calcium sulfide-gallium ($CaGa_2S_4$), strontium sulfide-gallium ($SrGa_2S_4$), or barium sulfide-gallium ($BaGa_2S_4$), may be used.

As an impurity element, a metal element such as manganese (Mn), copper (Cu), samarium (Sm), terbium (Tb), erbium (Er), thulium (Tm), europium (Eu), cerium (Ce), or praseodymium (Pr) can be used to form a light emission center using inner-shell electron transition of a metal ion. As charge compensation, a halogen element such as fluorine (F) or chlorine (Cl) may be added.

In addition, as a light emission center using donor-acceptor recombination, a light emitting material including the first impurity element and the second impurity element can be used. For example, as the first impurity element, metal elements such as copper (Cu), silver (Ag), gold (Au), and platinum (Pt), or silicon (Si) can be used. The second impurity element can be, for example, fluorine (F), chlorine (Cl), bromine (Br), iodine (I), boron (B), aluminum (Al), gallium (Ga), indium (In), thallium (Tl), or the like.

A light-emitting material is obtained by solid phase reaction, namely weighing a host material and an impurity element, mixing them in a mortar, and heating it in an electric furnace so that an impurity element is contained in the host material. For example, the host material and a first impurity element or a compound including the first impurity element, a second impurity element or a compound including the second impurity element are weighed. After mixing them in a mortar, it is heated and baked in an electric furnace. A baking temperature is preferably 700 to 1500° C. When the temperature is too low, the solid phase reaction does not proceed while the host material is decomposed when the temperature is too high. Note that the composition may be baked in a powder state; however, it is preferable to perform baking in a pellet state.

Further, as an impurity element in the case of utilizing solid phase reaction, a compound formed of the first impurity element and the second impurity element may be used in combination. In this case, the solid phase reaction easily proceeds since the impurity elements are easily dispersed. Therefore, an even light emitting material can be obtained. Moreover, as no unnecessary impurity elements are mixed, a light emitting material with high purity can be obtained. As a compound formed of the first impurity element and the second impurity element, for example, copper fluoride ($CuF_2$), copper chloride (CuCi), copper iodide (CuI), copper bromide (CuBr), copper nitride ($Cu_3N$), copper phosphide ($Cu_3P$), silver fluoride (CuF), silver chloride (CuCl), silver iodide (CuI), silver bromide (CuBr), gold chloride ($AuCl_3$), gold bromide ($AuBr_3$), platinum chloride ($PtCl_2$), or the like can be used. In addition, a light emitting material including the third impurity element instead of the second impurity element may be used.

For example, the third impurity element can be lithium (Li), sodium (Na), potassium (K), rubidium (Rb), cesium (Cs), nitrogen (N), phosphorus (P), arsenic (As), antimony (Sb), bismuth (Bi), or the like. These impurity elements are preferably contained at a concentration of 0.01 to 10 mol %, and preferably in a range of 0.1 to 5 mol % in the host material.

As a light emitting material having high electric conductivity, the material described above is used as a host material, thereby a light emitting material to which a light emitting material including the first impurity element, the second impurity element and the third impurity element is added, can be used. These impurity elements are preferably contained at a concentration of 0.01 to 10 mol %, and preferably in a range of 0.1 to 5 mol % in the host material.

As a compound formed of the second impurity element and the third impurity element, for example, alkali halide such as lithium fluoride (LiF), lithium chloride (LiCl), lithium iodide (LiI), copper bromide (CuBr), and sodium chloride (NaCl), boron nitride (BN), aluminum nitride (AlN), aluminum antimonide (AlSb), gallium phosphorus (GaP), gallium arsenide (GaAs), indium phosphorus (InP), indium arsenic (InAs), indium antimonide (InSb), or the like can be used.

By using the aforementioned material as a host material, a light emitting layer which is formed by using a light emitting material including the aforementioned first impurity element, second impurity element, and third impurity element can emit light without a hot electron accelerated by a high electric field. That is to say, it is not necessary to apply high voltage to a light emitting element; therefore, the light emitting element which can operate with a low driving voltage can be obtained. Moreover, because the light emitting element can emit light with a low driving voltage, power consumption of the light-emitting element can be reduced. Moreover, the element which becomes another light emission center may further be included.

Moreover, by using the material as a host material, a light emitting material including a light emission center using inner-shell electron transition of the second impurity element and the third impurity element and the aforementioned metal ion can be used. In this case, it is desirable that a metal ion becoming a light emission center be contained at a concentration of 0.05 to 5 atom % in the host material. Moreover, it is preferable that the concentration of the second impurity element be 0.05 to 5 atom % in the host material. Moreover, it is preferable that the concentration of the third impurity element be 0.05 to 5 atom % in the host material. A light emitting material with such a structure can emit light with a low voltage. Therefore, a light emitting element which can emit light with a low driving voltage with reduced power consumption can be obtained. Moreover, the element which becomes another light emission center may further be included. Luminance decay of a light emitting element can be suppressed by using such a light emitting material. Moreover, a light emitting element can be driven with a low voltage by using a transistor.

The light-emitting element described in this embodiment mode is applied to a display device of the present invention, thereby improving a contrast and image quality. Further, power consumption is reduced.

This embodiment mode can be freely combined with Embodiment Modes 1 to 10.

Embodiment Mode 12

This embodiment mode describes a structure of a transistor which constitutes a part of a display device. Next, a case of using an amorphous silicon (a-Si:H) film for a semiconductor layer of a transistor is described. FIGS. 45A and 45B show examples of top-gate transistors, while FIGS. 46A and 46B and FIGS. 47A and 47B show examples of bottom-gate transistors.

FIG. 45A is a cross section of a top-gate transistor which uses amorphous silicon as its semiconductor layer. As shown in FIG. 45A, a base insulating film 702 is formed over a substrate 701. Further, a pixel electrode 703 is formed over the base insulating film 702. In addition, a first electrode 704 is formed with the same material and in the same layer as the pixel electrode 703.

The substrate may be a glass substrate, a quartz substrate, a ceramic substrate, or the like. In addition, the base insulating film 702 may be formed with aluminum nitride (AlN), silicon oxide ($SiO_2$), and/or oxynitride silicon ($SiO_xN_y$), as a single layer or a multilayer thereof.

In addition, a wire 705 and a wire 706 are formed over the base insulating film 702, and an end portion of the pixel electrode 703 is covered with the wire 705. Over the wire 705 and the wire 706, an N-type semiconductor layer 707 and an N-type semiconductor layer 708 each having N-type conductivity are formed. A semiconductor layer 709 is formed between the wire 706 and the wire 705, and over the base insulating film 702.

A part of the semiconductor layer 709 is extended over the N-type semiconductor layer 707 and the N-type semiconductor layer 708. Note that the semiconductor layer 709 is formed with a non-crystalline semiconductor film such as amorphous silicon (a-Si:H) or a microcrystalline semiconductor (μc-Si: H). A gate insulating film 710 is formed over the semiconductor layer 709. In addition, an insulating film 711 is formed with the same material and in the same layer as the gate insulating film 710, over the first electrode 704. Note that the gate insulating film 710 is formed of a silicon oxide film, a silicon nitride film, or the like.

A gate electrode 712 is formed over the gate insulating film 710. In addition, a second electrode 713 is formed with the same material and in the same layer as the gate electrode 712, over the first electrode 704 with the insulating film 711 therebetween. Thus, a capacitor 719 in which the insulating film 711 is sandwiched between the first electrode 704 and the second electrode 713, is formed. An interlayer insulating film 714 is formed to cover the end portion of the pixel electrode 703, a driving transistor 718, and the capacitor 719.

A light-emitting layer 715 and an opposing electrode 716 are formed over the interlayer insulating film 714 and the pixel electrode 703 positioned in an opening portion of the interlayer insulating film 714. Thus, a light-emitting element 717 is formed in a region where the light-emitting layer 715 is sandwiched between the pixel electrode 703 and the opposing electrode 716.

The first electrode 704 shown in FIG. 45A may be replaced by a first electrode 720 as shown in FIG. 45B. The first electrode 720 is formed with the same material and in the same layer as the wires 705 and 706.

FIGS. 46A and 46B show partial cross sections of a panel of a display device which has a bottom-gate transistor using amorphous silicon for its semiconductor layer. An insulating film 722 is formed over a substrate 721. Further, a gate electrode 723 is formed over the insulating film 722. In addition, a first electrode 724 is formed in the same layer and with the same material as the gate electrode 723. As a material of the gate electrode 723, polycrystalline silicon doped with phosphorus can be used. Not only polycrystalline silicon, but also a silicide which is a compound of a metal and silicon may be used as well.

In addition, a gate insulating film 725 is formed to cover the gate electrode 723 and the first electrode 724. The gate insulating film 725 is formed using a silicon oxide film, a silicon nitride film, or the like.

A semiconductor layer 726 is formed over the gate insulating film 725. In addition, a semiconductor layer 727 is formed with the same material and in the same layer as the semiconductor layer 726.

The substrate may be a glass substrate, a quartz substrate, a ceramic substrate, or the like. In addition, the insulating film 722 may be formed with aluminum nitride (AlN), silicon oxide ($SiO_2$), and/or oxynitride silicon ($SiO_xN_y$), as a single layer or a multilayer thereof.

N-type semiconductor layers 728 and 729 each having N-type conductivity are formed over the semiconductor layer 726, while an N-type semiconductor layer 730 is formed over the semiconductor layer 727. Wires 731 and 732 are formed over the N-type semiconductor layers 728 and 729, respectively and a conductive layer 733 which is formed of the same material as the wires 731 and 732 is formed over the N-type semiconductor layer 730.

A second electrode including the semiconductor layer 727, the N-type semiconductor layer 730 and the conductive layer 733 is formed. Note that a capacitor 740 in which the gate insulating film 725 is sandwiched by the second electrode and the first electrode 724 is formed.

In addition, a part of the wire 731 is extended, and a pixel electrode 734 is formed in contact with the top surface of the extended portion of the wire 731. An insulating layer 735 is formed to cover an end portion of the pixel electrode 734, a driving transistor 739 and the capacitor 740.

A light-emitting layer 736 and an opposing electrode 737 are formed over the pixel electrode 734 and the insulating layer 735, and a light-emitting element 738 is formed in a region where the light-emitting layer 736 is sandwiched between the pixel electrode 734 and the opposing electrode 737.

The semiconductor layer 727 and the N-type semiconductor layer 730 which partially function as a second electrode of the capacitor are not necessarily provided. That is, the conductive layer 733 may be used as the second electrode so as to provide a capacitor having such a structure that the gate insulating film is sandwiched between the first electrode 724 and the conductive layer 733.

Note that by forming the pixel electrode 734 before forming the wire 731 shown in FIG. 46A, a capacitor 742 as shown in FIG. 46B can be formed, which has a structure where the gate insulating film 725 is sandwiched between a second electrode 741 formed of the same material as the pixel electrode 734 and the first electrode 724.

A case of a transistor with a channel-protective structure is described with reference to FIGS. 47A and 47B. The transistor with a channel-protective structure shown in FIG. 47A is different from the one shown in FIG. 46A in that an insulating layer 743 is provided over a region to become a channel in the semiconductor layer 726 of the driving transistor 739 with a channel-etch structure. The insulating layer 743 is used as a mask for etching a source and a drain. Common portions between FIGS. 47A and 46A are denoted by common reference numerals.

A transistor with a channel-protective structure shown in FIG. 47B is different from the one shown in FIG. 46B in that an insulating layer 743 is provided over a region to become a channel in the semiconductor layer 726 of the driving transistor 739 with a channel-etch structure. The insulating layer 743 is used as a mask for etching a source and a drain. Common portions between FIGS. 47B and 46B are denoted by common reference numerals.

By using amorphous silicon for a semiconductor layer (e.g., a channel formation region, a source region, or a drain region) of a transistor which constitutes a pixel of the present invention, manufacturing cost can be reduced.

Note that the structures of transistors or capacitors to which the pixel structure of the present invention can be applied are not limited to the structures described above, and various structures of transistors or capacitors can be employed.

This embodiment mode can be freely combined with Embodiment Modes 1 to 11.

Embodiment Mode 13

This embodiment mode describes a method for manufacturing a transistor which is a main component of a display device shown in Embodiment Modes 1 to 10. In particular, a method for manufacturing a transistor using a plasma treatment is described.

Figure 48A:
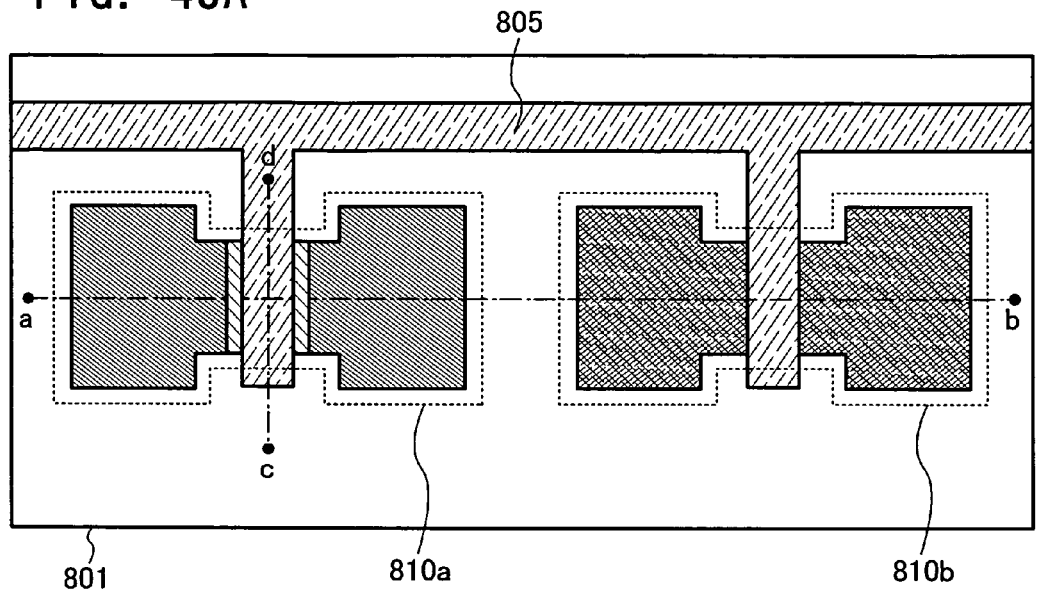
FIGS. 48A to 48C are diagrams showing a structure of a transistor used for a display device of the present invention.
Figure 48B:
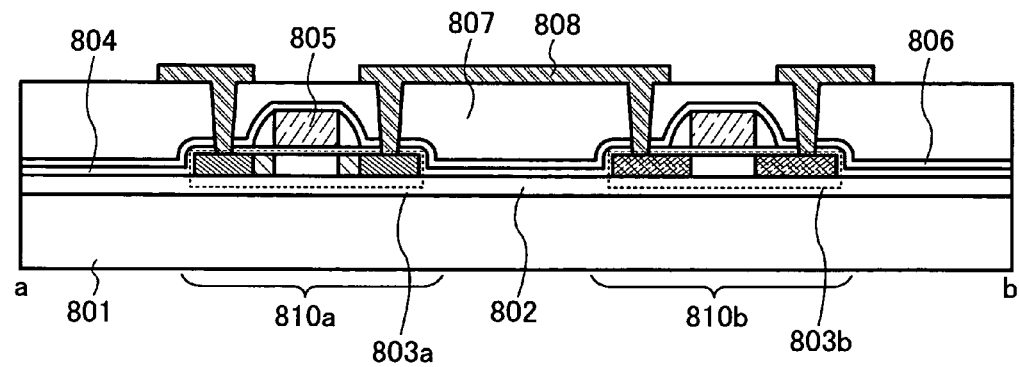
Figure 48C:
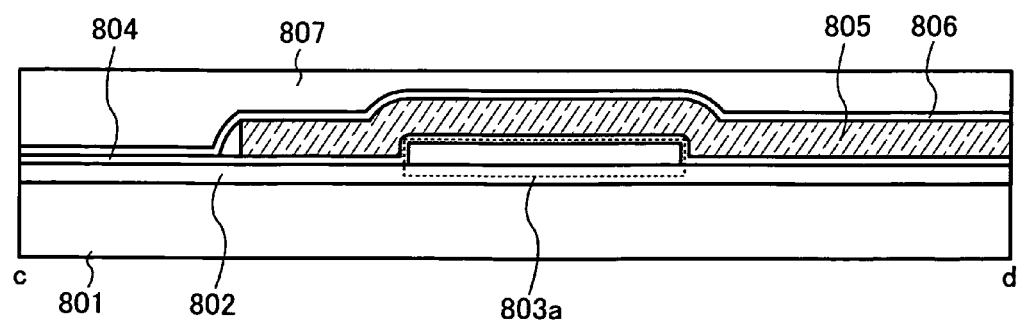

FIGS. 48A to 48C are views each showing a structure example of a transistor. Note that, in FIGS. 48A to 48C, FIG. 48B corresponds to a cross-sectional view taken along a-b of FIG. 48A, and FIG. 48C corresponds to a cross-sectional view taken along c-d of FIG. 48A.

In FIGS. 48A to 48C include semiconductor films 803a and 803b are provided over a substrate 801 with an insulating film 802 therebetween. A gate electrode 805 is provided over the semiconductor films 803a and 803b with a gate insulating film 804 therebetween. Insulating films 806 and 807 are provided to cover the gate electrode 805. Source and drain regions are formed in the semiconductor films 803a and 803b and are connected to a conductive film 808 through a contact hole formed in the insulating film 807.

Note that FIGS. 48A to 48C each show a case of providing an N-channel transistor 810a using a part of the semiconductor film 803a as a channel region and a P-channel transistor 810b using a part of the semiconductor film 803b as a channel region; however, the present invention is not limited to this structure. For example, although in FIGS. 48A to 48C, an LDD region is provided in the N-channel transistor 810a but not in the P-channel transistor 810b, a structure in which an LDD region can be provided in both the transistors or a structure in which an LDD region is not provided in both the transistors may be employed.

Note that, in this embodiment mode, a step of oxidizing or nitriding at least one of the substrate 801, the insulating film 802, the semiconductor films 803a and 803b, the gate insulating film 804, the insulating film 806, and the insulating film 807 by a plasma treatment is included, so that the semiconductor film or the insulating film is oxidized or nitrided. In this manner, by oxidizing or nitriding the semiconductor film or the insulating film by a plasma treatment, the surface of the semiconductor film or the insulating film is enhanced in its film quality. Consequently, a denser insulating film can be formed as compared to an insulating film formed by a CVD method or a sputtering method. Therefore, a defect such as a pinhole can be suppressed and the characteristics or the like of a transistor can be improved.

In this embodiment mode, a method for manufacturing a transistor by performing a plasma treatment to the semiconductor film 803a, the semiconductor film 803b, or the gate insulating film 804 in FIGS. 48A to 48C and oxidizing or nitriding the semiconductor film 803a, the semiconductor film 803b, or the gate insulating film 804 is explained with reference to drawings.

Initially, the end portions of an island-shaped semiconductor film provided over a substrate are formed to be almost perpendicular.

First, the island-shaped semiconductor films 803a and 803b are formed over the substrate 801 (FIG. 49A). The island-shaped semiconductor films 803a and 803b are formed by forming an amorphous semiconductor film with the use of a material containing silicon (Si) as a main component (for example, $Si_xGe_{1-x}$ or the like) over the insulating film 802 which has been formed in advance over the substrate 801, by a sputtering method, an LPCVD method, a plasma CVD method, or the like, then by crystallizing the amorphous semiconductor film and etching it selectively. Note that the amorphous semiconductor film can be crystallized by a crystallization method such as a laser crystallization method, a thermal crystallization method using RTA or an annealing furnace, a thermal crystallization method using a metal element which promotes crystallization, or a method using these methods in combination. Note that, in FIGS. 49A to 49D, the end portions of the island-shaped semiconductor films 803a and 803b are formed to be almost perpendicular (θ=85° to 100°).

Next, the semiconductor films 803a and 803b are oxidized or nitrided by a plasma treatment to form oxide films, nitride films or the like (hereinafter, referred to as insulating films 821a and 821b) on the surfaces of the semiconductor films 803a and 803b, respectively (FIG. 49B). In a case of using Si for the semiconductor films 803a and 803b, for example, silicon oxide ($SiO_x$) or silicon nitride ($SiN_x$) is formed as the insulating films 821a and 821b. In addition, after oxidizing the semiconductor films 803a and 803b by a plasma treatment, they may be nitrided by a plasma treatment again. In this case, silicon oxide ($SiO_x$) is formed in contact with the semiconductor films 803a and 803b and silicon nitride oxide ($SiN_xO_y$) (x>y) is formed on the surface of the silicon oxide. Note that, in the case of oxidizing the semiconductor films by a plasma treatment, the plasma treatment is performed under an oxygen atmosphere (for example, under an atmosphere containing oxygen ($O_2$) and a rare gas (at least one of He, Ne, Ar, Kr, and Xe), an atmosphere containing oxygen, hydrogen ($H_2$), and a rare gas, or an atmosphere containing dinitrogen monoxide and a rare gas). On the other hand, in the case of nitriding the semiconductor films by a plasma treatment, the plasma treatment is performed under a nitrogen atmosphere (for example, under an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas). As a rare gas, for example, Ar can be used. A gas in which Ar and Kr are mixed may also be used as well. Accordingly, the insulating films 821a and 821b contain a rare gas (containing at least one of He, Ne, Ar, Kr, and Xe) used for the plasma treatment. When Ar is used, the insulating films 821a and 821b contain Ar.

In addition, the plasma treatment is performed with an electron density of $1\times10^{11}$ to $1\times10^{13}$ cm$^{-3}$ and an electron temperature of plasma of 0.5 to 1.5 eV in the atmosphere containing the gas described above. The electron density of plasma is high and the electron temperature around an object (here, the semiconductor films 803a and 803b) formed over the substrate 801 is low. Thus, plasma damages to the object can be prevented. In addition, since the electron density of plasma is $1\times10^{11}$ cm$^{-3}$ or higher, the oxide film or the nitride film formed by oxidizing or nitriding the object by the plasma treatment has a superior evenness in film thickness or the like as compared to a film formed by a CVD method, a sputtering method, or the like, and thus, it can be a dense film. Moreover, since the electron temperature of plasma is 1 eV or lower, the oxidation treatment or the nitriding treatment can be performed at a lower temperature than a conventional plasma treatment or thermal oxidation method. For example, the oxidation treatment or the nitriding treatment can be performed sufficiently even when the plasma treatment is performed at a lower temperature by at least 100° C. than a distortion point of a glass substrate. As the frequency for producing plasma, a high frequency wave such as a microwave (2.45 GHz) can be employed. Hereinafter, the plasma treatment is performed with the above conditions unless specifically referred.

Next, the gate insulating film 804 is formed to cover the insulating films 821a and 821b(FIG. 49C). The gate insulating film 804 can be formed to have a single layer structure or a multilayer structure of insulating films containing nitrogen or oxygen such as silicon oxide (SiO$_x$), silicon nitride (SiN$_x$), silicon oxynitride (SiO$_x$N$_y$) (x>y), or silicon nitride oxide (SiN$_x$O$_y$) (x>y) by a sputtering method, an LPCVD method, a plasma CVD method, or the like. For example, when Si is used for the semiconductor films 803a and 803b, and Si is oxidized by the plasma treatment, silicon oxide is formed as the insulating films 821a and 821b on the surfaces of the semiconductor films 803a and 803b. In this case, silicon oxide (SiO$_x$) is formed as the gate insulating film on the insulating films 821a and 821b. In addition, in FIG. 49B, when the thickness of the insulating films 821a and 821b which are formed by oxidizing or nitriding the semiconductor films 803a and 803b by the plasma treatment, are sufficiently thick, the insulating films 821a and 821b can be used as the gate insulating films.

Then, by forming the gate electrode 805 or the like over the gate insulating film 804, it is possible to manufacture the N-channel transistor 810a and the P-channel transistor 810b each using the island-shaped semiconductor films 803a and 803b as channel regions (FIG. 49D).

Before forming the gate insulating film 804 over the semiconductor films 803a and 803b, the surface of each of the semiconductor films 803a and 803b is oxidized or nitrided by the plasma treatment. Consequently, a short-circuit or the like between the gate electrode and the semiconductor film due to a coverage defect of the gate insulating film 804 at end portions 851a and 851b etc., of the channel regions can be prevented. In other words, in a case where the angles of the end portions of the island-shaped semiconductor films are formed to be almost perpendicular (θ=85° to 100°), when the gate insulating film is formed to cover the semiconductor films by a CVD method, a sputtering method or the like, there is a risk of a coverage defect due to breakage of the gate insulating film, or the like at the end portions of the semiconductor films. However, when the plasma treatment is performed on the surface of the semiconductor film to oxide or nitride the surface, coverage defects and the like of the gate insulating film at the end portion of the semiconductor film can be prevented.

In FIGS. 49A to 49D, the gate insulating film 804 may be oxidized or nitrided by performing a plasma treatment after forming the gate insulating film 804. In this case, the gate insulating film 804 is formed to cover the semiconductor films 803a and 803b(FIG. 50A), and a plasma treatment is performed to the gate insulating film 804 to oxidize or nitride the gate insulating film 804; therefore, an oxide film or a nitride film (hereinafter, referred to as an insulating film 823) is formed on the surface of the gate insulating film 804 (FIG. 50B). The conditions for the plasma treatment can be similar to those of FIG. 49B. In addition, the insulating film 823 contains a rare gas used in the plasma treatment, for example, in a case of using Ar, Ar is contained in the insulating film 823.

In FIG. 50B, after the plasma treatment is performed in an atmosphere containing oxygen to oxidize the gate insulating film 804 once, a plasma treatment may be performed again in an atmosphere containing nitrogen to nitride the gate insulating film 804. In this case, silicon oxide (SiO$_x$) or silicon oxynitride (SiO$_x$N$_y$) (x>y) is formed over the semiconductor films 803a and 803b, and silicon nitride oxide (SiN$_x$O$_y$) (x>y) is formed in contact with the gate electrode 805. After that, by forming the gate electrode 805 or the like over the insulating film 802, it is possible to manufacture the N-channel transistor 810a and the P-channel transistor 810b using the island-shaped semiconductor films 803a and 803b as channel regions (FIG. 50C). In this manner, by performing the plasma treatment to the gate insulating film, the surface of the gate insulating film is oxidized or nitrided to be enhanced in its film quality. Thus, a dense film can be obtained. The insulating film obtained by the plasma treatment is denser and has fewer defects such as pinholes as compared to an insulating film formed by a CVD method or a sputtering method, and thus, the characteristics of the transistor can be enhanced.

In FIGS. 50A to 50C, the case is described, where the plasma treatment is performed to the semiconductor films 803a and 803b in advance, and the surfaces of the semiconductor films 803a and 803b are oxidized or nitrided. However, a method may be employed, in which a plasma treatment is performed after forming the gate insulating film 804 without performing the plasma treatment to the semiconductor films 803a and 803b. In this manner, by performing the plasma treatment before forming the gate electrode, even when coverage defects due to breakage of the gate insulating film occurs at the end portions of the semiconductor films, the semiconductor films exposed due to the coverage defects can be oxidized or nitrided, and thus, a short-circuit between the gate electrode and the semiconductor film caused by the coverage defect of the gate insulating film at the end portions of the semiconductor films, or the like can be prevented.

Even when the end portions of the island-shaped semiconductor films are formed to be almost perpendicular, the plasma treatment is performed to the semiconductor films or the gate insulating film to oxidize or nitride the semiconductor films or the gate insulating film, thereby avoiding a short-circuit between the gate electrode and the semiconductor films caused by coverage defects of the gate insulating film at the end portions of the semiconductor films.

Next, a case is described where the end portions of the island-shaped semiconductor films have tapered shapes (θ=30° to 85°) in the island-shaped semiconductor films provided over the substrate.

First, the island-shaped semiconductor films 803a and 803b are formed over the substrate 801 (FIG. 51A). As for formation of the island-shaped semiconductor films 803a and

803b, an amorphous semiconductor film is formed using a material mainly containing silicon (Si) (for example, $Si_xGe_y$, or the like) over the insulating film 802 formed in advance over the substrate 801, by a sputtering method, an LPCVD method, a plasma CVD method, or the like. Then, the amorphous semiconductor film is crystallized by a crystallization method such as a laser crystallization method, a thermal crystallization method using RTA or an annealing furnace, or a thermal crystallization method using a metal element promoting crystallization. Then, the semiconductor film is selectively etched and removed. In FIGS. 51A to 51D, the end portions of the island-shaped semiconductor films 803a and 803b are tapered ($\theta=30°$ to $85°$).

Next, the gate insulating film 804 is formed to cover the semiconductor films 803a and 803b (FIG. 51B). The gate insulating film 804 can be formed to have a single layer structure or a multilayer structure of insulating films containing nitrogen or oxygen such as silicon oxide ($SiO_x$), silicon nitride ($SiN_x$), silicon oxynitride ($SiO_xN_y$) ($x>y$), or silicon nitride oxide ($SiN_xO_y$) ($x>y$) by a sputtering method, an LPCVD method, a plasma CVD method, or the like.

Then, the gate insulating film 804 is oxidized or nitrided by a plasma treatment, and thus, an oxide film or a nitride film (hereinafter, referred to as an insulating film 824) is formed on the surface of the gate insulating film 804 (FIG. 51C). In addition, the conditions for the plasma treatment can be similar to those described above. For example, when silicon oxide ($SiO_x$) or silicon oxynitride ($SiO_xN_y$) ($x>y$) is used as the gate insulating film 804, a plasma treatment is performed in an atmosphere containing oxygen to oxidize the gate insulating film 804. The film obtained on the surface of the gate insulating film by the plasma treatment can be dense and have fewer defects such as pinholes as compared to a gate insulating film formed by a CVD method, a sputtering method, or the like. On the other hand, a plasma treatment is performed in an atmosphere containing nitrogen to nitride the gate insulating film 804, silicon nitride oxide ($SiN_xO_y$) ($x>y$) can be provided as the insulating film 824 on the surface of the gate insulating film 804. In addition, after a plasma treatment is performed in an atmosphere containing oxygen to oxidize the gate insulating film 804 once, a plasma treatment may be performed again in an atmosphere containing nitrogen to nitride the gate insulating film 804. In addition, the insulating film 824 contains a rare gas used in the plasma treatment, for example, in a case of using Ar, Ar is contained in the insulating film 824.

Next, by forming the gate electrode 805 or the like over the gate insulating film 804, it is possible to manufacture the N-channel transistor 810a and the P-channel transistor 810b each using the island-shaped semiconductor films 803a and 803b as channel regions (FIG. 51D).

In this manner, by performing the plasma treatment to the gate insulating film, an insulating film formed of an oxide film or a nitride film is formed on the surface of the gate insulating film, and the surface of the gate insulating film can be enhanced in its film quality. The oxidized or nitrided insulating film by the plasma treatment is denser and has fewer defects such as pinholes as compared to a gate insulating film formed by a CVD method or a sputtering method, and thus, the characteristics of a transistor can be enhanced. Further, it is possible to prevent a short-circuit between the gate electrode and the semiconductor film caused by the coverage defect of the gate insulating film or the like at the end portion of the semiconductor film, by forming the end portion of the semiconductor film into a tapered shape. However, by performing the plasma treatment after forming the gate insulating film, a short-circuit between the gate electrode and the semiconductor film, or the like can further be prevented.

A manufacturing method of a transistor which is different from that in FIGS. 51A to 51D is explained with reference to drawings. Specifically, a case is described where a plasma treatment is selectively conducted to an end portion of a semiconductor film having a tapered shape.

First, the island-shaped semiconductor films 803a and 803b are formed over the substrate 801 (FIG. 52A). As for formation of the island-shaped semiconductor films 803a and 803b, an amorphous semiconductor film is formed using a material mainly containing silicon (Si) (e.g., $Si_xGe_y$, etc.) over the insulating film 802 formed in advance over the substrate 801, by a sputtering method, an LPCVD method, a plasma CVD method, or the like. Then, the amorphous semiconductor film is crystallized and the semiconductor film is selectively etched using resists 825a and 825b as masks. A crystallization method such as a laser crystallization method, a thermal crystallization method using RTA or an annealing furnace, a thermal crystallization method using a metal element promoting crystallization, or a combination of the methods can be adopted to crystallize the amorphous semiconductor film.

Next, before removing the resists 825a and 825b used for etching the semiconductor film, a plasma treatment is performed to selectively oxidize or nitride the end portions of the island-shaped semiconductor films 803a and 803b. An oxide film or a nitride film (hereinafter, referred to as an insulating film 826) is formed at each end portion of the semiconductor films 803a and 803b (FIG. 52B). The plasma treatment is performed with the above conditions. In addition, the insulating film 826 contains a rare gas used in the plasma treatment.

Then, the gate insulating film 804 is formed to cover the semiconductor films 803a and 803b (FIG. 52C). The gate insulating film 804 can be formed similarly as described above.

Next, by forming the gate electrode 805 or the like over the gate insulating film 804, it is possible to manufacture the N-channel transistor 810a and the P-channel transistor 810b each using the island-shaped semiconductor films 803a and 803b as channel regions (FIG. 52D).

When the end portions of the semiconductor films 803a and 803b are tapered, end portions 852a and 852b of the channel regions formed in parts of the semiconductor films 803a and 803b are also tapered. Thus, the thickness of the semiconductor film or the gate insulating film varies as compared to the center portion, and there is a risk that the characteristics of a transistor are influenced. Thus, by selectively oxidizing or nitriding the end portions of the channel regions by the plasma treatment, an insulating film is formed on the semiconductor film which becomes the end portions of the channel region. Thus, an influence on the transistor due to the end portions of the channel region can be reduced.

FIGS. 52A to 52D show an example in which the plasma treatment is performed to only the end portions of the semiconductor films 803a and 803b for oxidation or nitriding. Needless to say, a plasma treatment can also be performed to the gate insulating film 804 for oxidation or nitriding as shown in FIGS. 51A to 51D (FIG. 54A).

Next, a manufacturing method of a transistor is explained with reference to the drawings. The method is different from the method described above. Specifically, a plasma treatment is applied to a semiconductor film having a tapered shape.

First, the island-shaped semiconductor films 803a and 803b are formed over the substrate 801 similarly as described above (FIG. 53A).

Next, a plasma treatment is performed to the semiconductor films 803a and 803b to oxidize or nitride the semiconductor films 803a and 803b, and thus, oxide films or nitride films (hereinafter, referred to as insulating films 827a and 827b) are formed on the surfaces of the semiconductor films 803a and 803b(FIG. 53B). The plasma treatment can be performed with the above conditions. For example, when Si is used for the semiconductor films 803a and 803b, silicon oxide ($SiO_x$) or silicon nitride ($SiN_x$) is formed as the insulating films 827a and 827b. In addition, after oxidizing the semiconductor films 803a and 803b by the plasma treatment, a plasma treatment may be performed again to nitride the semiconductor films 803a and 803b. In this case, silicon oxide ($SiO_x$) or silicon oxynitride ($SiO_xN_y$) (x>y) is formed in contact with the semiconductor films 803a and 803b, and silicon nitride oxide ($SiN_xO_y$) (x>y) is formed on the surface of the silicon oxide. Therefore, the insulating films 827a and 827b contain a rare gas used in the plasma treatment. By the plasma treatment, the end portions of the semiconductor films 803a and 803b are oxidized or nitrided at the same time.

Then, the gate insulating film 804 is formed to cover the insulating films 827a and 827b(FIG. 53C). As the gate insulating film 804, a single layer structure or a stacked-layer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) can be employed by a sputtering method, an LPCVD method, a plasma CVD method, or the like. For example, in a case where the semiconductor films 803a and 803b using Si are oxidized by a plasma treatment to form silicon oxide as the insulating films 827a and 827b on the surfaces of the semiconductor films 803a and 803b, silicon oxide ($SiO_x$) is formed as the gate insulating film over the insulating films 827a and 827b.

Next, by forming the gate electrode 805 or the like over the gate insulating film 804, it is possible to manufacture the N-channel transistor 810a and the P-channel transistor 810b using the island-shaped semiconductor films 803a and 803b as channel regions (FIG. 53D).

When the end portions of the semiconductor films are tapered, end portions of the channel regions formed in portions of the semiconductor films 803a and 803b are also tapered. Thus, there is a risk that the characteristics of a semiconductor element are affected. By oxidizing or nitriding the end portions of the channel regions as a result of oxidizing or nitriding the semiconductor films by the plasma treatment, an influence on a semiconductor element can be reduced.

In FIGS. 53A to 53D, the example is shown in which only the semiconductor films 803a and 803b are subjected to oxidization or nitriding by the plasma treatment; however, a plasma treatment can be performed to the gate insulating film 804 for oxidation or nitriding as shown in FIGS. 51A to 51D (FIG. 54B). In this case, after the plasma treatment is performed in an atmosphere containing oxygen once to oxide the gate insulating film 804, a plasma treatment may be performed again in an atmosphere containing nitrogen to nitride the gate insulating film 804. In this case, silicon oxide ($SiO_x$) or silicon oxynitride ($SiO_xN_y$) (x>y) is formed on the semiconductor films 803a and 803b, and silicon nitride oxide ($SiN_xO_y$) (x>y) is formed to be in contact with the gate electrode 805.

Figure 55A:
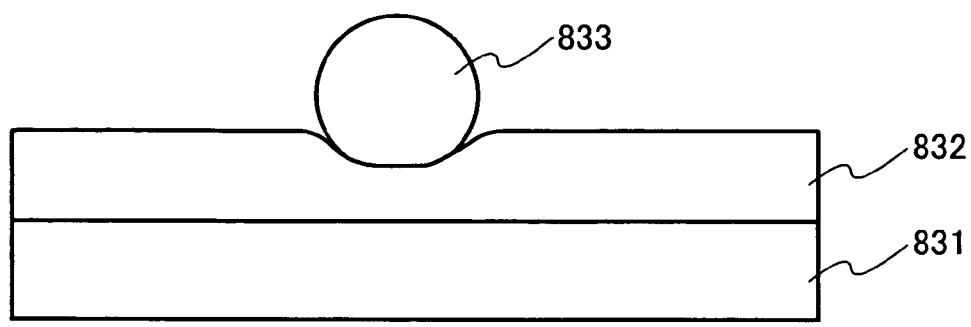
FIGS. 55A and 55B are diagrams describing a manufacturing method of a transistor used for a display device of the present invention.
Figure 55B:
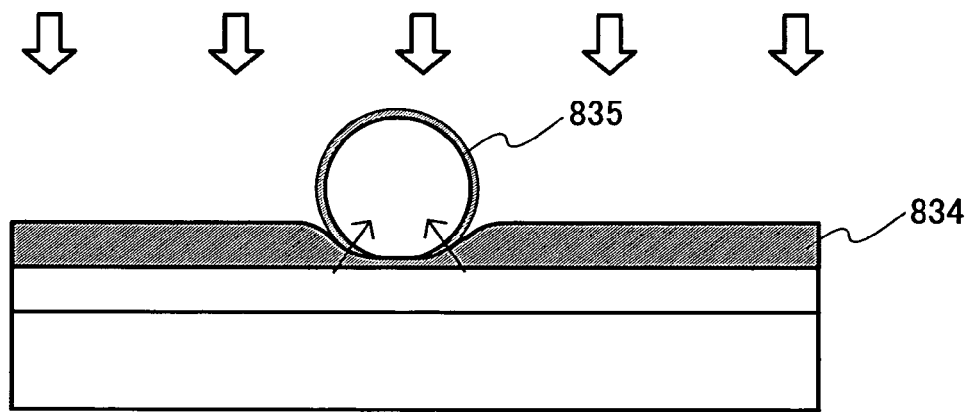

By performing the plasma treatment in this manner, impurities such as dusts attached to the semiconductor film or the insulating film can be easily removed. In general, in some cases, dusts (also referred to as particles) are attached to the film formed by a CVD method, a sputtering method, or the like. For example, as shown in FIG. 55A, there is a case that a dust 833 is formed over an insulating film 832 formed by a CVD method, a sputtering method, or the like, which is formed over a film 831 such as an insulating film, a conductive film, or a semiconductor film. In such a case, the insulating film 832 is oxidized or nitrided by a plasma treatment and an oxide film or a nitride film (hereinafter, referred to as an insulating film 834) is formed on the surface of the insulating film 832. As for the insulating film 834, a portion under the dust 833 as well as a portion in which the dust 833 does not exist, is oxidized or nitrided, and thus the volume of the insulating film 834 is increased. On the other hand, the surface of the dust 833 is also oxidized or nitrided by the plasma treatment to form an insulating film 835, and as a result, the volume of the dust 833 is also increased (FIG. 55B).

At this time, the dust 833 can be easily removed from the surface of the insulating film 834 by simple cleaning such as brush cleaning. In this manner, by the plasma treatment, even a minute dust attached to the insulating film or a semiconductor film can be removed easily. It is noted that this is an effect obtained by performing the plasma treatment, and this is true of other embodiment modes as well as this embodiment mode.

As described above, by improving the film quality of the surface of the semiconductor film or the gate insulating film by oxidation or nitriding by the plasma treatment, a dense insulating film having good film quality can be formed. In addition, dusts or the like attached to the surface of the insulating film can be removed easily by cleaning. Consequently, even when the insulating film is formed to be thin, defects such as pinholes can be avoided, and miniaturization and higher performance of a semiconductor element such as a transistor can be realized.

Note that, in this embodiment mode, a plasma treatment is performed to the semiconductor films 803a and 803b or the gate insulating film 804 in the above FIGS. 48A to 48C to oxidize or nitride the semiconductor films 803a and 803b or the gate insulating film 804; however, a layer that is oxidized or nitrided by a plasma treatment is not limited thereto. For example, a plasma treatment may be performed to the substrate 801 or the insulating film 802, or a plasma treatment may be performed to the insulating film 806 or 807.

This embodiment mode describes a manufacturing method of a transistor over a substrate. By using the transistor, a display device shown in Embodiment Modes 1 to 10 can be manufactured. In other words, this embodiment mode can be freely combined with Embodiment Modes 1 to 10.

Embodiment Mode 14

This embodiment mode describes a method for manufacturing a transistor which is a main component of a display device shown in Embodiment Modes 1 to 10. In particular, a half-tone exposure method as a process of manufacturing a transistor is described.

FIG. 56 is a view showing a cross-sectional structure of a transistor, a capacitor, and a resistor element which can be formed in the same process. FIG. 56 shows N-channel transistors 951 and 952, a capacitor 954, a resistor element 955, and a P-channel transistor 953. Each transistor is provided with a semiconductor layer 905, an insulating layer 908, and a gate electrode 909. The gate electrode 909 is formed to have a stacked structure of first and second conductive layers 903 and 902. In addition, FIGS. 57A to 57E are each a top view corresponding to the transistors, capacitor, and resistor element shown in FIG. 56, which can be referred to as well.

In FIG. 56, the N-channel transistor 951 has impurity regions 907 formed in the semiconductor layer 905 on opposite sides of a channel formation region in the channel length direction (the direction in which carriers flow), which are also referred to as lightly doped drains (LDDs) and in which doping is conducted at a concentration lower than the impurity concentration of impurity regions 906 forming source and drain regions in contact with wires 904. In a case of arranging the N-channel transistor 951, the impurity regions 906 and 907 are doped with phosphorus or the like as an impurity imparting N-type conductivity. The LDDs are formed as a means of suppressing hot electron degradation and short channel effect.

Figure 57A:
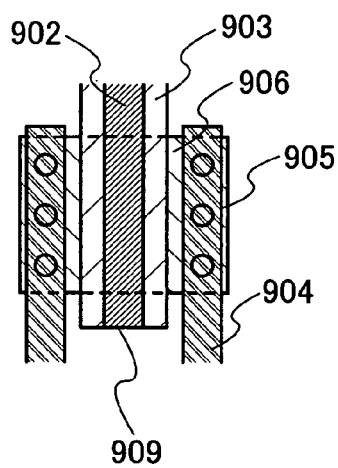
FIGS. 57A to 57E are top plan views of a transistor used for a display device of the present invention.

As shown in FIG. 57A, the gate electrode 909 of the N-channel transistor 951 has the first conductive layer 903 formed to extend on opposite sides of the second conductive layer 902. In this case, the first conductive layer 903 is formed to have such a thinner film thickness than the second conductive layer. The first conductive layer 903 is formed to have a thickness that allows ion species accelerated by an electric field of 10 to 100 kV to pass. The impurity regions 907 are formed to overlap with the first conductive layer 903 of the gate electrode 909, that is, form LDD regions overlapping with the gate electrode 909. In this structure, the impurity regions 907 are formed in a self-aligned manner by adding one conductivity-type impurity through the first conductive layer 903 using the second conductive layer 902 as a mask, in the gate electrode 909. In other words, the LDD overlapping with the gate electrode is formed in a self-aligned manner.

Figure 57B:
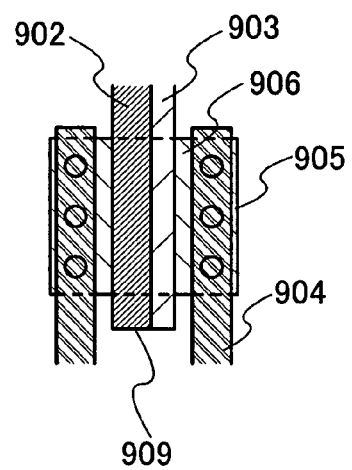

In FIG. 56, the N-channel transistor 952 has the impurity region 907 formed in the semiconductor layer 905 on one side of the gate electrode, in which doping is conducted to have a concentration lower than the impurity concentration of the impurity regions 906. As shown in FIG. 57B, the gate electrode 909 of the N-channel transistor 952 has the first conductive layer 903 formed to extend on one side of the second conductive layer 902. Also in this case, the LDD can be formed in a self-aligned manner by adding one conductivity-type impurity through the first conductive layer 903 using the second conductive layer 902 as a mask.

The transistor with the LDD on one side may be applied to a transistor where only positive voltage or negative voltage is applied between source and drain electrodes, and specifically may be applied to a transistor constituting a logic gate such as an inverter circuit, a NAND circuit, a NOR circuit, or a latch circuit, or to a transistor constituting an analog circuit such as a sense amplifier, a constant voltage generation circuit, or a VCO.

Figure 57C:
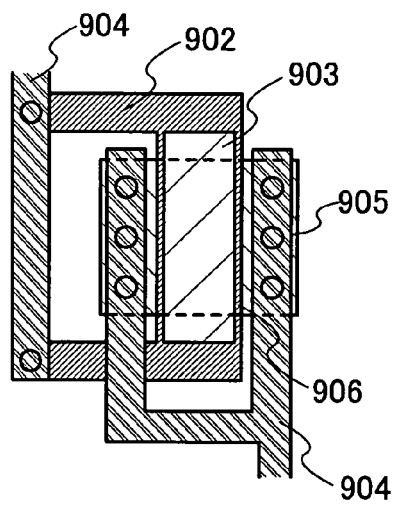

In FIG. 56, the capacitor 954 is formed to have the insulating layer 908 sandwiched between the first conductive layer 903 and the semiconductor layer 905. The semiconductor layer 905 forming the capacitor 954 includes impurity regions 910 and an impurity region 911. The impurity region 911 is formed in a position overlapping with the first conductive layer 903 in the semiconductor layer 905. In addition, the impurity regions 910 are in contact with the wires 904. Since the impurity region 911 can be doped with one conductivity-type impurity through the first conductive layer 903, the concentration of the impurity included in the impurity regions 910 can be the same as or different from the concentration of the impurity included in the impurity region 911. In any case, since the semiconductor layer 905 is made to function as an electrode in the capacitor 954, it is preferable that the semiconductor layer 905 be doped with one conductivity-type impurity to lower the resistance. In addition, the first conductive layer 903 can be made to function sufficiently as an electrode by using the second conductive layer 902 as an auxiliary electrode as shown in FIG. 57C. In this manner, the capacitor 954 can be formed in a self-aligned manner by using a composite electrode structure in which the first and second conductive layers 903 and 902 are combined.

In FIG. 56, the resistor element 955 is formed with the first conductive layer 903. Since the first conductive layer 903 is formed to have a thickness of approximately 30 to 150 nm, the width and length thereof can be appropriately set to arrange the resistor element.

Figure 57D:
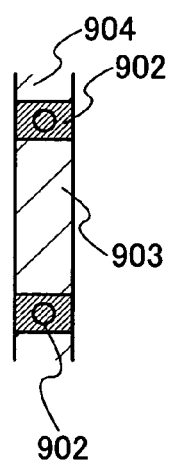

The resistor element may be made using a semiconductor layer including an impurity element at a high concentration or a metal layer that has a thin film thickness. The resistance of the semiconductor layer depends on the film thickness, the film quality, the impurity concentration, the activation rate, or the like. On the contrary, the metal layer is preferable, because the resistance of the metal layer is determined by the film thickness and the film quality, and thus it is less variable. FIG. 57D is a top view of the resistor element 955.

Figure 57E:
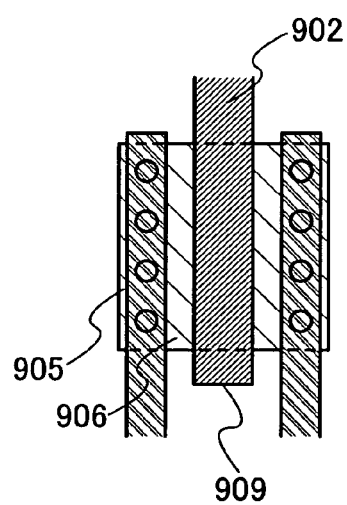

In FIG. 56, the P-channel transistor 953 has the semiconductor layer 905 including impurity regions 912. The impurity regions 912 form source and drain regions in contact with the wires 904. The gate electrode 909 has a structure in which the first and second conductive layers 903 and 902 are overlapped with each other. The P-channel transistor 953 is a transistor that has a single drain structure without an LDD. In the case of forming the P-channel transistor 953, the impurity regions 912 are doped with boron or the like as an impurity imparting P-type conductivity. On the other hand, when the impurity regions 912 are doped with phosphorus, an N-channel transistor having a single drain structure can be formed. FIG. 57E is a top view of the P-channel transistor 953.

One or both of the semiconductor layer 905 and the gate insulating layer 908 may be subjected to an oxidation or nitriding treatment by a microwave-excited high-density plasma treatment that has an electron temperature of 2 eV or less, an ion energy of 5 eV or less, and an electron density on the order of $10^{11}$ to $10^{13}/cm^3$. In this case, the defect level at the interface between the semiconductor layer 905 and the gate insulating layer 908 can be reduced by performing the treatment at a substrate temperature of 300 to 450° C. in an oxidizing atmosphere ($O_2$, $N_2O$, or the like) or a nitriding atmosphere ($N_2$, $NH_3$, or the like). By performing this treatment for the gate insulating layer 908, this insulating layer can be made dense. In other words, generation of a charged defect can be suppressed to prevent variation in the threshold voltage of the transistor. In addition, in a case of driving the transistor at a voltage of 3 V or lower, an insulating layer oxidized or nitrided by this plasma treatment can be applied as the gate insulating layer 908. Alternatively, in a case where the driving voltage of the transistor is 3 V or higher, an insulating layer formed by this plasma treatment on the surface of the semiconductor layer 905 and an insulating layer deposited by a CVD method (a plasma CVD method or a thermal CVD method) can be combined to form the gate insulating layer 908. Also, this insulating layer can be used as the dielectric layer of the capacitor 954. In this case, a capacitor with a large charge capacity can be formed because this insulating layer formed by the plasma treatment has a thickness of 1 to 10 nm and is a dense film.

As explained with reference to FIG. 56 and FIGS. 57A to 57E, elements that have various structures can be formed by combining conductive layers that are different in film thickness. A region where only the first conductive layer is formed and a region where the first conductive layer and the second conductive layer are stacked can be formed by using a photomask or a reticle provided with a diffraction grating pattern or an assist pattern that is composed of a semi-transparent film and has a function of reducing a light intensity. In other words, when a photoresist is exposed to light in a photolithography process, the amount of light passing through the photomask is controlled to make a thickness for a resist mask to be developed different. In this case, the photomask or reticle provided with slits of the resolution limit or less may be used to form a resist that has the complicated shape described above. In addition, baking at about 200° C. may be performed after the development, to change the shape of the mask pattern formed from a photoresist material.

In addition, a region where only the first conductive layer is formed and a region where the first conductive layer and the second conductive layer are stacked can be formed continuously by using a photomask or a reticle provided with a diffraction grating pattern or an assist pattern that is composed of a semi-transparent film and has a function of reducing a light intensity. As shown in FIG. 57A, the region where only the first conductive layer is formed can be formed selectively over the semiconductor layer. This region is effective over the semiconductor layer but not necessary in a region (a wire region continued from the gate electrode) other than that. Since the region where only the first conductive layer is formed is not required to be formed in the wire portion as a result of the use of this photomask or reticle, the wire density can be substantially increased.

In the case of FIG. 56 and FIGS. 57A to 57E, the first conductive layer is formed to have a thickness of 30 to 50 nm by using a high melting point metal such as tungsten (W), chromium (Cr), tantalum (Ta), tantalum nitride (TaN), or molybdenum (Mo), or an alloy or compound including the high melting point metal as its main component. In addition, the second conductive layer is formed to have a thickness of 300 to 600 nm by using a high melting point metal such as tungsten (W), chromium (Cr), tantalum (Ta), tantalum nitride (TaN), or molybdenum (Mo), or an alloy or compound including a high melting point metal describe above as its main component. For example, different conductive materials are used for the first conductive layer and the second conductive layer to result in a difference in etching rate in an etching process to be performed later. As an example, TaN can be used for the first conductive layer, and a tungsten film can be used as the second conductive layer.

This embodiment mode shows that transistors that have different electrode structures, a capacitor, and a resistor element can be formed to be separated in the same patterning process by using a photomask or a reticle provided with a diffraction grating pattern or an assist pattern that is composed of a semi-transparent film and has a function of reducing a light intensity. This allows elements having different modes to be integrated based on circuit characteristics without increasing the number of steps.

This embodiment mode has described a manufacturing method for forming a transistor over a substrate. By using the transistor, a display device shown in Embodiment Modes 1 to 10 can be manufactured. In other words, this embodiment mode can be freely combined with Embodiment Modes 1 to 10.

Embodiment Mode 15

This embodiment mode describes an example of a mask pattern in manufacturing a transistor with reference to FIGS. 58A and 58B, FIGS. 59A and 59B, and FIGS. 60A and 60B.

Figure 58A:
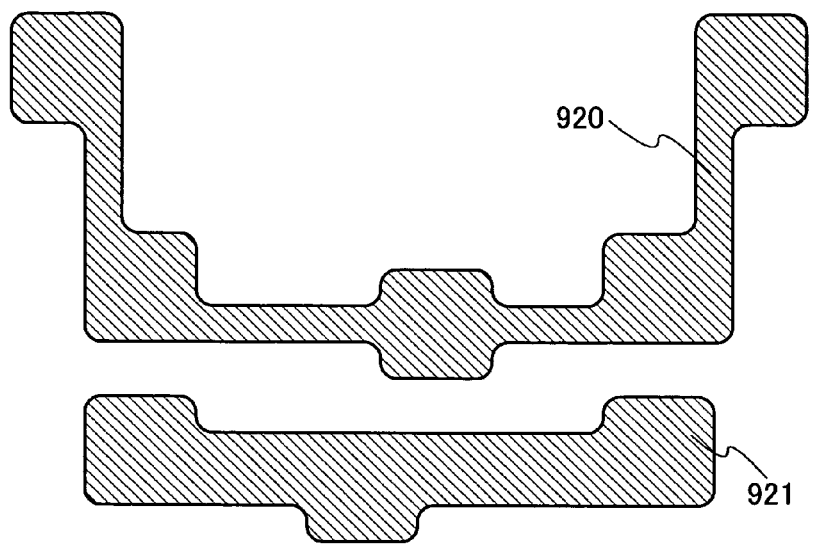
FIGS. 58A and 58B are diagrams showing an example of a mask pattern of a transistor used for a display device of the present invention.

It is preferable to form semiconductor layers 920 and 921 shown in FIG. 58A with silicon or a semiconductor containing silicon as its component. For example, polycrystalline silicon, single crystal silicon, or the like that is a silicon film crystallized by laser annealing or the like is used. Besides, it is also possible to use a metal-oxide semiconductor, amorphous silicon, or an organic semiconductor that shows semiconductor characteristics.

The semiconductor layers 920 and 921 are formed by subjecting the semiconductor layer formed over the substrate to a photolithography process and an etching process. By the photolithography process, a mask pattern can be formed over the semiconductor layer. By the etching process, the semiconductor layer which has been formed over the substrate is selectively removed using the mask pattern. The shapes of the semiconductor layers 920 and 921 are determined in consideration of characteristics of transistors to be fabricated or a layout of a circuit.

Figure 58B:
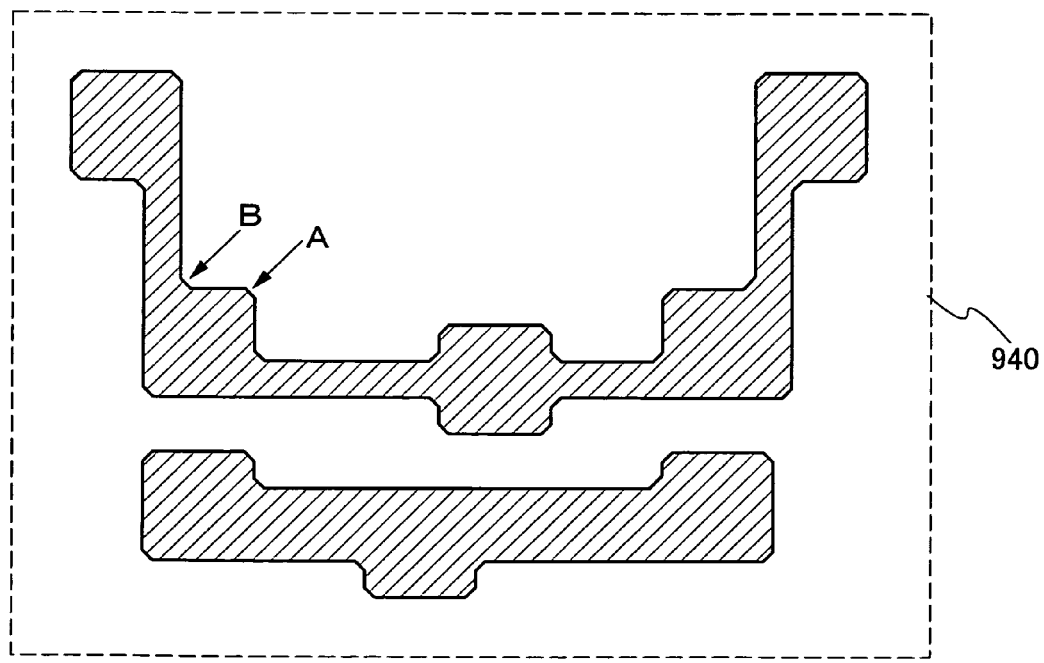

A photomask for forming the semiconductor layers 920 and 921 shown in FIG. 58A is provided with a mask pattern 940 shown in FIG. 58B. The mask pattern 940 differs depending on the type of a resist used for a photolithography process, i.e., a positive type or a negative type. In a case where the positive resist is used, the mask pattern 940 shown in FIG. 58B is manufactured as a light shielding portion. The mask pattern 940 has a polygon shape in which a top portion A is removed. In addition, a bent portion B has a shape that the corner portion is bended over plural levels so as not to be perpendicular.

The shape of the mask pattern 940 shown in FIG. 58B is reflected in the semiconductor layers 920 and 921 shown in FIG. 58A. In this case, a shape similar to the mask pattern 940 may be transferred or may be transferred so that the corner portion of the mask pattern 940 is more rounded. In other words, a pattern shape may be made smoother than the mask pattern 940 to have roundness.

Figure 59A:
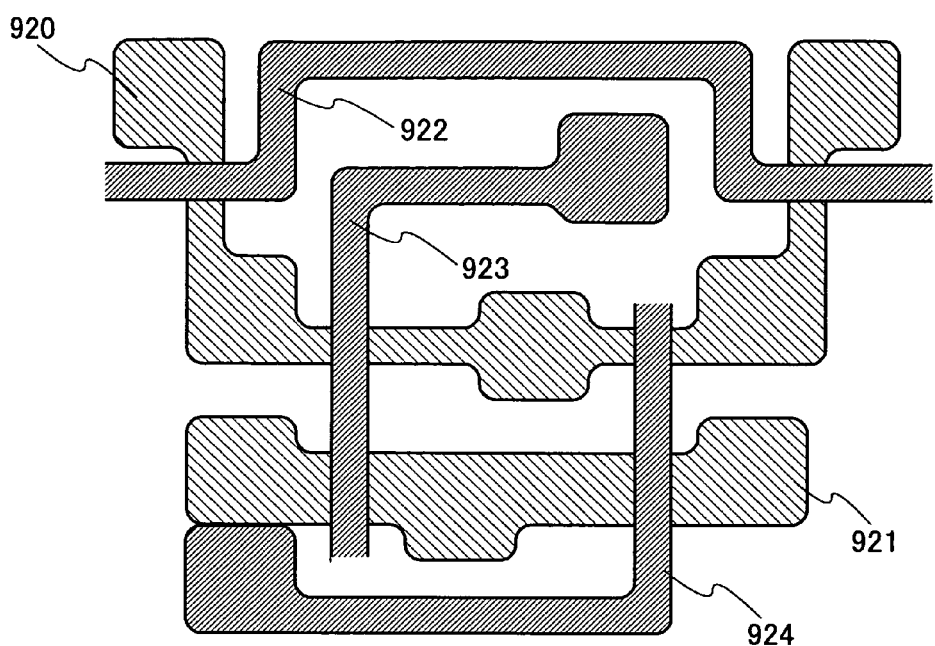
FIGS. 59A and 59B are diagrams showing an example of a mask pattern of a transistor used for a display device of the present invention.

An insulating layer partially containing at least silicon oxide or silicon nitride is formed over the semiconductor layers 920 and 921. One of purposes of forming the insulating layer is that it is used as a gate insulating layer. Then, as shown in FIG. 59A, gate wires 922, 923, and 924 are formed so as to partially overlap with the semiconductor layers. The gate wire 922 is formed to correspond to the semiconductor layer 920. The gate wire 923 is formed to correspond to the semiconductor layers 920 and 921. In addition, the gate wire 924 is formed to correspond to the semiconductor layers 920 and 921. By forming a metal layer or a semiconductor layer having high conductivity, the shapes of the gate wires are formed over the insulating layer by a photolithography technique.

Figure 59B:
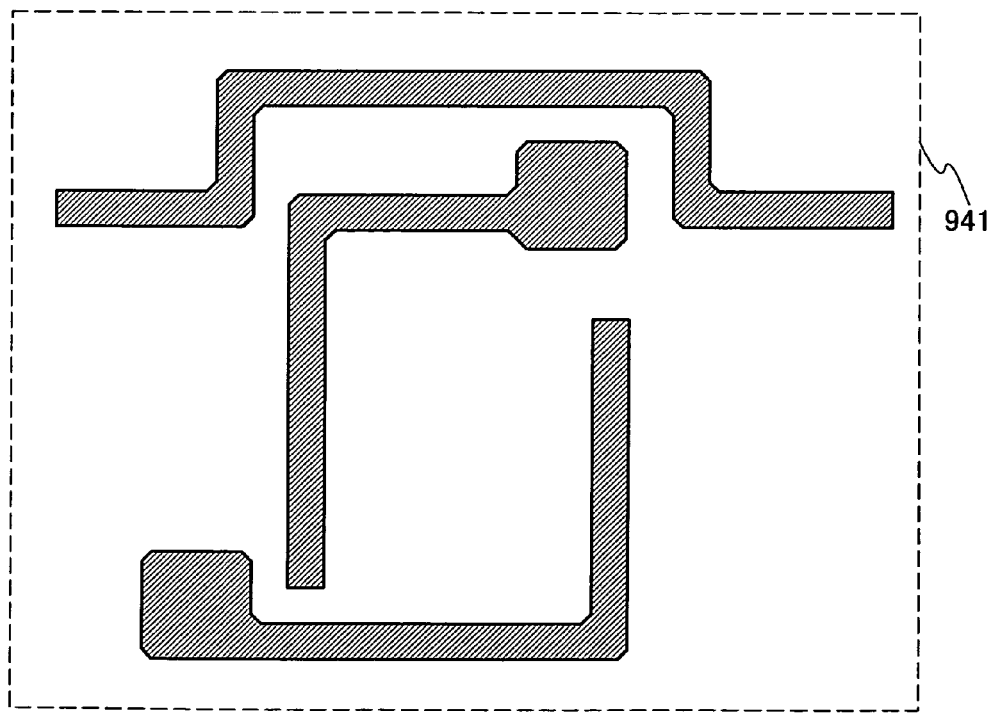

A photomask pattern for forming these gate wires 922, 923 and 924 is shown in FIG. 59B. In the shape of a mask pattern 941, external sides of corner portions are cut so as not to bend at a right angle. In addition, internal sides of the corner portions are bent at plural levels so as not to bend at a right angle. The size of the cut portion may be determined based on the wire width. For example, the cut portion may be formed at the external top portion of the corner portion so as to have a length which is from ⅕ to ½ of the line width. The shape of the mask pattern 941 shown in FIG. 59B is reflected in the gate wires 922, 923, and 924 shown in FIG. 59A. In this case, a shape similar to the mask pattern 941 may be transferred or may be transferred so that the corner of the mask pattern 941 is further rounded. In other words, the pattern shape may be made smoother than the mask pattern 941 so as to have roundness. By forming roundness at corner portions, generation of fine particles due to overdischarge can be suppressed when dry etching is performed by plasma. By forming roundness at corner portions in concave portions, even fine particles which are generated at the time of washing and are easily left in corners can be washed away. Consequently, there is an effect that improvement of yield can be fully expected.

An interlayer insulating layer is a layer that is formed after the gate wires 922, 923, and 924. The interlayer insulating layer is formed using an inorganic insulating material such as silicon oxide or an organic insulating material such as polyimide or acrylic resin. An insulating layer such as silicon nitride or silicon nitride oxide may be interposed between the interlayer insulating layer and the gate wires 922, 923, and 924. In addition, an insulating layer such as silicon nitride or silicon nitride oxide may be provided over the interlayer insulating layer. The insulating layer can prevent the semiconductor layer and the gate insulating layer from being contaminated with impurities such as exogenous metal ions or moisture that are not preferable for a transistor.

Figure 60A:
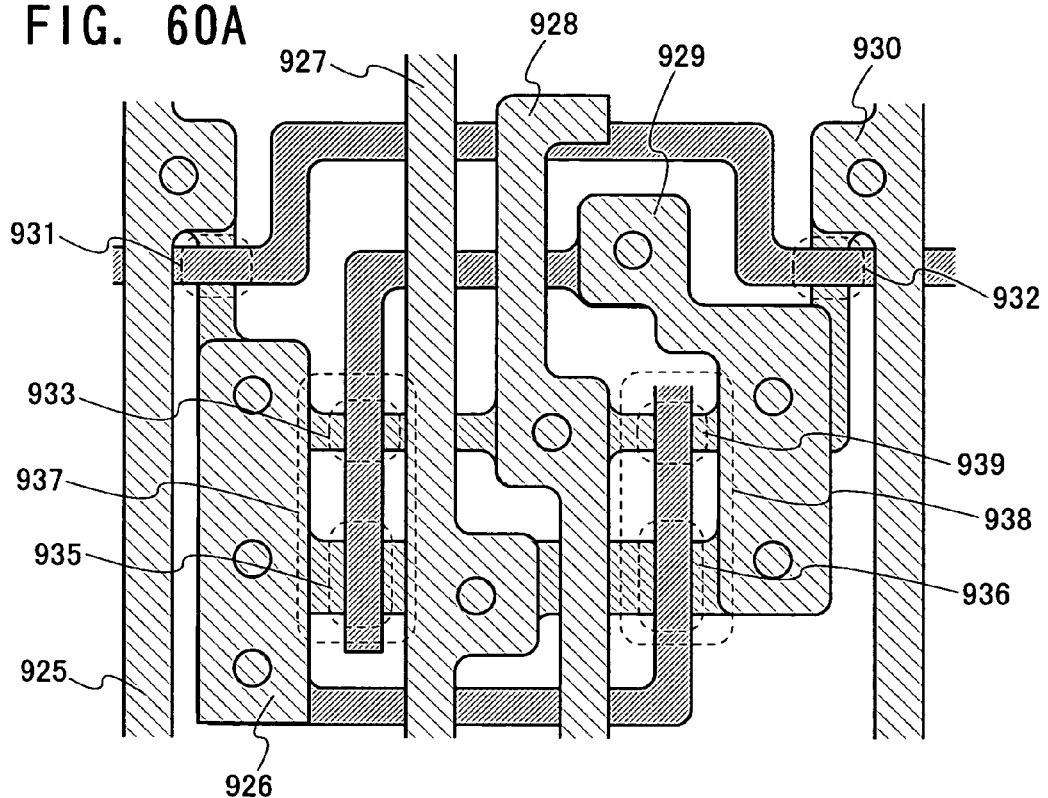
FIGS. 60A and 60B are diagrams showing an example of a mask pattern of a transistor used for a display device of the present invention.

An opening is formed in a predetermined position of the interlayer insulating layer. For example, the opening is provided corresponding to the gate wire or the semiconductor layer in a lower layer. In a wire layer formed from a layer or a plurality of layers of a metal or a metal compound, a mask pattern thereof is formed by a photolithography technique and a predetermined pattern is formed by an etching process. Then, as shown in FIG. 60A, wires 925 to 930 are formed so as to partially overlap with semiconductor layers. Specific elements are connected by the wires. The wires do not connect the specific elements in a straight line, but connect them to have a bent portion as a result of limitation of the layout. In addition, widths of the wires are each changed in a contact portion or in other regions. When the size of a contact hole is equal to or larger than a width of a wire, the width of the wire becomes larger in the contact portion.

Figure 60B:
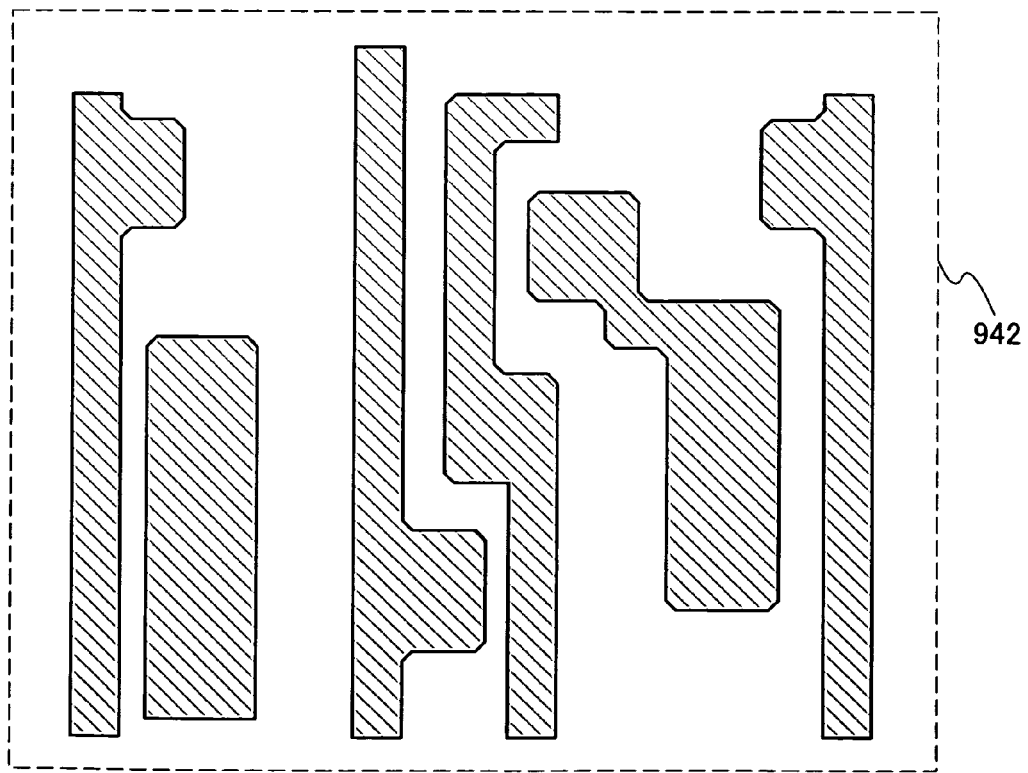

A photomask pattern for forming these wires 925 to 930 is shown in FIG. 60B. In the shape of a mask pattern 939, external sides of corner portions are cut so as not to bend at a right angle. In addition, internal sides of the corner portions are bent at plural levels so as not to bend at a right angle. The size of the cut portion may be determined based on the wire width. For example, the cut portion may be formed at the external top portion of the corner portion so as to have a length which is from ⅕ to ½ of the line width. The shape of the mask pattern 939 shown in FIG. 60B is reflected in the wires 925 to 930 shown in FIG. 60A. In this case, a shape similar to the mask pattern 939 may be transferred or may be transferred so that the corner of the mask pattern 939 is further rounded. In other words, the pattern shape may be made smoother than the mask pattern 939 so as to have roundness. By forming roundness at corner portions, generation of fine particles due to overdischarge can be suppressed when dry etching is performed by plasma. By forming roundness at corner portions in concave portions, even fine particles which are generated at the time of washing and are easily left in corners can be washed away. Consequently, there is an effect that improvement of yield can be fully expected.

In FIG. 60A, N-channel transistors 931, 932, 933 and 939, and P-channel transistors 935 and 936 are formed. The N-channel transistor 933 and the P-channel transistor 935 constitute an inverter 937, and the N-channel transistor 939 and the P-channel transistor 936 constitute an inverter 938. A circuit including these six transistors forms an SRAM. An insulating layer such as silicon nitride or silicon oxide may be formed in the upper layer of these transistors.

Note that this embodiment mode can be freely combined with Embodiment Modes 1 to 14.

Embodiment Mode 16

This embodiment mode describes electronic devices which use the display device of the present invention, with reference to FIGS. 61A to 61G.

Figure 61A:
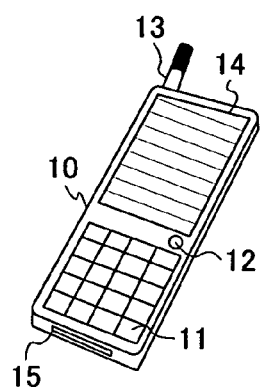
FIGS. 61A to 61G are views each showing an electronic apparatus of the present invention.

FIG. 61A is a schematic view of a portable information terminal using a display device of the present invention. The portable information terminal is constituted by a main body 10, operating switches 11, a power switch 12, an antenna 13, a display portion 14, and an external input port 15. The display device of the present invention can be used in the display portion 14.

Figure 61B:
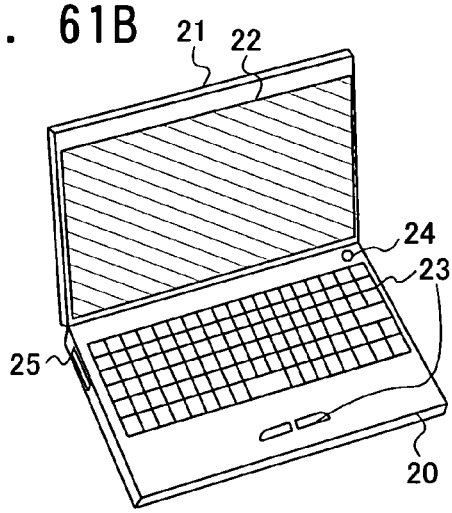

FIG. 61B is a schematic view of a personal computer using a display device of the present invention. The personal computer is constituted by a main body 20, a housing 21, a display portion 22, operating switches 23, a power switch 24, and an external input port 25. The display device of the present invention can be used in the display portion 22.

Figure 61C:
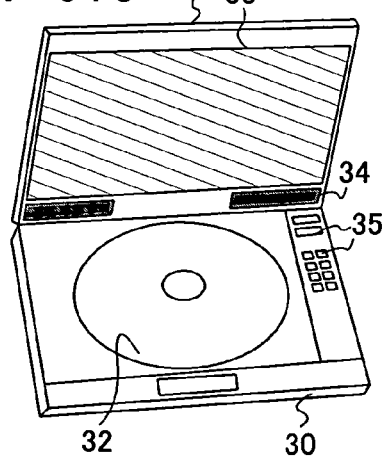

FIG. 61C is a schematic view of an image reproducing device using a display device of the present invention. The image reproducing device is constituted by a main body 30, a housing 31, a recording medium 32, a display portion 33, an audio output portion 34, and operating switches 35. The display device of the present invention can be used in the display portion 33.

Figure 61D:
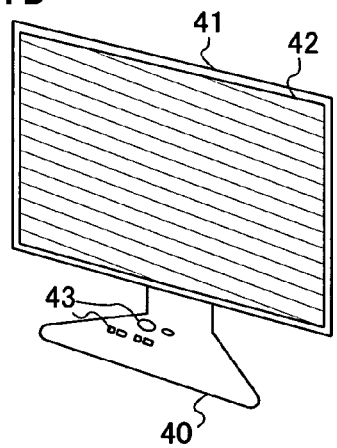

FIG. 61D is a schematic view of a television using a display device of the present invention. The television is constituted by a main body 40, a housing 41, a display portion 42, and operating switches 43. The display device of the present invention can be used in the display portion 42.

Figure 61E:
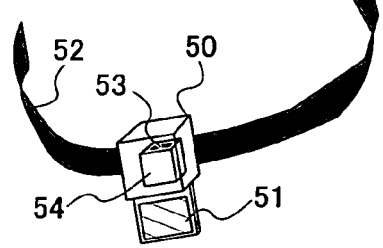

FIG. 61E is a schematic view of a head mounted display using a display device of the present invention. The head mounted display is constituted by a main body 50, a monitor portion 51, a band 52 for fixing it on a head, a display portion 53, and an optical system 54. The display device of the present invention can be used in the display portion 53.

Figure 61F:
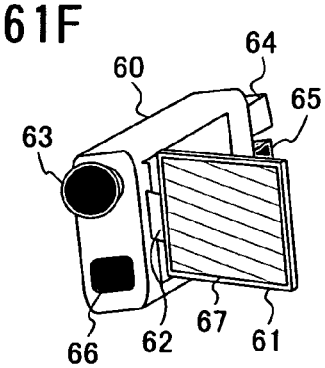

FIG. 61F is a schematic view of a video camera using a display device of the present invention. The video camera is constituted by a main body 60, a housing 61, a connecting portion 62, an image receiving portion 63, an eye piece portion 64, a battery 65, an audio input portion 66, and a display portion 67. The display device of the present invention can be used in the display portion 67.

Figure 61G:
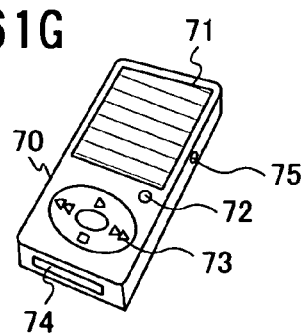

FIG. 61G is a schematic view of a portable image reproducing device using a display device of the present invention. The portable image reproducing device is constituted by a main body 70, a display portion 71, a power switch 72, operation buttons 73, an external input port 74, an external output port 75, and the like. In addition, a hard disc drive is installed inside. The display device of the present invention can be used in the display portion 71.

The present invention can be applied to various electronic devices in addition to the above-described applied electronic devices.

Note that this embodiment mode can be implemented freely combined with Embodiment Modes 1 to 16.

Additional Note

As set forth above, the present invention includes the following structure:

A display device including a display panel including a pixel with a plurality of sub-pixels, each of sub-pixels emits a different emission color, a video format conversion circuit into which a luminance color-difference signal including luminance information and color-difference information is inputted and in which the luminance color-difference signal is converted into an RGB signal in response to the emission color of the sub-pixel, and a controller into which the RGB signal is inputted and which outputs the RGB signal to the display panel in accordance with drive timing;

A display device including a display panel including a pixel with a plurality of sub-pixels, each of sub-pixels emits a different emission color, a video format conversion circuit into which a luminance color-difference signal including luminance information and color-difference information is inputted and in which the luminance color-difference signal is converted into a digital RGB signal in response to the emission color of the sub-pixel, a D/A conversion circuit for converting the digital RGB signal into an analog RGB signal, and a controller into which the analog RGB signal is inputted and which outputs the analog RGB signal in accordance with drive timing;

A display device including a display panel including a pixel with a plurality of sub-pixels, each of sub-pixels emits a different emission color, a video format conversion circuit which, at the time of inputting a luminance color-difference signal including luminance information and color-difference information, converts the luminance color-difference signal into an RGB signal in response to an emission color of the sub-pixel in response to a mode signal which shows whether an image signal is an RGB signal or a luminance color-difference signal, an input switching circuit into which the mode signal, and the RGB signal or the RGB signal outputted from the video format conversion circuit are inputted, and the input switching circuit outputs one of the RGB signal or the RGB signal converted from the luminance color-difference signal to a controller in response to the mode signal, and the controller into which the RGB signal or the RGB signal converted from the luminance color-difference signal is inputted and which outputs the RGB signal to the display panel in accordance with drive timing;

A display device including a display panel including a pixel with a plurality of sub-pixels having different emission colors, a signal determination circuit which determines whether an input signal is an RGB signal or a luminance color-difference signal including luminance information and color-difference information by the number of bus lines of carrying the input signal and generates a mode signal, a video format conversion circuit which converts the luminance color-difference signal into an RGB signal in response to the mode signal, an input switching circuit into which the mode signal, and the RGB signal or the RGB signal outputted from the video format conversion circuit are inputted, and the input switching circuit outputs one of the RGB signal or the RGB signal converted from the luminance color-difference signal to a controller in response to the mode signal, and the controller into which the RGB signal or the RGB signal converted from the luminance color-difference signal is inputted and which outputs the RGB signal to the display panel in accordance with drive timing; and A display device includes the video format conversion circuit, the input switching circuit, and the controller which are arranged on one IC chip.

This application is based on Japanese Patent Application serial No. 2005-240506 field in Japan Patent Office on Aug. 22, 2005, the entire contents of which are hereby incorporated by reference.

What is claimed is:

1. A display device comprising:
   a display panel including a pixel with a plurality of sub-pixels, each of the sub-pixels emitting a different emission color;
   a video format conversion circuit; and
   an input switching circuit,
   wherein at time of inputting a luminance color-difference signal including luminance information and color-difference information, the video format conversion circuit converts the luminance color-difference signal into an RGB signal in response to an emission color of the sub-pixel in response to a mode signal which shows whether an image signal is an RGB signal or a luminance color-difference signal,
   wherein the mode signal, and the RGB signal or the RGB signal outputted from the video format circuit are inputted into the input switching circuit, and the input switching circuit outputs one of the RGB signal and the RGB signal converted from the luminance color-difference signal for the display panel in response to the mode signal.

2. The display device according to claim 1, further comprising a controller,
   wherein one of the ROB signal or the ROB signal converted from the luminance color-difference signal is inputted into the controller from the input switching circuit, and the controller outputs the ROB signal to the display panel.

3. The display device according to claim 1,
   wherein the video format conversion circuit and the input switching circuit are arranged on one IC chip.

4. The display device according to claim 1, wherein the display panel performs display in a digital gray scale method.

5. The display device according to claim 1, wherein the luminance color-difference signal and the ROB signal are digital signals.

6. A display device comprising:
   a display panel including a pixel with a plurality of sub-pixels, each of the sub-pixels emitting a different emission color;
   a signal determination circuit;
   a video format conversion circuit; and
   an input switching circuit,
   wherein the signal determination circuit determines whether an input signal is an RGB signal or a luminance color-difference signal including luminance information and color-difference information by the number of bus lines of carrying the input signal, and the signal determination circuit generates a mode signal, wherein the video format conversion circuit converts the luminance color-difference signal into an ROB signal in response to the mode signal, wherein the mode signal, and the ROB signal or the RGB signal outputted from the video format conversion circuit are inputted into the input switching circuit, and the input switching circuit outputs one of the ROB signal and the ROB signal converted from the luminance color-difference signal for the display panel in response to the mode signal.

7. The display device according to claim 6, further comprising a controller, wherein one of the RGB signal or the ROB signal converted from the luminance color-difference signal is inputted into the controller from the input switching circuit, and the controller outputs the ROB signal to the display panel.

8. The display device according to claim 6,
   wherein the video format conversion circuit and the input switching circuit are arranged on one IC chip.

9. The display device according to claim 6,
   wherein the display panel performs display in a digital gray scale method.

10. The display device according to claim 6,
    wherein the luminance color-difference signal and the ROB signal are digital signals.

11. A driving method of a display device having a display panel including a pixel with a plurality of sub-pixels, each of the sub-pixels emitting a different emission color, the method comprising the steps of:

at a time inputting a luminance color-difference signal including luminance information and color-difference information into a video format conversion circuit, converting the luminance color-difference signal into an RGB signal in response to an emission color of the sub-pixel in response to a mode signal which shows whether an image signal is an ROB signal or a luminance color-difference signal in the video format conversion circuit;

inputting the mode signal, and the ROB signal or the ROB signal outputted from the video format conversion circuit into an input switching circuit;

outputting one of the ROB signal or the ROB signal converted from the luminance color-difference signal for the display panel from the input switching circuit in response to the mode signal.

12. A driving method of a display device having a display panel including a pixel with a plurality of sub-pixels, each of the sub-pixels emitting a different emission color, the method comprising the steps of:

inputting an signal into a signal determination circuit;

determining whether an input signal is an ROB signal or a luminance color-difference signal including luminance information and color-difference information by the number of bus lines of carrying the input signal in the signal determination circuit;

generating a mode signal in the signal determination circuit;

converting the luminance color-difference signal into an ROB signal in response to the mode signal in a video format conversion circuit; inputting the mode signal, and the ROB signal or the ROB signal outputted from the video format conversion circuit into an input switching circuit;

outputting one of the ROB signal or the ROB signal converted from the luminance color-difference signal for the display panel from the input switching circuit in response to the mode signal.

* * * * *